(12) United States Patent
Swillam et al.

(10) Patent No.: US 12,216,414 B2
(45) Date of Patent: Feb. 4, 2025

(54) SELF-REFERENCING INTEGRATED ALIGNMENT SENSOR

(71) Applicant: ASML Holding N.V., Veldhoven (NL)

(72) Inventors: Mohamed Swillam, Wilton, CT (US); Justin Lloyd Kreuzer, Trumbull, CT (US); Stephen Roux, New Fairfield, CT (US)

(73) Assignee: ASML Holding N.V., Veldhoven (NL)

( * ) Notice: Subject to any disclaimer, the term of this patent is extended or adjusted under 35 U.S.C. 154(b) by 182 days.

(21) Appl. No.: 18/012,799

(22) PCT Filed: Jun. 9, 2021

(86) PCT No.: PCT/EP2021/065537
§ 371 (c)(1),
(2) Date: Dec. 23, 2022

(87) PCT Pub. No.: WO2021/259645
PCT Pub. Date: Dec. 30, 2021

(65) Prior Publication Data
US 2023/0266681 A1     Aug. 24, 2023

Related U.S. Application Data

(60) Provisional application No. 63/043,543, filed on Jun. 24, 2020.

(51) Int. Cl.
*G01B 11/00* (2006.01)
*G03F 9/00* (2006.01)

(52) U.S. Cl.
CPC .......... *G03F 9/7019* (2013.01); *G03F 9/7065* (2013.01)

(58) Field of Classification Search
CPC .... G03F 9/7019; G03F 9/7065; G03F 9/7049; G03F 9/7088; G03F 9/00; G01B 11/00
See application file for complete search history.

(56) References Cited

U.S. PATENT DOCUMENTS

| 5,495,336 A | 2/1996 | Nose et al. |
| 6,297,876 B1 | 10/2001 | Bornebroek |

(Continued)

FOREIGN PATENT DOCUMENTS

| CN | 103293884 A | 9/2013 |
| EP | 1 372 040 B1 | 12/2003 |

(Continued)

OTHER PUBLICATIONS

International Search Report and Written Opinion of the International Searching Authority directed to International Patent Application No. PCT/EP2021/065537, mailed Nov. 5, 2021; 11 pages.

(Continued)

*Primary Examiner* — Abdullahi Nur
(74) *Attorney, Agent, or Firm* — Sterne, Kessler, Goldstein & Fox P.L.L.C.

(57) ABSTRACT

Systems, apparatuses, and methods are provided for determining the alignment of a substrate. An example method can include emitting a multi-wavelength radiation beam including a first wavelength and a second wavelength toward a region of a surface of a substrate. The example method can further include measuring a first diffracted radiation beam indicative of first order diffraction at the first wavelength in response to an irradiation of the region by the multi-wavelength radiation beam. The example method can further include measuring a second diffracted radiation beam indicative of first order diffraction at the second wavelength in response to the irradiation of the region by the multi-wavelength radiation beam. Subsequently, the example method can include generating, based on the measured first set of photons and the measured second set of photons, an electronic signal for use in determining an alignment position of the substrate.

20 Claims, 22 Drawing Sheets

(56) References Cited

U.S. PATENT DOCUMENTS

| | | | |
|---|---|---|---|
| 6,952,253 | B2 | 10/2005 | Lof et al. |
| 6,961,116 | B2 | 11/2005 | Den Boef et al. |
| 7,260,289 | B1 | 8/2007 | Gunn, III et al. |
| 7,511,799 | B2 | 3/2009 | Tel et al. |
| 8,610,898 | B2 | 12/2013 | Guy |
| 9,547,241 | B2 | 1/2017 | Den Boef et al. |
| 9,588,421 | B2 | 3/2017 | Takehisa et al. |
| 10,338,013 | B1 | 7/2019 | Brodie et al. |
| 10,613,448 | B2 | 4/2020 | Van Der Post |
| 10,690,995 | B2 | 6/2020 | Kumar et al. |
| 10,845,720 | B2 * | 11/2020 | Egami ............ G03F 9/7049 |
| 11,125,806 | B2 | 9/2021 | Tinnemans et al. |
| 2001/0026357 | A1 * | 10/2001 | Ota ............ G03F 9/7049 355/53 |
| 2004/0130690 | A1 * | 7/2004 | Koren ............ G03F 9/7046 355/71 |
| 2007/0153265 | A1 | 7/2007 | Vaez-Iravani et al. |
| 2013/0050674 | A1 | 2/2013 | Prosyentsov et al. |
| 2019/0086824 | A1 | 3/2019 | Mathijssen et al. |
| 2019/0171121 | A1 * | 6/2019 | Egami ............ G03F 9/00 |
| 2020/0089135 | A1 | 3/2020 | Goorden et al. |

FOREIGN PATENT DOCUMENTS

| | | |
|---|---|---|
| JP | S64-089323 A | 4/1989 |
| JP | H01-089323 A | 6/1989 |
| JP | H021509 A | 1/1990 |
| JP | H04-186116 A | 7/1992 |
| JP | 2012-084594 A | 4/2012 |
| JP | 2019-525217 A | 9/2019 |
| TW | 201506551 A | 2/2015 |
| TW | 201925921 A | 7/2019 |
| TW | 201940871 A | 10/2019 |
| TW | 202020468 A | 6/2020 |
| WO | WO 00/26646 A1 | 5/2000 |
| WO | WO 2020/043582 A1 | 3/2020 |

OTHER PUBLICATIONS

International Preliminary Report on Patentability directed to International Patent Application No. PCT/EP2021/065537, issued Dec. 13, 2022; 8 pages.

International Search Report and Written Opinion of the International Searching Authority directed to International Patent Application No. PCT/EP2021/065540, mailed Oct. 18, 2021; 9 pages.

International Preliminary Report on Patentability directed to International Patent Application No. PCT/EP2021/065540, issued Dec. 13, 2022; 7 pages.

Gehring et al., "Low-loss fiber-to-chip couplers with ultrawide optical bandwidth," APL Photonics, vol. 4, Jan. 15, 2019; pp. 1-7.

Doylend et al., "Two-dimensional free-space beam steering with an optical phased array on silicon-on-insulator," Optics Express, vol. 19, No. 22, Oct. 24, 2011; pp. 21595-21604.

Yoshida et al., "Vertical silicon waveguide coupler bent by ion implantation," Optics Express, vol. 23, No. 23, Nov. 16, 2015; pp. 29449-29456.

Bucio et al., "N-rich silicon nitride angled MMI for coarse wavelength division (de)multiplexing in the O-band," Optics Letters, vol. 43, No. 6, Mar. 15, 2018; pp. 1251-1254.

Katzir et al., "Chirped Gratings in Integrated Optics," IEEE, Journal of Quantum Electronics, vol. 13, No. 4, Apr. 1977; pp. 296-304.

Sbouri et al., "Design Considerations of Silicon Nitride Optical Phased Array for Visible Light Communications," IEEE Journal of Selected Topics in Quantum Electronics, vol. 24, No. 6, May 18, 2018; 7 pages.

Atsumi et al., "Low-Loss and Broadband Optical Coupler Based on Lensed-Top Vertically Curved Silicon Waveguide," IEEE Photonics Technology Letters, vol. 31, No. 8, Apr. 15, 2019; pp. 603-606.

Gehring et al., "Broadband out-of-plane coupling at visible wavelengths," Optics Letters, vol. 44, No. 20, Oct. 15, 2019; pp. 5089-5092.

Soldano et al., "Optical Multi-Mode Interference Devices Based on Self-Imaging: Principles and Applications," Journal of Lightwave Technology, vol. 13, No. 4, Apr. 1995; pp. 615-627.

* cited by examiner

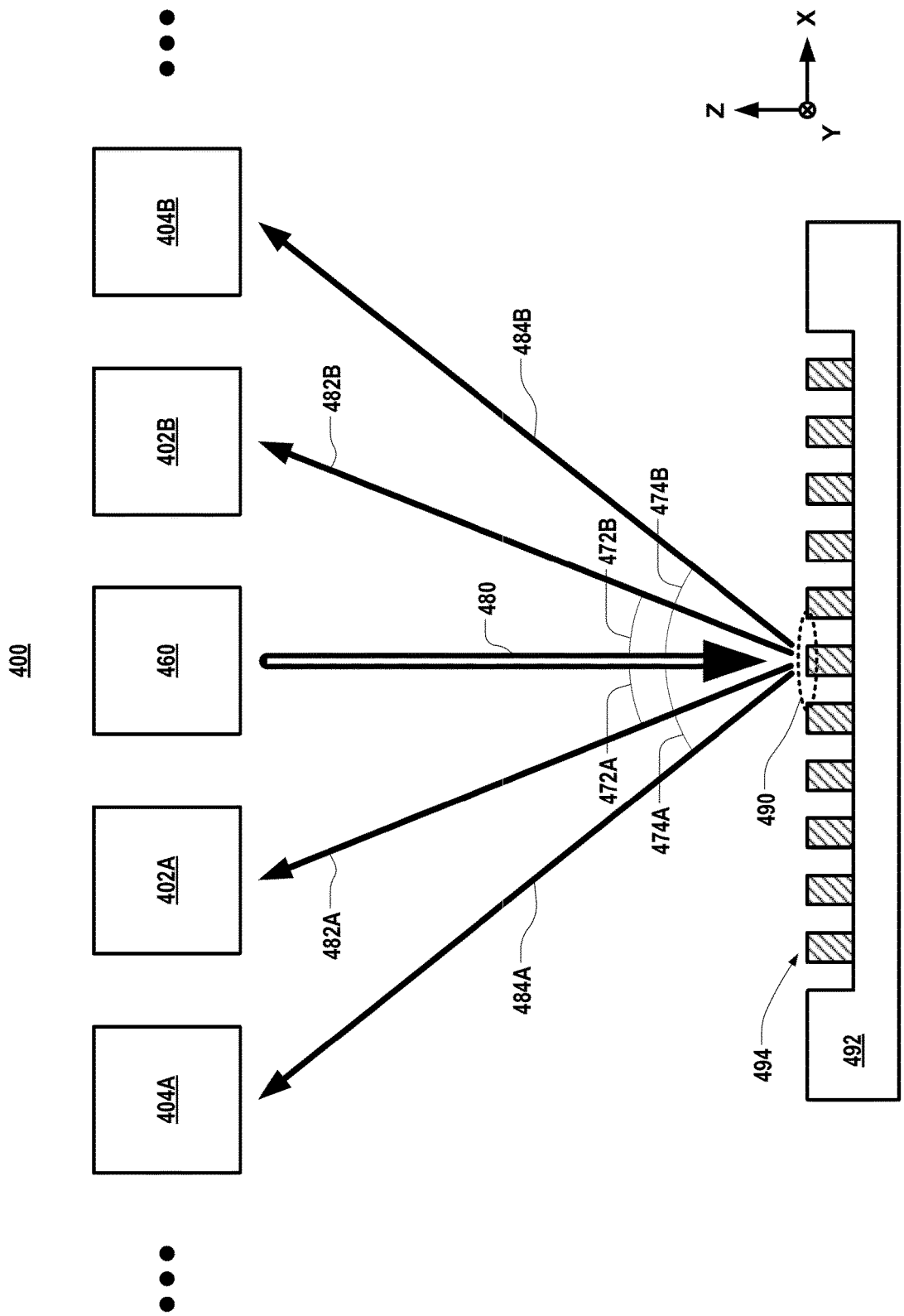

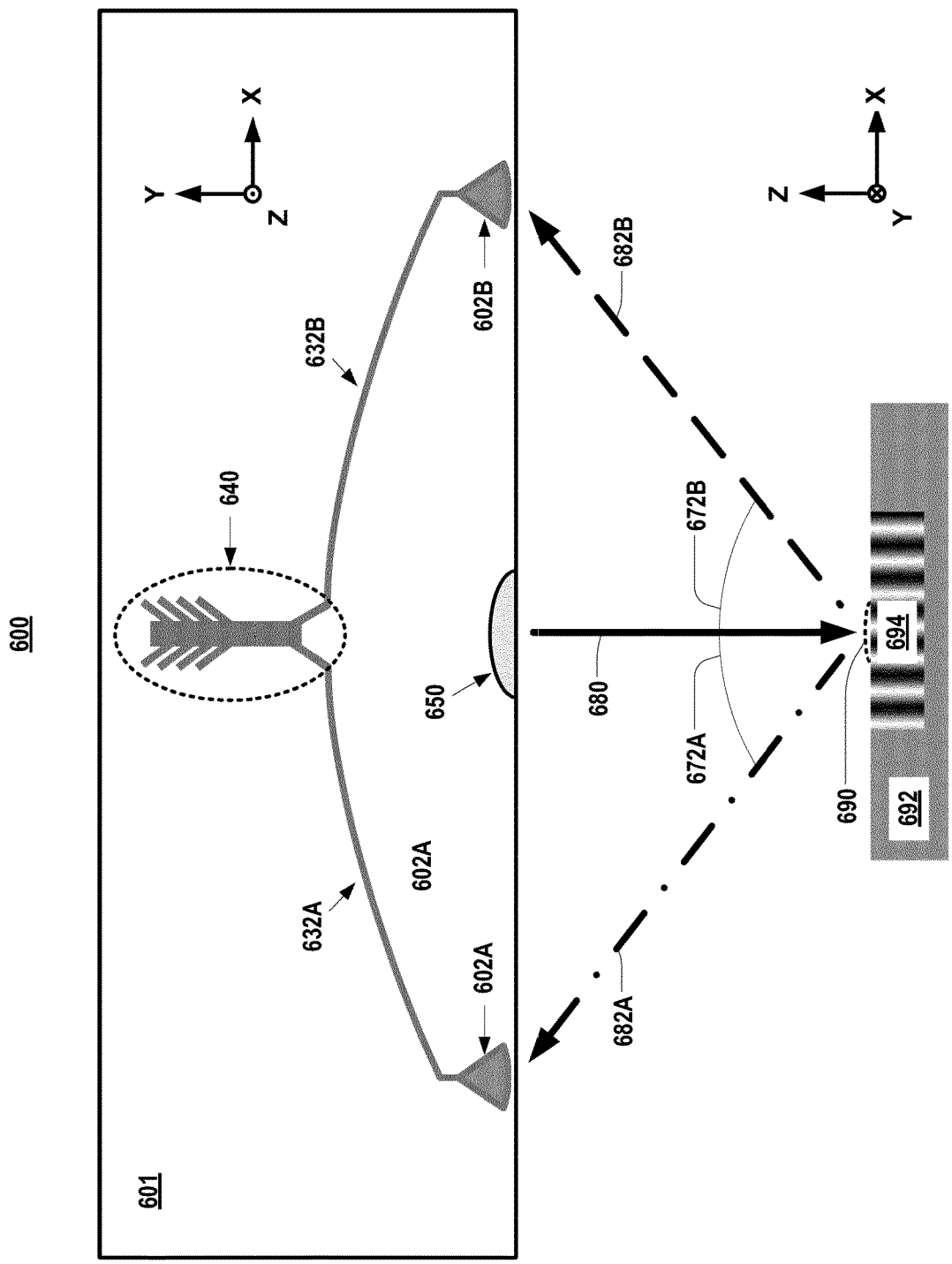

SELF-REFERENCING INTEGRATED ALIGNMENT SENSOR

CROSS-REFERENCE TO RELATED APPLICATIONS

This application claims priority of U.S. Provisional Patent Application No. 63/043,543, which was filed on Jun. 24, 2020, and which is incorporated herein in its entirety by reference.

TECHNICAL FIELD

The present disclosure relates to optical sensors and sensing systems for lithographic apparatuses.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is interchangeably referred to as a mask or a reticle, can be used to generate a circuit pattern to be formed on an individual layer of the IC being formed. This pattern can be transferred onto a target portion (e.g., including part of, one, or several dies) on a substrate (e.g., a silicon (Si) wafer). Transfer of the pattern is typically via imaging onto a layer of radiation-sensitive material (e.g., resist) provided on the substrate. In general, a single substrate will contain a network of adjacent target portions that are successively patterned. Traditional lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel (e.g., opposite) to this scanning direction. It is also possible to transfer the pattern from the patterning device to the substrate by imprinting the pattern onto the substrate.

As semiconductor manufacturing processes continue to advance, the dimensions of circuit elements have continually been reduced while the amount of functional elements, such as transistors, per device has been steadily increasing over decades, following a trend commonly referred to as Moore's law. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Extreme ultraviolet (EUV) radiation, for example, electromagnetic radiation having wavelengths of around 50 nanometers (nm) or less (also sometimes referred to as soft x-rays), and including light at a wavelength of about 13 nm, can be used in or with a lithographic apparatus to produce extremely small features in or on substrates, for example, silicon wafers. A lithographic apparatus which uses EUV radiation having a wavelength within a range of 4 nm to 20 nm, for example 6.7 nm or 13.5 nm, can be used to form smaller features on a substrate than a lithographic apparatus which uses, for example, radiation with a wavelength of 193 nm.

Methods to produce EUV light include, but are not necessarily limited to, converting a material that has an element, for example, xenon (Xe), lithium (Li), or tin (Sn), with an emission line in the EUV range to a plasma state. For example, in one such method called laser produced plasma (LPP), the plasma can be produced by irradiating a target material, which is interchangeably referred to as fuel in the context of LPP sources, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

SUMMARY

The present disclosure describes various aspects of systems, apparatuses, methods, and computer program products for determining an alignment of a substrate (e.g., a wafer) using a substrate alignment sensing system that includes a self-referencing integrated alignment sensor. In some aspects, the self-referencing integrated alignment sensor can be configured to utilize on-axis illumination and off-axis detection (e.g., as described with reference to FIGS. 4-9). In other aspects, the self-referencing integrated alignment sensor can be configured to utilize off-axis illumination and on-axis detection (e.g., as described with reference to FIGS. 10-12). The term "on-axis" refers to a direction that is substantially parallel to the surface normal of the surface of the substrate under measurement (e.g., a direction that is substantially perpendicular to the surface of the substrate under measurement), while the term "off-axis" refers to a direction that is substantially nonparallel (e.g., angled, oblique) to surface normal (e.g., a direction that is substantially non-perpendicular to the surface of the substrate under measurement).

In some aspects, the present disclosure describes a system that can include an illumination system (e.g., a radiation source, a source illumination subsystem) and a detection system (e.g., a metrology system). In some aspects, the illumination system and the detection system can be included in an integrated optical device.

The illumination system can be configured to generate a multi-wavelength radiation beam that includes a first wavelength and a second wavelength. In some aspects, the multi-wavelength radiation beam can include a beam of incoherent radiation such as a beam of white light. In some aspects, the second wavelength can be different from the first wavelength. The illumination system can be further configured to transmit the multi-wavelength radiation beam to a region of a surface of a substrate. In some aspects, an area of the region of the surface of the substrate is about 1.0 square millimeter. For example, a diameter of the region of the surface of the substrate can be about 35 microns. In some aspects, the region of the surface of the substrate can include a portion of an alignment grating structure.

The detection system can be configured to receive a first diffracted radiation beam that includes a first set of photons diffracted from the region of the surface of the substrate in response to an illumination (e.g., an irradiation) of the region by the multi-wavelength radiation beam. In some aspects, the first set of photons included in the first diffracted radiation beam can be indicative of first order diffraction in response to the illumination of the region by the multi-wavelength radiation beam. The detection system can be further configured to receive a second diffracted radiation beam that includes a second set of photons diffracted from the region of the surface of the substrate in response to the illumination of the region by the multi-wavelength radiation beam. In some aspects, the second set of photons included in the second diffracted radiation beam can be indicative of first order diffraction in response to the illumination of the region by the multi-wavelength radiation beam.

The detection system can be further configured to generate an electronic signal based on the first set of photons and the second set of photons. In some aspects, the electronic signal can be indicative of a phase difference between the first set of photons and the second set of photons. In some aspects, the detection system can be further configured to determine an alignment position of the substrate based on the electronic signal.

In some aspects, the illumination system can be an on-axis illumination system, and the multi-wavelength radiation beam can be an on-axis multi-wavelength radiation beam. In some aspects, the detection system can be an off-axis detection system, the first diffracted radiation beam can be a first off-axis diffracted radiation beam diffracted from the region of the surface of the substrate at a first off-axis diffraction angle, and the second diffracted radiation beam can be a second off-axis diffracted radiation beam diffracted from the region of the surface of the substrate at a second off-axis diffraction angle. In some aspects, the detection system can include: a first off-axis detection system configured to receive the first diffracted radiation beam; and a second off-axis detection system configured to receive the second diffracted radiation beam.

In some aspects, the first and second off-axis detection systems can include first and second detectors, respectively, configured to detect substantially monochromatic diffracted radiation at about the same wavelength. For example, the first off-axis detection system can include a positive blue light detector configured to detect positive first order diffraction of radiation having a wavelength of about 450 nm to about 500 nm, and the second off-axis detection system can include a negative blue light detector configured to detect negative first order diffraction of radiation also having a wavelength of about 450 nm to about 500 nm. In another example, the first off-axis detection system can include a positive green light detector configured to detect positive first order diffraction of radiation having a wavelength of about 550 nm to about 575 nm, and the second off-axis detection system can include a negative green light detector configured to detect negative first order diffraction of radiation also having a wavelength of about 550 nm to about 575 nm. In yet another example, the first off-axis detection system can include a positive red light detector configured to detect positive first order diffraction of radiation having a wavelength of about 625 nm to about 675 nm, and the second off-axis detection system can include a negative red light detector configured to detect negative first order diffraction of radiation also having a wavelength of about 625 nm to about 675 nm.

In some aspects, the first and second off-axis detection systems can include first and second detectors, respectively, configured to detect substantially monochromatic radiation at different wavelengths. For example, the first and second off-axis detection systems can include a positive blue light detector and a positive green light detector, respectively. In another example, the first and second off-axis detection systems can include a positive green light detector and a negative red light detector, respectively. In some aspects, the terms "positive" and "negative," when used to describe radiation beams, can be indicative of the relative direction of incident or diffracted radiation and thus their order can be swapped or replaced with terms such as "first" and "second" or "A" and "B." In these aspects, the terms "positive" and "negative" may not be indicative of magnitude or value.

In some aspects, the detection system can include an optic configured to collect the first diffracted radiation beam from the region of the surface of the substrate at a first diffraction angle. In some aspects, the first diffracted radiation beam can be indicative of first order diffraction in response to the illumination of the region by the multi-wavelength radiation beam. In some aspects, the optic can be further configured to collect the second diffracted radiation beam from the region of the surface of the substrate at a second diffraction angle. In some aspects, the second diffracted radiation beam can be indicative of first order diffraction in response to the illumination of the region by the multi-wavelength radiation beam. In some aspects, the optic can include a microlens structure.

In some aspects, the system can further include an optical coupler. The optical coupler can be configured to receive the first set of photons, receive the second set of photons, transmit the first set of photons to the detection system, and transmit the second set of photons to the detection system. In some aspects, the optical coupler can be, or include, a micro-electromechanical system (MEMS)-based optical coupler. In some aspects, the optical coupler can include, but is not limited to, a wideband, on-chip optical coupler such as a lensed-top, vertically-curved coupler (e.g., an elephant coupler, a lensed-top, vertically-curved silicon waveguide); direct laser writing for a lensed vertical coupler; a wideband, wavelength-insensitive in-and-out coupler that can function as both an illuminator (e.g., a radiation source) and an optical receiver (e.g., a radiation detector); an optical coupler having a multi-period grating or a chirped grating that can cover different wavelength sub-bands at different parts of the grating (e.g., multi-period gratings with chirp in between peak locations); a multi-level (e.g., multi-layer) optical coupler for 3D integrated optics; any other suitable optical coupler; or any combination thereof.

In some aspects, the detection system can include a multimode dispersion waveguide structure, a first detector, and a second detector. In some aspects, the multimode dispersion waveguide structure can include a first input channel structure, a second input channel structure, a first output channel structure, and a second output channel structure. In some aspects, the multimode dispersion waveguide structure can be configured to receive the first set of photons from the first input channel structure. In some aspects, the multimode dispersion waveguide structure can be further configured to receive the second set of photons from the second input channel structure. In some aspects, the multimode dispersion waveguide structure can be further configured to generate a first optical signal indicative of a difference between the first set of photons and the second set of photons. In some aspects, the multimode dispersion waveguide structure can be further configured to generate a second optical signal indicative of a summation of the first set of photons and the second set of photons. In some aspects, the multimode dispersion waveguide structure can be further configured to transmit the first optical signal to the first detector via the first output channel structure. In some aspects, the multimode dispersion waveguide structure can be further configured to transmit the second optical signal to the second detector via the second output channel structure. In some aspects, the first detector can be further configured to receive the first optical signal. In some aspects, the first detector can be further configured to generate difference measurement data based on a first set of measurements of the first optical signal. In some aspects, the second detector can be further configured to receive the second optical signal. In some aspects, the second detector can be further configured to generate summation measurement data based on a second set of measurements of the second optical signal. In some aspects, the detection system can be further configured to generate the electronic signal based on the difference measurement data and the summation measurement data.

In some aspects, the present disclosure describes an apparatus. The apparatus can include an integrated optical device. The integrated optical device can include a radiation source and a metrology system. The radiation source can be configured to emit a multi-wavelength radiation beam toward a region of a surface of a substrate. The multi-wavelength radiation beam can include a first wavelength and a second wavelength. The metrology system can be configured to measure a first diffracted radiation beam indicative of first order diffraction at the first wavelength in response to an irradiation of the region by the multi-wavelength radiation beam. The metrology system can be further configured to measure a second diffracted radiation beam indicative of first order diffraction at the second wavelength in response to the irradiation of the region by the multi-wavelength radiation beam. The metrology system can be further configured to generate an electronic signal based on the measured third radiation beam and the measured fourth radiation beam. In some aspects, the electronic signal can be indicative of a phase difference between the first set of photons and the second set of photons. In some aspects, the metrology system can be further configured to determine an alignment position of the substrate based on the electronic signal.

In some aspects, the present disclosure describes a method for determining an alignment of a substrate. The method can include generating, by a radiation source, a multi-wavelength radiation beam having a first wavelength and a second wavelength. The method can further include transmitting, by the radiation source, the multi-wavelength radiation beam toward a region of a surface of a substrate. The method can further include measuring, by a metrology system, a first diffracted radiation beam indicative of first order diffraction at the first wavelength in response to an irradiation of the region by the multi-wavelength radiation beam. The method can further include measuring, by the metrology system, a second diffracted radiation beam indicative of first order diffraction at the second wavelength in response to the irradiation of the region by the multi-wavelength radiation beam. The method can further include generating, by the metrology system, an electronic signal based on the measured first set of photons and the measured second set of photons. In some aspects, the electronic signal can be indicative of a phase difference between the first diffracted radiation beam and the second diffracted radiation beam. In some aspects, the method can further include determining, by the metrology system, an alignment position of the substrate based on the electronic signal.

Further features and advantages, as well as the structure and operation of various aspects, are described in detail below with reference to the accompanying drawings. It is noted that the disclosure is not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the aspects of this disclosure and to enable a person skilled in the relevant art(s) to make and use the aspects of this disclosure.

FIG. 4 is a schematic illustration of an example substrate alignment sensing system configured to utilize on-axis illumination and off-axis detection according to some aspects of the present disclosure.

FIG. 6A is a schematic illustration of another example substrate alignment sensing system configured to utilize on-axis illumination and off-axis detection according to some aspects of the present disclosure.

FIGS. 11A, 111B, 11C, 11D, 11E, and 11F are schematic illustrations of another example substrate alignment sensing system configured to utilize off-axis illumination and on-axis detection according to some aspects of the present disclosure.

Figure 1A:
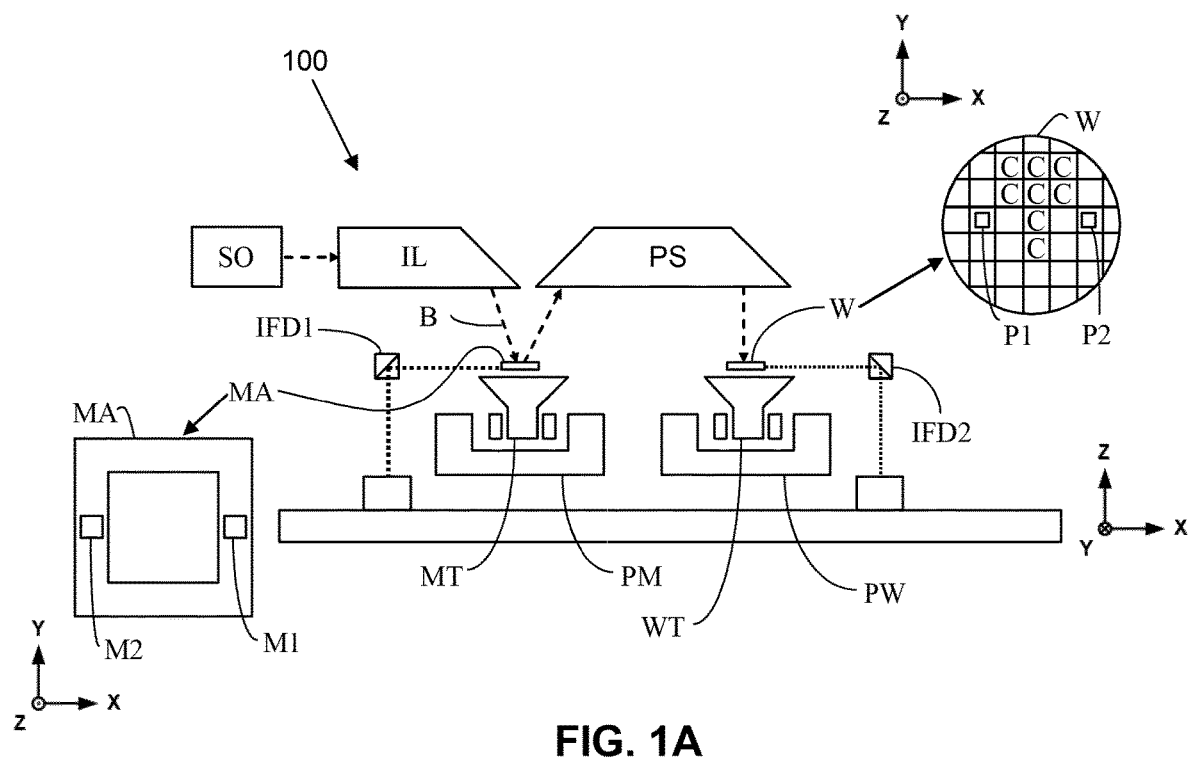
FIG. 1A is a schematic illustration of an example reflective lithographic apparatus according to some aspects of the present disclosure.

The features and advantages of the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements.

Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) merely describe the present disclosure. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "positive," "negative," "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device can be otherwise oriented (rotated 90 degrees or at other orientations) and the spatially relative descriptors used herein may likewise be interpreted accordingly. In addition, terms such as "first," "second," "third," and the like may be used herein for ease of description are not intended to refer to the timing, ordering, ranking, or priority of operations or components.

The term "about" as used herein indicates the value of a given quantity that can vary based on a particular technology. Based on the particular technology, the term "about" can indicate a value of a given quantity that varies within, for example, 10-30% of the value (e.g., 10%, 20%, or ±30% of the value).

Overview

Typically, ICs are built up layer by layer and can have 30 or more layers. On Product Overlay (OPO) is a measure of a lithographic apparatus's ability to fabricate these layers accurately on top of each other. Successive layers or multiple processes on the same layer must be accurately aligned to the previous layer. Otherwise, electrical contact between structures can be poor and the resulting devices may not perform to specification. Accurate alignment (e.g., decreased overlay error) can improve device yield and enable smaller product patterns to be fabricated. The overlay error between successive layers formed in or on the patterned substrate can be controlled by various parts of the exposure system of the lithographic apparatus.

Process induced wafer errors can be a main contributor to (OPO) errors. OPO errors can be attributed to the complexity of the patterns as well as the quantity of patterned layers. OPO errors can have relatively high spatial variations, which can vary from wafer to wafer as well as within each wafer. Measurement of the relative position of several alignment marks within a field can reduce and help correct OPO errors. Alignment error variations within the field can be used, for example, in a regression model to correct OPO errors within the field.

In order to control a lithographic process to place device features accurately on the substrate, one or more diffraction targets (e.g., alignment marks) can be provided on the substrate, and the lithographic apparatus can include one or more alignment sensors (e.g., forming a position measuring apparatus) configured to measure the positions of the one or more diffraction targets. Additionally, a fringe pattern can be formed by two off-axis coherent beams of an alignment sensor to provide structured illumination, which can act as a projected reference grating to investigate diffraction target asymmetry and substantially eliminate the need for a separate physical reference grating. Process-induced wafer errors can be further mitigated by measuring the relative positions of several alignment marks within a particular measurement field. For example, alignment error variation within the field can be used to fit a model to correct for OPO within the field.

A lithographic apparatus can include one or more alignment systems configured to measure the position of the diffraction target and align the substrate with respect to the lithographic apparatus. For example, the data can be obtained with a SMart Alignment Sensor Hybrid (SMASH) sensor that employs a self-referencing interferometer with a single detector and four different wavelengths, and extracts the alignment signal in software. An example SMASH sensor is described in, for example, U.S. Pat. No. 6,961,116, issued Nov. 1, 2005, and titled "Lithographic Apparatus, Device Manufacturing Method, and Device Manufactured Thereby," which is hereby incorporated by reference in its entirety. In another example, the data can be obtained with an Advanced Technology using High order ENhancement of Alignment (ATHENA) sensor that directs each of seven diffraction orders to a dedicated detector. An example ATHENA sensor is described in, for example, U.S. Pat. No. 6,297,876, issued Oct. 2, 2001, and titled "Lithographic Projection Apparatus with an Alignment System for Aligning Substrate on Mask," which is hereby incorporated by reference in its entirety.

In yet another example, an alignment system can include a self-referencing interferometer configured to produce two overlapping images of an alignment marker, rotate these two overlapping images over 180° with respect to each other, and detect the intensity variation of the interfering Fourier transforms of these two overlapping images in a pupil plane. These intensity variations can correspond to a phase difference between different diffraction orders of the two overlapping images. The self-referencing interferometer can derive phase difference positional information from this phase difference for use in the alignment process. Example alignment systems that include self-referencing interferometers are described in, for example, European Patent No. EP 1 372 040, granted Mar. 5, 2008, and titled "Lithographic Apparatus and Device Manufacturing Method," and U.S. Pat. No. 8,610,898, issued Dec. 17, 2013, and titled "Self-Referencing Interferometer, Alignment System, and Lithographic Apparatus," each of which is hereby incorporated by reference in its entirety.

Additionally, measurement of a plurality of alignment marks can enable modeling and correction of intra-field distortion. For example, parallel-wafer alignment systems can be implemented to enable correction of intra-field distortion without substantially impacting overall throughput. These parallel-wafer alignment system can utilize interferometry and multi-mode interference (MMI) to measure the position of the diffraction target and align the substrate with respect to the lithographic apparatus. Example parallel-wafer alignment systems are described in, for example, U.S. Provisional Patent Application No. 62/724,198, filed Aug. 29, 2018, and titled "Compact Alignment Sensor Arrangements," and U.S. Provisional Patent Application No. 62/877,964, filed Jul. 24, 2019, and titled "On Chip Wafer Alignment Sensor," each of which is hereby incorporated by reference in its entirety.

However, these and other alignment systems and techniques can be subject to certain drawbacks and limitations. For example, some of these alignment systems and techniques can be substantially incapable of measuring distortions within the alignment mark field (e.g., intra-field distortion). In another example, some of these alignment systems and techniques can be substantially incapable of measuring finer alignment grating pitches, such as grating pitches less than about 1.0 micron. In yet another example, some of these alignment systems and techniques can have a limited capability of measuring multiple diffraction targets substantially simultaneously. In still another example, some of these alignment systems and techniques can be relatively bulky and complex based on, for example, the requirement for two-dimensional (2D) control of multiple illuminators. Further, some of these alignment systems and techniques can measure only one position of one alignment mark at a time and thus trying to measure the position of many marks using current alignment sensor technology would result in significant time and throughput penalties. Further still, although some of these alignment systems and techniques can utilize waveguide gratings, their wavelength dependence can cause elevation shifts at different wavelengths.

Accordingly, there is a need for an alignment system capable of nanometer-scale precision alignment to diffraction target fabricated on a substrate. There is a further need for a scalable, compact (e.g., reduced footprint) alignment sensor that is capable of measuring intra-field distortion and configured to support finer diffraction target pitches and measure a greater number of diffraction targets substantially simultaneously. Additionally, there is a need for an alignment system that includes a wideband interferometer and a wideband optical coupler that can cover substantially the whole spectrum in a vertical range (e.g., distance along the Z-axis) of about 400 nm to about 100 nm from the surface of the substrate.

In contrast, some aspects of the present disclosure can provide systems, apparatuses, methods, and computer program products for determining an alignment of a substrate with greater alignment precision using, for example: (i) a self-referencing integrated alignment system that can include a multimode dispersion waveguide; (ii) a wideband grating coupler or chirped grating (e.g., disposed between free space and waveguides); (iii) a wideband integrated optical system that can include a wideband, on-chip optical coupler for overlay metrology and wafer alignment sensing applications; (iv) a wideband integrated alignment system that can include an integrated acousto-optical tunable filter (AOTF); and combinations thereof. In some aspects, these systems and combinations thereof can be referred to herein as "substrate alignment sensing systems." In some aspects, the present disclosure describes substrate alignment sensing systems that include various combinations of the components, structures, features, and techniques described with reference to the systems, apparatuses, methods, and computer program products disclosed herein. In some aspects, the present disclosure describes substrate alignment sensing systems that utilize dark field illumination, off-axis illumination, or both.

In some aspects, the present disclosure further provides for a self-referencing, MMI-based integrated alignment system that, in some aspects, can include a multimode dispersion waveguide coupled to one or more sensors. In contrast to some interferometry-based alignment systems, the self-referencing, MMI-based integrated alignment system disclosed herein can utilize a silicon nitride (SiN) technology system that can include an angled MMI device. There are many exemplary aspects to the self-referencing, MMI-based integrated alignment system disclosed herein. For example, aspects of the present disclosure provide for a self-referencing, MMI-based integrated alignment system that can: (i) work well as an interferometer over small wavelength bands; (ii) be substantially more compact in size (e.g., the total system can be about 5 millimeters (mm) by about 5 mm in size, which provides for better accuracy and multiple parallel alignment sensing); (iii) be scalable, as the system can have hundreds of sensors disposed on the same sensing chip; (iv) be cost effective (e.g., the total cost of the system is substantially less than other systems); (v) reduce the cost and hardware complexity by involving a less expensive, integrated system that is based on structured illumination; (vi) enable parallelization as a result of its decrease in size; (vii) provide for illumination spot shaping and control by controlling the phase and magnitude of each illumination source in the array of illumination sources; and (viii) provide a complete integrated alignment sensor.

In some aspects, the present disclosure further provides for a wideband grating coupler. In contrast to some optical couplers, the wideband grating coupler disclosed herein can utilize a multi-period grating or a chirped grating that can cover different wavelength sub-bands at different parts of the grating. In some aspects, the wideband grating coupler disclosed herein can utilize a multi-level coupler for three-dimensional (3D) integrated optics. In some aspects, the wideband grating coupler disclosed herein can utilize multi-period gratings with chirp in between peak locations. There are many exemplary aspects to the wideband grating coupler disclosed herein. For example, aspects of the present disclosure provide for a wideband grating coupler that provides a unique solution for coupling in and out the light to and from the alignment marks to an integrated, single chip-based alignment system.

In some aspects, the present disclosure further provides for a wideband integrated optical system that includes a wideband, on-chip optical coupler for overlay metrology and wafer alignment sensing applications. In some aspects, the wideband, on-chip optical coupler can include a lensed-top, vertically-curved coupler such as an elephant coupler. In some aspects, the wideband, on-chip optical coupler can utilize direct laser writing for a lensed vertical coupler. In some aspects, the wideband integrated optical system can utilize a wideband, wavelength-insensitive in-and-out coupler that can function as both an illuminator and an optical receiver for the various alignment systems described herein. In some aspects, the wideband integrated optical system can also be included in, or function as, a one-dimensional (1D) or 2D array for beam steering, focusing, and controlling of the illumination spot. There are many exemplary aspects to the wideband integrated optical system disclosed herein. For example, aspects of the present disclosure provide for a wideband integrated optical system that can: (i) be substantially wavelength independent over a wide wavelength band for integrated optics applications and for alignment and overlay metrology applications; (ii) be included in a 2D array configuration to provide increased control over the illuminating spot; and (iii) compensate for wavelength changes and thereby can reduce the number of arrays needed for each subwavelength band.

In some aspects, the present disclosure further provides for a wideband integrated alignment system. In some aspects, the wideband integrated alignment system can include an integrated acousto-optical tunable filter (AOTF) configured to generate a grating that mimics the alignment mark pitch. In some aspects, the AOTF can include, or be integrated with, a surface acoustical wave (SAW) transducer. In some aspects, the wideband integrated alignment system can include a wideband, on-chip optical coupler such as a lensed-top, vertically-curved coupler; direct laser writing for a lensed vertical coupler; a wideband, wavelength-insensitive in-and-out coupler that can function as both an illuminator and a receiver; or any other suitable optical coupler. There are many exemplary aspects to the wideband integrated alignment system disclosed herein. For example, aspects of the present disclosure provide for a wideband integrated alignment system that substantially solves the wavelength-dependent issues of other integrated optics applications for alignment sensing applications.

There are many exemplary aspects to the systems, apparatuses, methods, and computer program products disclosed herein. For example, aspects of the present disclosure can provide for improved accuracy, cost reduction, and scalability because, in some aspects, hundreds of sensors can be implemented on the same common platform. In another example, the integration of components (e.g., illumination sources, optical couplers, fibers, mirrors, lenses, prisms, beam splitters, wave plates, waveguides, polarizers, polarization rotators, detectors, processors, and other suitable structures) disclosed herein can provide a miniaturized single-chip sensor for measuring characteristics, such as alignment positions, of alignment marks positioned on a substrate. In still another example, aspects of the present disclosure can provide for multiple sensors (e.g., sensor array) disposed on a single on-chip integrated alignment system that can conduct different measurements of multiple alignment marks positioned on the same substrate simultaneously or in real-time. In still another example, aspects of the present disclosure can provide for substantially increased stability and phase accuracy, as well as decreased optical coupling losses, for precise and consistent wafer alignment. In still another example, aspects of the present disclosure can provide for nanometer-scale precision alignment to an alignment grating mark printed on the wafer. In still another example, aspects of the present disclosure can provide for a compact alignment sensor capable of measuring intra field distortion that can support finer alignment grating pitches and measure multiple marks simultaneously. In still another example, aspects of the present disclosure can provide for self-aligned and compact sensor systems having reduced footprints and higher accuracy measurements of intra-field distortion.

Before describing such aspects in more detail, however, it is instructive to present an example environment in which aspects of the present disclosure can be implemented.

Example Lithographic Systems

Figure 1B:
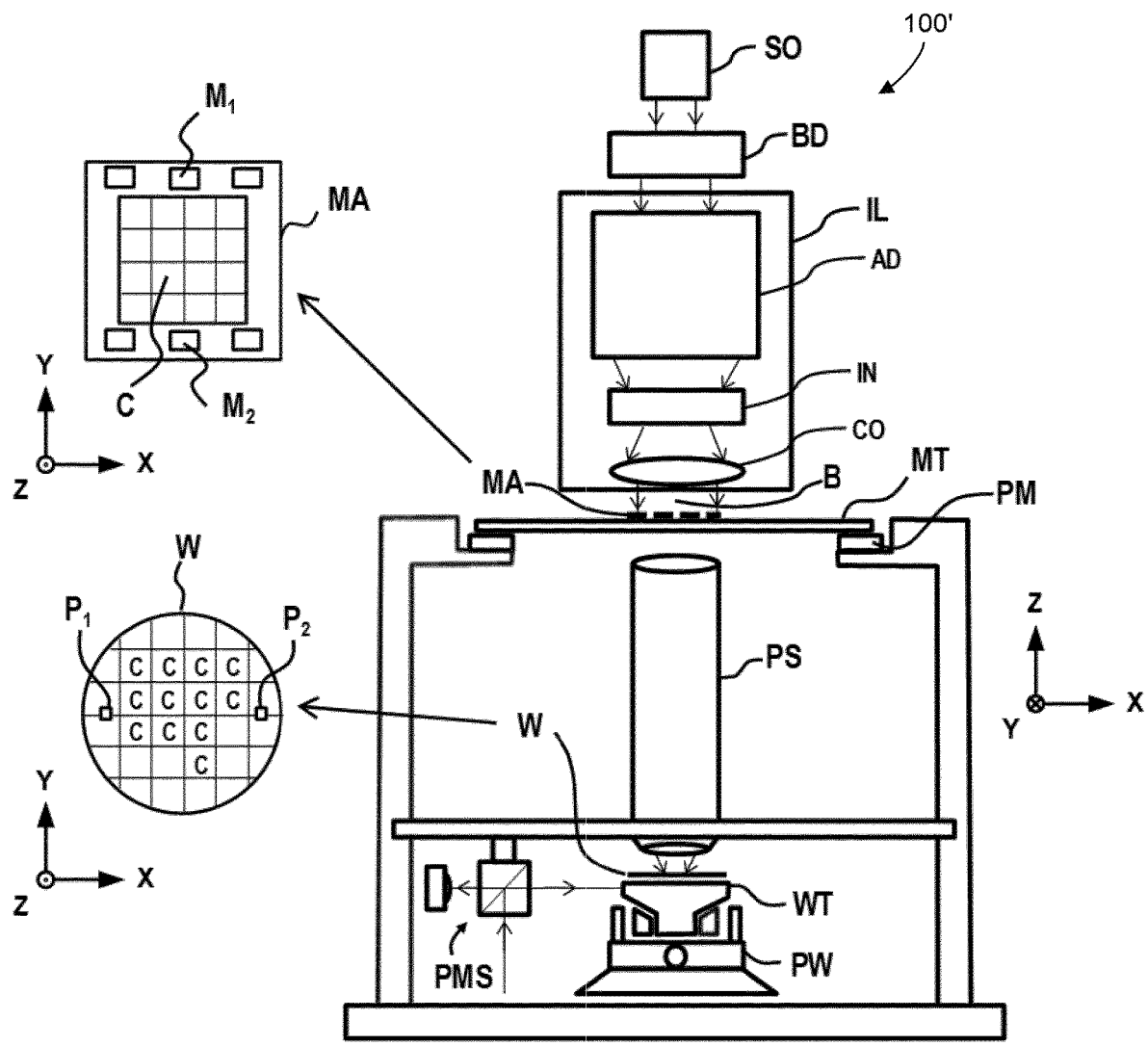
FIG. 1B is a schematic illustration of an example transmissive lithographic apparatus according to some aspects of the present disclosure.

FIGS. 1A and 1B are schematic illustrations of a lithographic apparatus 100 and a lithographic apparatus 100', respectively, in which aspects of the present disclosure can be implemented. As shown in FIGS. 1A and 1B, the lithographic apparatuses 100 and 100' are illustrated from a point of view (e.g., a side view) that is normal to the XZ plane (e.g., the X-axis points to the right, the Z-axis points upward, and the Y-axis points into the page away from the viewer), while the patterning device MA and the substrate W are presented from additional points of view (e.g., a top view) that are normal to the XY plane (e.g., the X-axis points to the right, the Y-axis points upward, and the Z-axis points out of the page toward the viewer).

In some aspects, the lithographic apparatus 100 and/or the lithographic apparatus 100' can include one or more of the following structures: an illumination system IL (e.g., an illuminator) configured to condition a radiation beam B (e.g., a deep ultra violet (DUV) radiation beam or an extreme ultra violet (EUV) radiation beam); a support structure MT (e.g., a mask table) configured to support a patterning device MA (e.g., a mask, a reticle, or a dynamic patterning device) and connected to a first positioner PM configured to accurately position the patterning device MA; and, a substrate holder such as a substrate table WT (e.g., a wafer table) configured to hold a substrate W (e.g., a resist-coated wafer) and connected to a second positioner PW configured to accurately position the substrate W. Lithographic apparatuses 100 and 100' also have a projection system PS (e.g., a refractive projection lens system) configured to project a pattern imparted to the radiation beam B by patterning device MA onto a target portion C (e.g., a portion including one or more dies) of the substrate W. In lithographic apparatus 100, the patterning device MA and the projection system PS are reflective. In lithographic apparatus 100', the patterning device MA and the projection system PS are transmissive.

In some aspects, in operation, the illumination system IL can receive a radiation beam from a radiation source SO (e.g., via a beam delivery system BD shown in FIG. 1B). The illumination system IL can include various types of optical structures, such as refractive, reflective, catadioptric, magnetic, electromagnetic, electrostatic, and other types of optical components, or any combination thereof, for directing, shaping, or controlling radiation. In some aspects, the illumination system IL can be configured to condition the radiation beam B to have a desired spatial and angular intensity distribution in its cross-section at a plane of the patterning device MA.

In some aspects, the support structure MT can hold the patterning device MA in a manner that depends on the orientation of the patterning device MA with respect to a reference frame, the design of at least one of the lithographic apparatuses 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

In some aspects, the patterning device MA can be transmissive (as in lithographic apparatus 100' of FIG. 1B) or reflective (as in lithographic apparatus 100 of FIG. 1A). The patterning device MA can include various structures such as reticles, masks, programmable mirror arrays, programmable LCD panels, other suitable structures, or combinations thereof. Masks can include mask types such as binary, alternating phase shift, or attenuated phase shift, as well as various hybrid mask types. In one example, a programmable mirror array can include a matrix arrangement of small mirrors, each of which can be individually tilted so as to reflect an incoming radiation beam in different directions. The tilted mirrors can impart a pattern in the radiation beam B, which is reflected by a matrix of small mirrors.

The term "projection system" PS should be interpreted broadly and can encompass any type of projection system, including refractive, reflective, catadioptric, magnetic, anamorphic, electromagnetic, and electrostatic optical systems, or any combination thereof, as appropriate for the exposure radiation being used, and/or for other factors such as the use of an immersion liquid (e.g., on the substrate W) or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps. In addition, any use herein of the term "projection lens" can be interpreted, in some aspects, as synonymous with the more general term "projection system" PS.

In some aspects, the lithographic apparatus 100 and/or the lithographic apparatus 100' can be of a type having two (e.g., "dual stage") or more substrate tables WT and/or two or more mask tables). In such "multiple stage" machines, the additional substrate tables WT can be used in parallel, or preparatory steps can be carried out on one or more tables while one or more other substrate tables WT are being used for exposure. In one example, steps in preparation of a subsequent exposure of the substrate W can be carried out on the substrate W located on one of the substrate tables WT while another substrate W located on another of the substrate tables WT is being used for exposing a pattern on another substrate W. In some aspects, the additional table may not be a substrate table WT.

In some aspects, in addition to the substrate table WT, the lithographic apparatus 100 and/or the lithographic apparatus 100' can include a measurement stage. The measurement stage can be arranged to hold a sensor. The sensor can be arranged to measure a property of the projection system PS, a property of the radiation beam B, or both. In some aspects, the measurement stage can hold multiple sensors. In some aspects, the measurement stage can move beneath the projection system PS when the substrate table WT is away from the projection system PS.

In some aspects, the lithographic apparatus 100 and/or the lithographic apparatus 100' can also be of a type wherein at least a portion of the substrate can be covered by a liquid having a relatively high refractive index, e.g., water, so as to fill a space between the projection system PS and the substrate W. An immersion liquid can also be applied to other spaces in the lithographic apparatus, for example, between the patterning device MA and the projection system PS. Immersion techniques provide for increasing the numerical aperture of projection systems. The term "immersion" as used herein does not mean that a structure, such as a substrate, must be submerged in liquid, but rather only means that liquid is located between the projection system and the substrate during exposure. Various immersion techniques are described in U.S. Pat. No. 6,952,253, issued Oct. 4, 2005, and titled "LITHOGRAPHIC APPARATUS AND DEVICE MANUFACTURING METHOD," which is incorporated by reference herein in its entirety.

Referring to FIGS. 1A and 1B, the illumination system IL receives a radiation beam B from a radiation source SO. The radiation source SO and the lithographic apparatus 100 or 100' can be separate physical entities, for example, when the radiation source SO is an excimer laser. In such cases, the radiation source SO is not considered to form part of the lithographic apparatus 100 or 100', and the radiation beam B passes from the radiation source SO to the illumination system IL with the aid of a beam delivery system BD (e.g., shown in FIG. 1B) including, for example, suitable directing mirrors and/or a beam expander. In other cases, the radiation source SO can be an integral part of the lithographic apparatus 100 or 100', for example, when the radiation source SO is a mercury lamp. The radiation source SO and the illuminator IL, together with the beam delivery system BD, if required, can be referred to as a radiation system.

In some aspects, the illumination system IL can include an adjuster AD for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illumination system IL can include various other components, such as an integrator IN and a radiation collector CO (e.g., a condenser or collector optic). In some aspects, the illumination system IL can be used to condition the radiation beam B to have a desired uniformity and intensity distribution in its cross section.

Referring to FIG. 1A, in operation, the radiation beam B can be incident on the patterning device MA (e.g., a mask, reticle, programmable mirror array, programmable LCD panel, any other suitable structure or combination thereof), which can be held on the support structure MT (e.g., a mask table), and can be patterned by the pattern (e.g., design layout) present on the patterning device MA. In lithographic apparatus 100, the radiation beam B can be reflected from the patterning device MA. Having traversed (e.g., after being reflected from) the patterning device MA, the radiation beam B can pass through the projection system PS, which can focus the radiation beam B onto a target portion C of the substrate W or onto a sensor arranged at a stage.

In some aspects, with the aid of the second positioner PW and position sensor IFD2 (e.g., an interferometric device, linear encoder, or capacitive sensor), the substrate table WT can be moved accurately, e.g., so as to position different target portions C in the path of the radiation beam B. Similarly, the first positioner PM and another position sensor IFD1 (e.g., an interferometric device, linear encoder, or capacitive sensor) can be used to accurately position the patterning device MA with respect to the path of the radiation beam B.

In some aspects, patterning device MA and substrate W can be aligned using mask alignment marks M1 and M2 and substrate alignment marks P1 and P2. Although FIGS. 1A and 1B illustrate the substrate alignment marks P1 and P2 as occupying dedicated target portions, the substrate alignment marks P1 and P2 may be located in spaces between target portions. Substrate alignment marks P1 and P2 are known as scribe-lane alignment marks when they are located between the target portions C. Substrate alignment marks P1 and P2 can also be arranged in the target portion C area as in-die marks. These in-die marks can also be used as metrology marks, for example, for overlay measurements.

In some aspects, for purposes of illustration and not limitation, one or more of the figures herein can utilize a Cartesian coordinate system. The Cartesian coordinate system includes three axes: an X-axis; a Y-axis; and a Z-axis. Each of the three axes is orthogonal to the other two axes (e.g., the X-axis is orthogonal to the Y-axis and the Z-axis, the Y-axis is orthogonal to the X-axis and the Z-axis, the Z-axis is orthogonal to the X-axis and the Y-axis). A rotation around the X-axis is referred to as an Rx-rotation. A rotation around the Y-axis is referred to as an Ry-rotation. A rotation around about the Z-axis is referred to as an Rz-rotation. In some aspects, the X-axis and the Y-axis define a horizontal plane, whereas the Z-axis is in a vertical direction. In some aspects, the orientation of the Cartesian coordinate system may be different, for example, such that the Z-axis has a component along the horizontal plane. In some aspects, another coordinate system, such as a cylindrical coordinate system, can be used.

Referring to FIG. 1B, the radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. In some aspects, the projection system PS can have a pupil conjugate to an illumination system pupil. In some aspects, portions of radiation can emanate from the intensity distribution at the illumination system pupil and traverse a mask pattern without being affected by diffraction at the mask pattern MP and create an image of the intensity distribution at the illumination system pupil.

The projection system PS projects an image MP' of the mask pattern MP, where image MP' is formed by diffracted beams produced from the mask pattern MP by radiation from the intensity distribution, onto a resist layer coated on the substrate W. For example, the mask pattern MP can include an array of lines and spaces. A diffraction of radiation at the array and different from zeroth-order diffraction generates diverted diffracted beams with a change of direction in a direction perpendicular to the lines. Undiffracted beams (e.g., so-called zeroth-order diffracted beams) traverse the pattern without any change in propagation direction. The zeroth-order diffracted beams traverse an upper lens or upper lens group of the projection system PS, upstream of the pupil conjugate of the projection system PS, to reach the pupil conjugate. The portion of the intensity distribution in the plane of the pupil conjugate and associated with the zeroth-order diffracted beams is an image of the intensity distribution in the illumination system pupil of the illumination system IL. In some aspects, an aperture device can be disposed at, or substantially at, a plane that includes the pupil conjugate of the projection system PS.

The projection system PS is arranged to capture, by means of a lens or lens group, not only the zeroth-order diffracted beams, but also first-order or first- and higher-order diffracted beams (not shown). In some aspects, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the substrate W to create an image of the mask pattern MP at highest possible resolution and process window (e.g., usable depth of focus in combination with tolerable exposure dose deviations). In some aspects, astigmatism aberration can be reduced by providing radiation poles (not shown) in opposite quadrants of an illumination system pupil. Further, in some aspects, astigmatism aberration can be reduced by blocking the zeroth-order beams in the pupil conjugate of the projection system PS associated with radiation poles in opposite quadrants. This is described in more detail in U.S. Pat. No. 7,511,799, issued Mar. 31, 2009, and titled "LITHOGRAPHIC PROJECTION APPARATUS AND A DEVICE MANUFACTURING METHOD," which is incorporated by reference herein in its entirety.

In some aspects, with the aid of the second positioner PW and a position measurement system PMS (e.g., including a position sensor such as an interferometric device, linear encoder, or capacitive sensor), the substrate table WT can be moved accurately, e.g., so as to position different target portions C in the path of the radiation beam B at a focused and aligned position. Similarly, the first positioner PM and another position sensor (e.g., an interferometric device, linear encoder, or capacitive sensor) (not shown in FIG. 1B) can be used to accurately position the patterning device MA with respect to the path of the radiation beam B (e.g., after mechanical retrieval from a mask library or during a scan). Patterning device MA and substrate W can be aligned using mask alignment marks M1 and M2 and substrate alignment marks P1 and P2.

In general, movement of the support structure MT can be realized with the aid of a long-stroke positioner (coarse positioning) and a short-stroke positioner (fine positioning), which form part of the first positioner PM. Similarly, movement of the substrate table WT can be realized using a long-stroke positioner and a short-stroke positioner, which form part of the second positioner PW. In the case of a stepper (as opposed to a scanner), the support structure MT can be connected to a short-stroke actuator only or can be fixed. Patterning device MA and substrate W can be aligned using mask alignment marks M1 and M2, and substrate alignment marks P1 and P2. Although the substrate alignment marks (as illustrated) occupy dedicated target portions, they can be located in spaces between target portions (e.g., scribe-lane alignment marks). Similarly, in situations in which more than one die is provided on the patterning device MA, the mask alignment marks M1 and M2 can be located between the dies.

Support structure MT and patterning device MA can be in a vacuum chamber V, where an in-vacuum robot can be used to move patterning devices such as a mask in and out of vacuum chamber. Alternatively, when support structure MT and patterning device MA are outside of the vacuum chamber, an out-of-vacuum robot can be used for various transportation operations, similar to the in-vacuum robot. In some instances, both the in-vacuum and out-of-vacuum robots need to be calibrated for a smooth transfer of any payload (e.g., a mask) to a fixed kinematic mount of a transfer station.

In some aspects, the lithographic apparatuses 100 and 100' can be used in at least one of the following modes:

1. In step mode, the support structure MT and the substrate table WT are kept essentially stationary, while an entire pattern imparted to the radiation beam B is projected onto a target portion C at one time (e.g., a single static exposure). The substrate table WT is then shifted in the X and/or Y direction so that a different target portion C can be exposed.

2. In scan mode, the support structure MT and the substrate table WT are scanned synchronously while a pattern imparted to the radiation beam B is projected onto a target portion C (e.g., a single dynamic exposure). The velocity and direction of the substrate table WT relative to the support structure MT (e.g., mask table) can be determined by the (de-)magnification and image reversal characteristics of the projection system PS.

3. In another mode, the support structure MT is kept substantially stationary holding a programmable patterning device MA, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device MA, such as a programmable mirror array.

In some aspects, the lithographic apparatuses 100 and 100' can employ combinations and/or variations of the above-described modes of use or entirely different modes of use.

In some aspects, as shown in FIG. 1A, the lithographic apparatus 100 can include an EUV source configured to generate an EUV radiation beam B for EUV lithography. In general, the EUV source can be configured in a radiation source SO, and a corresponding illumination system IL can be configured to condition the EUV radiation beam B of the EUV source.

Figure 2:
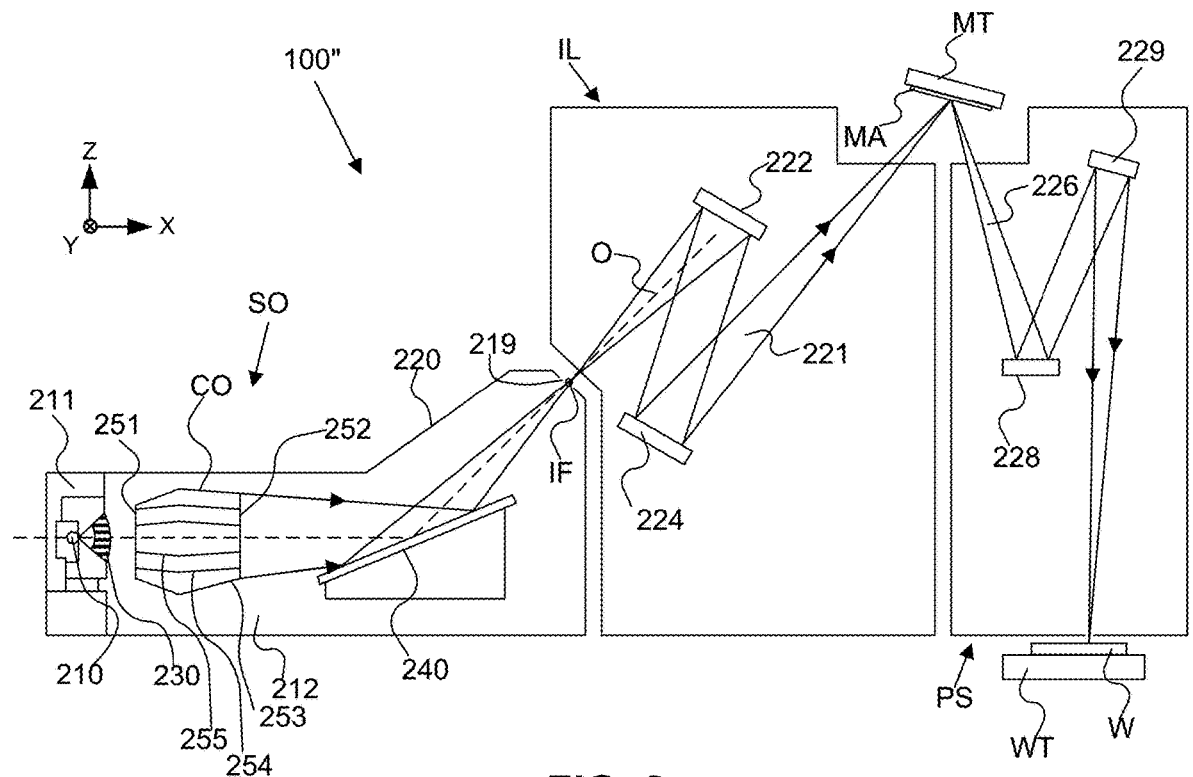
FIG. 2 is a more detailed schematic illustration of the reflective lithographic apparatus shown in FIG. 1A according to some aspects of the present disclosure.

FIG. 2 shows the lithographic apparatus 100 in more detail, including the radiation source SO (e.g., a source collector apparatus), the illumination system IL, and the projection system PS. As shown in FIG. 2, the lithographic apparatus 100 is illustrated from a point of view (e.g., a side view) that is normal to the XZ plane (e.g., the X-axis points to the right and the Z-axis points upward).

The radiation source SO is constructed and arranged such that a vacuum environment can be maintained in an enclosing structure 220. The radiation source SO includes a source chamber 211 and a collector chamber 212 and is configured to produce and transmit EUV radiation. EUV radiation can be produced by a gas or vapor, for example xenon (Xe) gas, lithium (Li) vapor, or tin (Sn) vapor in which an EUV radiation emitting plasma 210 is created to emit radiation in the EUV range of the electromagnetic spectrum. The EUV radiation emitting plasma 210, at least partially ionized, can be created by, for example, an electrical discharge or a laser beam. Partial pressures of, for example, about 10.0 pascals (Pa) of Xe gas, Li vapor, Sn vapor, or any other suitable gas or vapor can be used for efficient generation of the radiation. In some aspects, a plasma of excited tin is provided to produce EUV radiation.

The radiation emitted by the EUV radiation emitting plasma 210 is passed from the source chamber 211 into the collector chamber 212 via an optional gas barrier or contaminant trap 230 (e.g., in some cases also referred to as contaminant barrier or foil trap), which is positioned in or behind an opening in source chamber 211. The contaminant trap 230 can include a channel structure. Contamination trap 230 can also include a gas barrier or a combination of a gas barrier and a channel structure. The contaminant trap 230 further indicated herein at least includes a channel structure.

The collector chamber 212 can include a radiation collector CO (e.g., a condenser or collector optic), which can be a so-called grazing incidence collector. Radiation collector CO has an upstream radiation collector side 251 and a downstream radiation collector side 252. Radiation that traverses radiation collector CO can be reflected off a grating spectral filter 240 to be focused in a virtual source point IF. The virtual source point IF is commonly referred to as the intermediate focus, and the source collector apparatus is arranged such that the virtual source point IF is located at or near an opening 219 in the enclosing structure 220. The virtual source point IF is an image of the EUV radiation emitting plasma 210. Grating spectral filter 240 is used in particular for suppressing infrared (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the radiation beam 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination system IL and projection system PS. Optionally, the grating spectral filter 240 can be present depending upon the type of lithographic apparatus. Further, there can be more mirrors present than those shown in the FIG. 2. For example, there can be one to six additional reflective elements present in the projection system PS than shown in FIG. 2.

Radiation collector CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a radiation collector CO of this type is preferably used in combination with a discharge produced plasma (DPP) source.

Example Lithographic Cell

Figure 3:
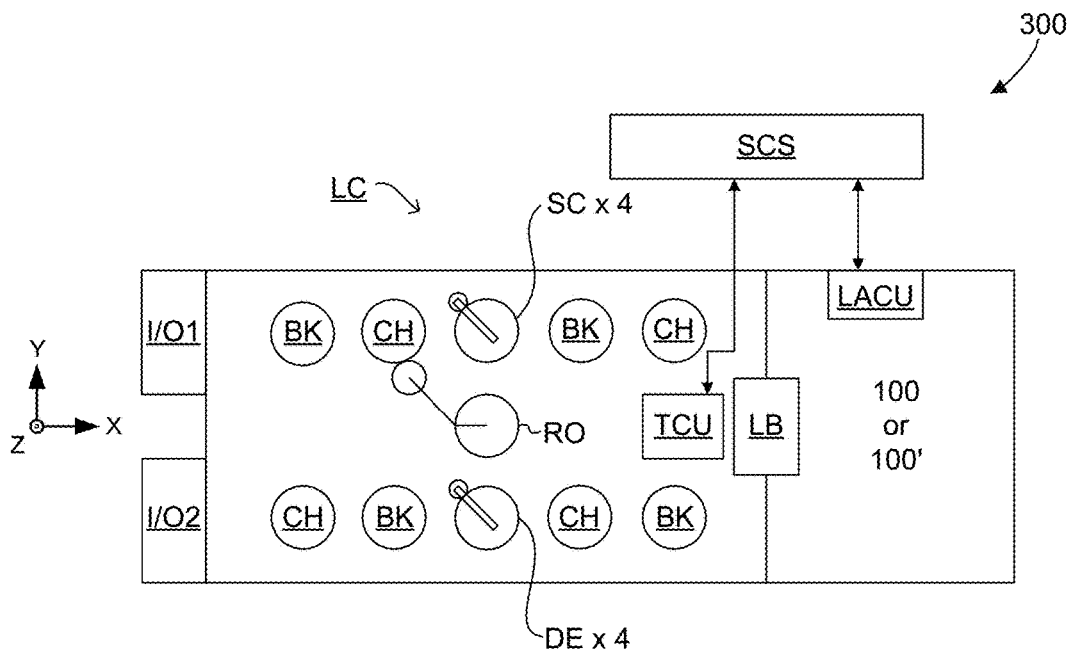
FIG. 3 is a schematic illustration of an example lithographic cell according to some aspects of the present disclosure.

FIG. 3 shows a lithographic cell 300, also sometimes referred to a lithocell or cluster. As shown in FIG. 3, the lithographic cell 300 is illustrated from a point of view (e.g., a top view) that is normal to the XY plane (e.g., the X-axis points to the right and the Y-axis points upward).

Lithographic apparatus 100 or 100' can form part of lithographic cell 300. Lithographic cell 300 can also include one or more apparatuses to perform pre- and post-exposure processes on a substrate. For example, these apparatuses can include spin coaters SC to deposit resist layers, developers DE to develop exposed resist, chill plates CH, and bake plates BK. A substrate handler RO (e.g., a robot) picks up substrates from input/output ports I/O1 and I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Example Substrate Alignment Sensing Systems Having On-Axis Illumination and Off-Axis Detection As shown in FIG. 4, the example substrate alignment sensing system 400 can include an on-axis illumination subsystem 460 and a detection system that includes a plurality of off-axis detection subsystems. In some aspects, the plurality of off-axis detection subsystems can include a first off-axis detection subsystem 402A, a second off-axis detection subsystem 402B, a third off-axis detection subsystem 404A, a fourth off-axis detection subsystem 404B, any other suitable off-axis detection system (e.g., tens or hundreds of off-axis detection subsystems), or any combination thereof. In some aspects, the example substrate alignment sensing system 400 can include an integrated optical device (e.g., a single-chip SiN-based system) that includes the on-axis illumination subsystem 460 and the plurality of off-axis detection subsystems. In some aspects, the example substrate alignment sensing system 400, the on-axis illumination subsystem 460, the detection system, the plurality of off-axis detection subsystems, or a combination thereof can include, or be in communication with, a substrate alignment sensing controller (e.g., example computing system 1300 described with reference to FIG. 13) configured to perform the functions and operations described herein.

In some aspects, the example substrate alignment sensing system 400, or any portion thereof, can be implemented using any of the structures, components, features, or techniques described with reference to the example substrate alignment sensing systems 500 and 500' described with reference to FIGS. 5A and 5B; the example substrate alignment sensing system 600 described with reference to FIGS. 6A, 6B, 6C, and 6D; the example substrate alignment sensing system 700 described with reference to FIG. 7; the example substrate alignment sensing system 800 described with reference to FIG. 8; the example substrate alignment sensing system 1000 described with reference to FIG. 10; the example substrate alignment sensing system 1100 described with reference to FIGS. 11A, 111B, 11C, 11D, 11E, and 11F; the example computing system 1300 described with reference to FIG. 13; any other suitable structure, component, feature, or technique; any portion thereof; or any combination thereof.

In some aspects, the on-axis illumination subsystem 460 can be configured to generate an on-axis multi-wavelength radiation beam 480. In other aspects, the on-axis illumination subsystem 460 can be configured to receive the on-axis multi-wavelength radiation beam 480 from a source illumination subsystem. In some aspects, the on-axis illumination subsystem 460 can be further configured to transmit the on-axis multi-wavelength radiation beam 480 toward a region 490 of a surface of a substrate 492. In some aspects, an area of the region 490 can be about 1.0 square millimeter. In one illustrative and non-limiting example, a diameter of the region 490 can be about 35 microns.

In some aspects, each of the plurality of off-axis detection subsystems can be configured to receive an off-axis diffracted radiation beam (e.g., indicative of positive or negative first order diffraction at a particular wavelength) from the region 490 of the surface of the substrate 492 in response to an on-axis illumination (e.g., irradiation) of the region 490 by the on-axis multi-wavelength radiation beam 480. In some aspects, each of the plurality of off-axis detection subsystems can include, or be optically coupled to, an optic configured to collect a respective off-axis diffracted radiation beam from the region 490. In some aspects, the example substrate alignment sensing system 400 can include, or be coupled to, a multimode dispersion waveguide coupled to two or more of the plurality of off-axis detection subsystems on the input side and one or more sensors on the output side.

In some aspects, the first off-axis detection subsystem 402A can be configured to receive a first off-axis diffracted radiation beam 482A at a first wavelength from the region 490 at a first off-axis diffraction angle 472A. In some aspects, the second off-axis detection subsystem 402B can be configured to receive a second off-axis diffracted radiation beam 482B at a second wavelength from the region 490 at a second off-axis diffraction angle 472B. In some aspects, the second wavelength can be equal to about the first wavelength. For example, the first off-axis diffracted radiation beam 482A can be indicative of "positive" first order diffraction at the first wavelength in response to the illumination of the region 490 by the on-axis multi-wavelength radiation beam 480, and the second off-axis diffracted radiation beam 482B can be indicative of "negative" first order diffraction at the first wavelength in response to the illumination of the region 490 by the on-axis multi-wavelength radiation beam 480.

In some aspects, the third off-axis detection subsystem 404A can be configured to receive a third off-axis diffracted radiation beam 484A at a third wavelength from the region 490 at a third off-axis diffraction angle 474A. In some aspects, the fourth off-axis detection subsystem 404B can be configured to receive a fourth off-axis diffracted radiation beam 484B at a fourth wavelength from the region 490 at a fourth off-axis diffraction angle 474B. In some aspects, the fourth wavelength can be equal to about the third wavelength. For example, the third off-axis diffracted radiation beam 484A can be indicative of "positive" first order diffraction at the third wavelength in response to the illumination of the region 490 by the on-axis multi-wavelength radiation beam 480, and the fourth off-axis diffracted radiation beam 484B can be indicative of "negative" first order diffraction at the third wavelength in response to the illumination of the region 490 by the on-axis multi-wavelength radiation beam 480.

In some aspects, each of the first off-axis diffraction angle 472A, the second off-axis diffraction angle 472B, the third off-axis diffraction angle 474A, and the fourth off-axis diffraction angle 474B can be defined relative to the surface normal of the surface of the substrate 492. In some aspects, the on-axis multi-wavelength radiation beam 480 can be coincident with the surface normal (e.g., the angle between the on-axis multi-wavelength radiation beam 480 and the surface normal can be about zero). In other aspects, the on-axis multi-wavelength radiation beam 480 can be non-coincident with the surface normal (e.g., the angle between the on-axis multi-wavelength radiation beam 480 and the surface normal can be non-zero).

In some aspects, the example substrate alignment sensing system 400 can further include an optical coupler in optical communication with the first off-axis detection subsystem 402A, the second off-axis detection subsystem 402B, the third off-axis detection subsystem 404A, the fourth off-axis detection subsystem 404B, any other suitable component (e.g., detectors, lenses, wedges), or any combination thereof. In some aspects, the optical coupler can be configured to receive photons from the first off-axis diffracted radiation beam 482A, the second off-axis diffracted radiation beam 482B, the third off-axis diffracted radiation beam 484A, and the fourth off-axis diffracted radiation beam 484B and transmit the received photons to the detection system. In some aspects, the optical coupler can be, or include, a MEMS-based optical coupler. In some aspects, the optical coupler can include, but is not limited to, a wideband, on-chip optical coupler such as a lensed-top, vertically-curved coupler (e.g., an elephant coupler, a lensed-top, vertically-curved silicon waveguide); direct laser writing for a lensed vertical coupler; a wideband, wavelength-insensitive in-and-out coupler that can function as both an illuminator (e.g., a radiation source) and an optical receiver (e.g., a radiation detector); an optical coupler having a multi-period grating or a chirped grating that can cover different wavelength sub-bands at different parts of the grating (e.g., multi-period gratings with chirp in between peak locations); a multi-level optical coupler for 3D integrated optics; any other suitable optical coupler; or any combination thereof.

In some aspects, the example substrate alignment sensing system 400 can be further configured to generate an electronic signal based on the first off-axis diffracted radiation beam 482A, the second off-axis diffracted radiation beam 482B, the third off-axis diffracted radiation beam 484A, the fourth off-axis diffracted radiation beam 484B, or a combination thereof. In some aspects, the electronic signal can include a first sub-signal indicative of a first phase difference between the first off-axis diffracted radiation beam 482A and the second off-axis diffracted radiation beam 482B. In some aspects, the electronic signal can further include a second sub-signal indicative of a second phase difference between the third off-axis diffracted radiation beam 484A and the fourth off-axis diffracted radiation beam 484B. In some aspects, the example substrate alignment sensing system 400 can be further configured to determine an alignment position of the alignment grating structure 494 based on the electronic signal or any portion (e.g., sub-signal) or combination of portions thereof.

Figure 5A:
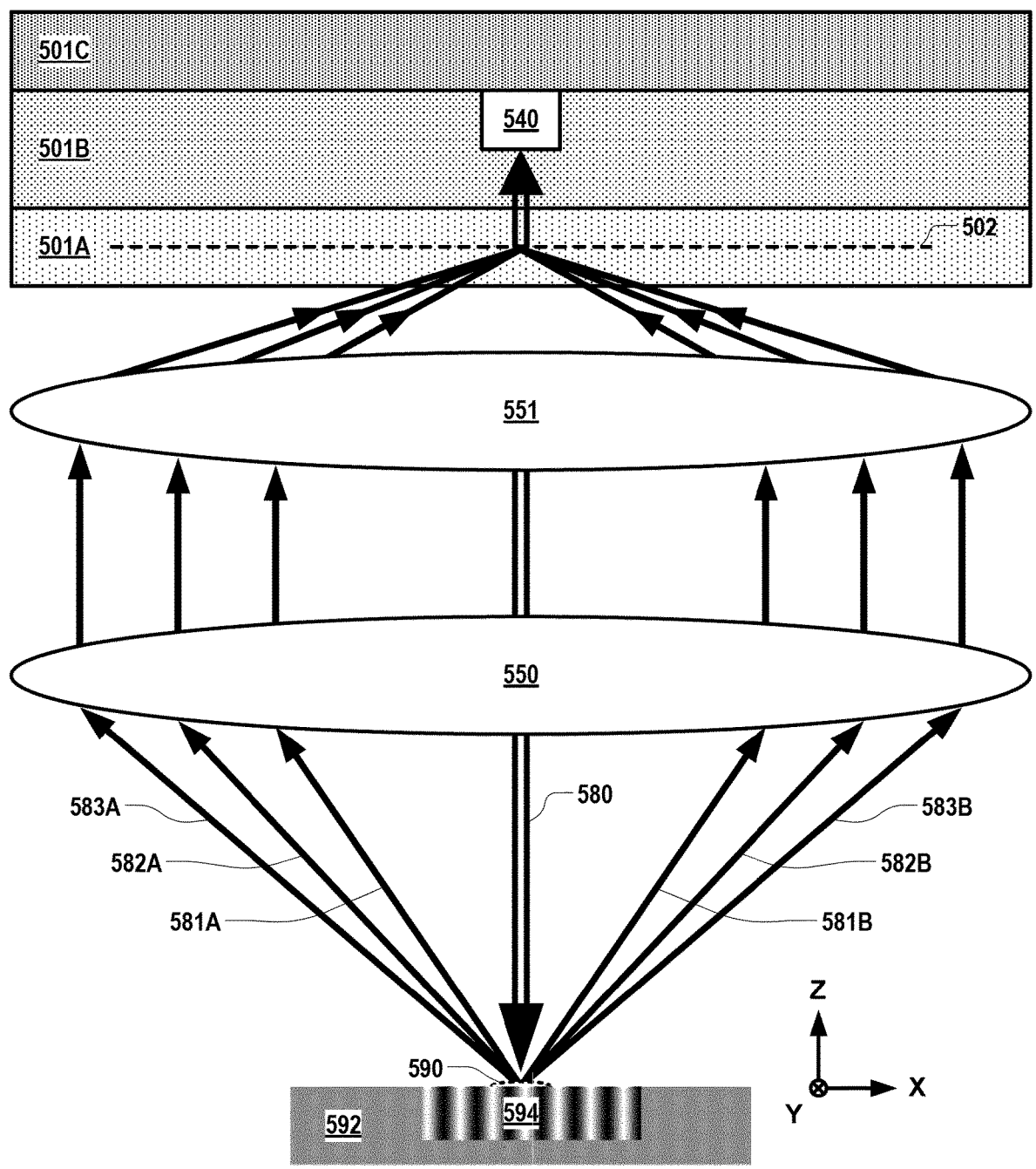
FIGS. 5A and 5B are schematic illustrations of other example substrate alignment sensing systems configured to utilize on-axis illumination and off-axis detection according to some aspects of the present disclosure.

FIG. 5A is a schematic illustration of another example substrate alignment sensing system 500 according to some aspects of the present disclosure. As shown in FIG. 5A, the example substrate alignment sensing system 500 can include a detection system and, optionally in some aspects, an illumination system. In some aspects, the detection system can be, or include, an integrated alignment sensor that includes a first layer 501A, a second layer 501B, and a third layer 501C. In some aspects, the example substrate alignment sensing system 500 can include, or be in communication with, a substrate alignment sensing controller (e.g., example computing system 1300 described with reference to FIG. 13) configured to perform the functions and operations described herein.

In some aspects, the example substrate alignment sensing system 500, or any portion thereof, can be implemented using any of the structures, components, features, or techniques described with reference to the example substrate alignment sensing system 400 described with reference to FIG. 4; the example substrate alignment sensing system 500' described with reference to FIG. 5B; the example substrate alignment sensing system 600 described with reference to FIGS. 6A, 6B, 6C, and 6D; the example substrate alignment sensing system 700 described with reference to FIG. 7; the example substrate alignment sensing system 800 described with reference to FIG. 8; the example substrate alignment sensing system 1000 described with reference to FIG. 10; the example substrate alignment sensing system 1100 described with reference to FIGS. 11A, 11B, 11C, 11D, 11E, and 11F; the example computing system 1300 described with reference to FIG. 13; any other suitable structure, component, feature, or technique; any portion thereof; or any combination thereof.

In some aspects, the example substrate alignment sensing system 500 can include an illumination system configured to generate an on-axis multi-wavelength radiation beam 580. In some aspects, the illumination system can be further configured to transmit the on-axis multi-wavelength radiation beam 580 to a region 590 of a surface of a substrate 592. In some aspects, the region 590 can include a portion of an alignment grating structure 594. In some aspects, the illumination system can be further configured to transmit the on-axis multi-wavelength radiation beam 580 to the region 590 through an optic 550, an optic 551, or both.

In some aspects, the first layer 501A of the detection system can be configured to receive, via the optic 550 and the optic 551, a plurality of diffracted radiation beams (e.g., indicative of positive and negative first order diffraction at a plurality of wavelengths) from the region 590 of the surface of a substrate 592 in response to the illumination of the region 590 by the on-axis multi-wavelength radiation beam 580. In some aspects, the plurality of diffracted radiation beams can include a first off-axis diffracted radiation beam 581A, a second off-axis diffracted radiation beam 581B, a third off-axis diffracted radiation beam 582A, a fourth off-axis diffracted radiation beam 582B, a fifth off-axis diffracted radiation beam 583A, a sixth off-axis diffracted radiation beam 583B, any other suitable radiation beam, or any combination thereof.

In some aspects, the first layer 501A can be configured to receive, via the optic 550 and the optic 551, a first off-axis diffracted radiation beam 581A having a first wavelength and diffracted from the region 590 at a first diffraction angle. In some aspects, the first layer 501A can be configured to receive, via the optic 550 and the optic 551, a second off-axis diffracted radiation beam 581B having a second wavelength and diffracted from the region 590 at a second diffraction angle. In some aspects, the second wavelength can be equal to about the first wavelength, and a second magnitude of the second diffraction angle can be about equal to a first magnitude of the first diffraction angle. For example, the first off-axis diffracted radiation beam 581A can be indicative of "positive" first order diffraction at the first wavelength in response to the illumination of the region 590 by the on-axis multi-wavelength radiation beam 580, and the second off-axis diffracted radiation beam 581B can be indicative of "negative" first order diffraction at the first wavelength in response to the illumination of the region 590 by the on-axis multi-wavelength radiation beam 580.

In some aspects, the first layer 501A can be configured to receive, via the optic 550 and the optic 551, a third off-axis diffracted radiation beam 582A having a third wavelength and diffracted from the region 590 at a third diffraction angle. In some aspects, the first layer 501A can be configured to receive, via the optic 550 and the optic 551, a fourth off-axis diffracted radiation beam 582B having a fourth wavelength and diffracted from the region 590 at a fourth diffraction angle. In some aspects, the fourth wavelength can be equal to about the third wavelength, and a fourth magnitude of the fourth diffraction angle can be about equal to a third magnitude of the third diffraction angle. For example, the third off-axis diffracted radiation beam 582A can be indicative of "positive" first order diffraction at the third wavelength in response to the illumination of the region 590 by the on-axis multi-wavelength radiation beam 580, and the fourth off-axis diffracted radiation beam 582B can be indicative of "negative" first order diffraction at the third wavelength in response to the illumination of the region 590 by the on-axis multi-wavelength radiation beam 580.

In some aspects, the first layer 501A can be configured to receive, via the optic 550 and the optic 551, a fifth off-axis diffracted radiation beam 583A having a fifth wavelength and diffracted from the region 590 at a fifth diffraction angle. In some aspects, the first layer 501A can be configured to receive, via the optic 550 and the optic 551, a sixth off-axis diffracted radiation beam 583B having a sixth wavelength and diffracted from the region 590 at a sixth diffraction angle. In some aspects, the sixth wavelength can be equal to about the fifth wavelength, and a sixth magnitude of the sixth diffraction angle can be about equal to a fifth magnitude of the fifth diffraction angle. For example, the fifth off-axis diffracted radiation beam 583A can be indicative of "positive" first order diffraction at the fifth wavelength in response to the illumination of the region 590 by the on-axis multi-wavelength radiation beam 580, and the sixth off-axis diffracted radiation beam 583B can be indicative of "negative" first order diffraction at the fifth wavelength in response to the illumination of the region 590 by the on-axis multi-wavelength radiation beam 580.

In some aspects, each of the first diffraction angle, the second diffraction angle, the third diffraction angle, the fourth diffraction angle, the fifth diffraction angle, and the sixth diffraction angle can be defined relative to the surface normal of the surface of the substrate 592. In some aspects, the on-axis multi-wavelength radiation beam 580 can be substantially coincident with the surface normal (e.g., the angle between the on-axis multi-wavelength radiation beam 580 and the surface normal can be about zero). In other aspects, the on-axis multi-wavelength radiation beam 580 can be non-coincident with the surface normal (e.g., the angle between the on-axis multi-wavelength radiation beam 580 and the surface normal can be non-zero).

In some aspects, the first layer 501A can be further configured to modulate the received plurality of diffracted radiation beams based on a phase grating 502 to generate modulated photons and transmit the modulated photons through the second layer 501B to an optical coupler 540. In some aspects, the first layer 501A can be, or include, an AOTF configured to generate the phase grating 502 that can substantially mimic the alignment mark pitch of the alignment grating structure 594. In some aspects, the AOTF can include a piezoelectric transducer that is fabricated on, or bonded to, a birefringent crystal layer (e.g., tellurium dioxide (TeO2), lithium niobate (LiNbO3), silicon dioxide (SiO2), or any other suitable material) to generate ultrasonic waves (e.g., SAWs) that periodically modulate the refractive index of the birefringent crystal layer. In some aspects, the AOTF can include, or be integrated with, an AOTF controller (e.g., a SAW transducer) configured to modulate the wavelength of diffracted radiation by varying the SAW frequency to change the period of the phase grating 502. In some aspects, the AOTF controller can be further configured to modulate the amplitude (e.g., intensity) of diffracted radiation by varying the SAW amplitude.

In some aspects, the second layer 501B of the detection system can be an optical transmission layer configured to receive the modulated photons from the first layer 501A and transmit the received photons to the optical coupler 540. In some aspects, the second layer 501B can be, or include, a material that is substantially optically transparent (e.g., having a transmission spectrum with maximum intensities) at the wavelengths of the modulated photons received from the first layer 501A. In some aspects, the second layer 501B can include a vacuum medium, a gaseous medium, a liquid medium, a solid medium, or a combination thereof.

In some aspects, the third layer 501C of the detection system can be an optical coupling layer configured to receive, via the optical coupler 540, photons from the second layer 501B and transmit the received photons to another portion of the detection system (e.g., an imaging device, a multimode waveguide, a multimode dispersion waveguide structure, a multimode optical fiber, or any other suitable structure or component). In some aspects, the optical coupler 540 can be disposed on a surface of the third layer 501C. In some aspects, the optical coupler 540 can be, or include, an elephant coupler, any other suitable optical coupler, or any combination thereof. As used herein, the term "elephant coupler" refers to a micro-scale optical coupler having low loss and low wavelength dependence for vertical interconnection in integrated optics (e.g., silicon photonics), such as a low-loss, wide-band surface fiber coupling technology with vertically-bent silicon waveguide.

In some aspects, the example substrate alignment sensing system 500 can be configured to receive photons via the optical coupler 540 and generate an electronic signal based on the received photons. In some aspects, the example substrate alignment sensing system 500 can be configured to generate an electronic signal based on the first off-axis diffracted radiation beam 581A, the second off-axis diffracted radiation beam 581B, the third off-axis diffracted radiation beam 582A, the fourth off-axis diffracted radiation beam 582B, the fifth off-axis diffracted radiation beam 583A, the sixth off-axis diffracted radiation beam 583B, or any portion, modification, or combination thereof. In some aspects, the electronic signal can include a first sub-signal indicative of a first phase difference between the first off-axis diffracted radiation beam 581A and the second off-axis diffracted radiation beam 581B. In some aspects, the electronic signal can further include a second sub-signal indicative of a second phase difference between the third off-axis diffracted radiation beam 582A and the fourth off-axis diffracted radiation beam 582B. In some aspects, the electronic signal can further include a third sub-signal indicative of a third phase difference between the fifth off-axis diffracted radiation beam 583A and the sixth off-axis diffracted radiation beam 583B. In some aspects, the example substrate alignment sensing system 500 can be further configured to determine an alignment position of the alignment grating structure 594 based on the electronic signal or any portion (e.g., sub-signal) or combination of portions thereof.

Figure 5B:
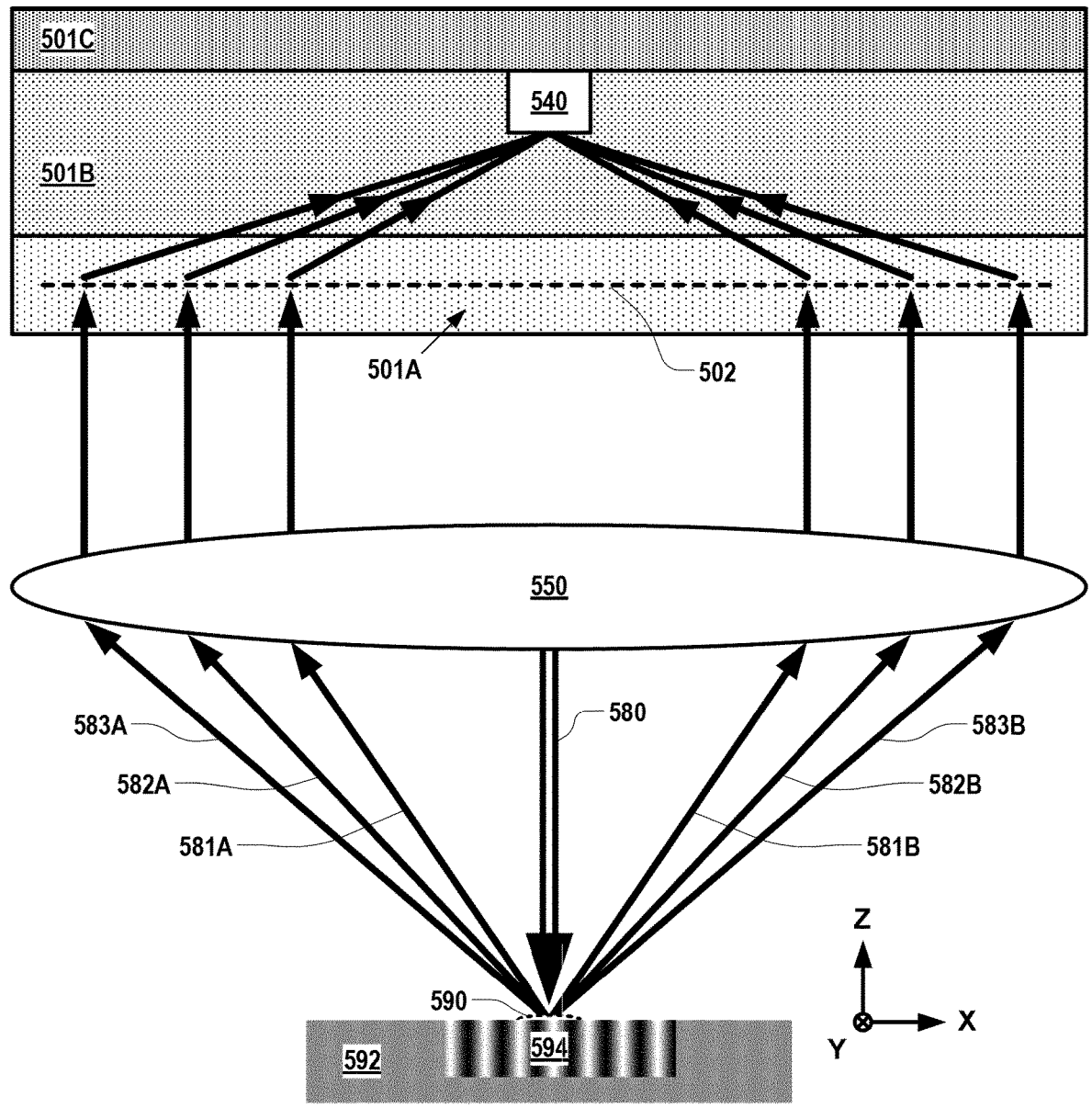

FIG. 5B is a schematic illustration of an example substrate alignment sensing system 500' that can be implemented according to an alternative configuration of the example substrate alignment sensing system 500 shown in FIG. 5A. For example, example substrate alignment sensing system 500' can be implemented without the optic 551; instead, the phase grating 502 can be configured to redirect the plurality of diffracted radiation beams toward the optical coupler 540.

As shown in FIG. 6A, the example substrate alignment sensing system 600 can include an integrated optical device (e.g., a single-chip SiN-based system) that can include an integrated optical device substrate 601, an on-axis illumination subsystem coupled to an optic 650 (e.g., a microlens structure). The example substrate alignment sensing system 600 can further include a detection system that includes a plurality of off-axis detection subsystems coupled to an example multimode dispersion waveguide structure 640 via a plurality of optical path structures. In some aspects, the plurality of off-axis detection subsystems can include a first off-axis detection subsystem 602A coupled to a first input of the example multimode dispersion waveguide structure 640 via a first optical path structure 632A, a second off-axis detection subsystem 602B coupled to a second input of the example multimode dispersion waveguide structure 640 via a second optical path structure 632B, any other suitable off-axis detection subsystem (e.g., tens or hundreds of off-axis detection subsystems), or any combination thereof.

In some aspects, the example substrate alignment sensing system 600 can include an integrated optical device fabricated on the integrated optical device substrate 601. In some aspects, the integrated optical device can include the on-axis illumination subsystem, the optic 650, the plurality of off-axis detection subsystems, the example multimode dispersion waveguide structure 640, the plurality of optical path structures, any other suitable component, or any combination thereof. In some aspects, the example substrate alignment sensing system 600, the on-axis illumination subsystem, the detection system, the plurality of off-axis detection subsystems, the example multimode dispersion waveguide structure 640, or a combination thereof can include, or be in communication with, a substrate alignment sensing controller configured to perform the functions and operations described herein.

In some aspects, the example substrate alignment sensing system 600, or any portion thereof, can be implemented using any of the structures, components, features, or techniques described with reference to the example substrate alignment sensing system 400 described with reference to FIG. 4; the example substrate alignment sensing systems 500 and 500' described with reference to FIGS. 5A and 5B; the example substrate alignment sensing system 700 described with reference to FIG. 7; the example substrate alignment sensing system 800 described with reference to FIG. 8; the example substrate alignment sensing system 1000 described with reference to FIG. 10; the example substrate alignment sensing system 1100 described with reference to FIGS. 11A, 11B, 11C, 11D, 11E, and 11F; the example computing system 1300 described with reference to FIG. 13; any other suitable structure, component, feature, or technique; any portion thereof; or any combination thereof.

In some aspects, the on-axis illumination subsystem can be configured to generate an on-axis multi-wavelength radiation beam 680. In other aspects, the on-axis illumination subsystem 660 can be configured to receive the on-axis multi-wavelength radiation beam 680 from a source illumination subsystem. In some aspects, the on-axis illumination subsystem 660 can be further configured to transmit the on-axis multi-wavelength radiation beam 680 through the optic 650 toward a region 690 of a surface of a substrate 692. In some aspects, the region 690 can include a portion of an alignment grating structure 694. In some aspects, the optic 650 can be defined by an aperture (e.g., a hole) etched through the integrated optical device substrate 601. In other aspects, such as where the integrated optical device substrate 601 comprises SiN on a glass substrate (e.g., glass, borosilicate glass, quartz, etc.), the optic 650 can be defined by an aperture etched through the SiN layer but not the dielectric substrate.

In some aspects, each of the plurality of off-axis detection subsystems can be configured to receive one or more off-axis diffracted radiation beams (e.g., indicative of positive or negative first order diffraction at one or more wavelength sub-bands) from the region 690 of the surface of the substrate 692 in response to an illumination (e.g., irradiation) of the region 690 by the on-axis multi-wavelength radiation beam 680.

In some aspects, the first off-axis detection subsystem 602A can be configured to collect a first off-axis diffracted radiation beam 682A including diffracted radiation at one or more first wavelengths from the region 690 at about a first off-axis diffraction angle 672A. In some aspects, the second off-axis detection subsystem 602B can be configured to collect a second off-axis diffracted radiation beam 682B including diffracted radiation at one or more second wavelengths from the region 690 at about a second off-axis diffraction angle 672B. In some aspects, the one or more second wavelengths included in the second off-axis diffracted radiation beam 682B can be substantially the same as, or different from, the one or more first wavelengths included in the first off-axis diffracted radiation beam 682A. For example, the first off-axis diffracted radiation beam 682A can be indicative of "positive" first order diffraction at a first set of wavelengths (e.g., blue, green, and red) in response to the illumination of the region 690 by the on-axis multi-wavelength radiation beam 680, and the second off-axis diffracted radiation beam 682B can be indicative of "negative" first order diffraction at a second set of wavelengths (e.g., substantially similar to the first set of wavelengths) in response to the illumination of the region 690 by the on-axis multi-wavelength radiation beam 680.

In some aspects, each of the first off-axis diffraction angle 672A and the second off-axis diffraction angle 672B can be defined relative to the surface normal of the surface of the substrate 692. In some aspects, the on-axis multi-wavelength radiation beam 680 can be coincident with the surface normal (e.g., the angle between the on-axis multi-wavelength radiation beam 680 and the surface normal can be about zero). In other aspects, the on-axis multi-wavelength radiation beam 680 can be non-coincident with the surface normal (e.g., the angle between the on-axis multi-wavelength radiation beam 680 and the surface normal can be non-zero).

In some aspects, each of the first off-axis detection subsystem 602A and the second off-axis detection subsystem 602B can be, or include, an optical coupler having a multi-period, multi-level, or chirped grating (e.g., a multi-period grating with chirp in between peak locations; a multi-level grating with different periods) for wide-wavelength coupling at a particular off-axis diffraction angle. For example, each of the first off-axis detection subsystem 602A and the second off-axis detection subsystem 602B can include an optical coupler that can receive different wavelength sub-bands at different parts of the grating and transmit the received photons to the example multimode dispersion waveguide structure 640 via a respective optical path structure. Optionally, in some aspects, the grating can be coupled to an optic such as a wedge lens or a prism configured to redirect different wavelength sub-bands of a diffracted radiation beam toward different portions of the grating. Optionally, in some aspects, the example substrate alignment sensing system 600 can compensate for period change by changing the distance between the integrated optical device substrate 601 and the first off-axis detection subsystem 602A, the second off-axis detection subsystem 602B, or both.

In one example, the first off-axis detection subsystem 602A can include a first optical coupler configured to receive photons in a plurality of different wavelength sub-bands from the first off-axis diffracted radiation beam 682A and transmit the received photons to a first input channel of the example multimode dispersion waveguide structure 640 via the first optical path structure 632A. In another example, the second off-axis detection subsystem 602B can include a second optical coupler configured to receive photons in a plurality of different wavelength sub-bands from the second off-axis diffracted radiation beam 682B and transmit the received photons to a second input channel of the example multimode dispersion waveguide structure 640 via the second optical path structure 632B. In some aspects, the example multimode dispersion waveguide structure 640 can include one or more output channels coupled to one or more sensors (e.g., photodetectors, interferometers, etc.).

In some aspects, the example substrate alignment sensing system 600 can be further configured to generate an electronic signal based on the first off-axis diffracted radiation beam 682A, the second off-axis diffracted radiation beam 682B, or a combination thereof. In some aspects, the electronic signal can include a plurality of sub-signals indicative of a plurality of phase differences between a first set of photons in the first off-axis diffracted radiation beam 682A and a second set of photons in the second off-axis diffracted radiation beam 682B. In some aspects, the example substrate alignment sensing system 600 can be further configured to determine an alignment position of the alignment grating structure 694 based on the electronic signal or any portion (e.g., sub-signal) or combination of portions thereof.

Figure 6B:
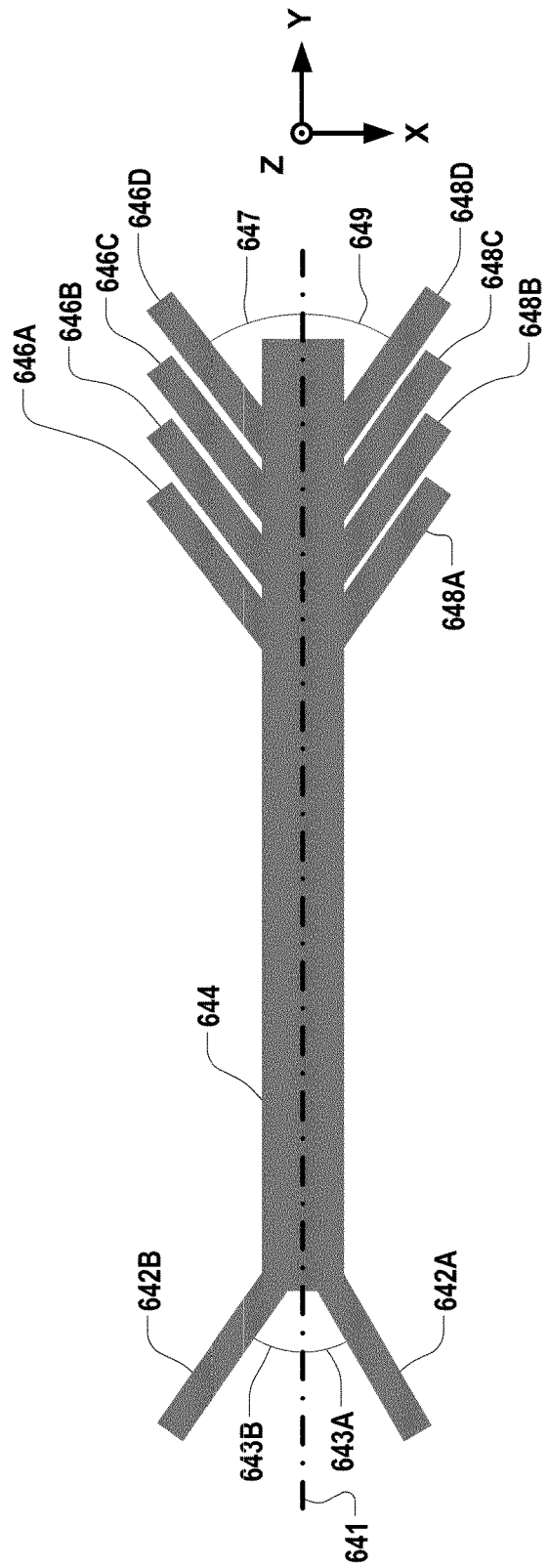
FIG. 6B is a schematic illustration an example multimode dispersion waveguide structure.

FIG. 6B is a schematic illustration of the example multimode dispersion waveguide structure 640 according to some aspects of the present disclosure. In some aspects, the example multimode dispersion waveguide structure 640 can be, or include, an angled multimode interferometer (AMMI) demultiplexer. As shown in FIG. 6B, the multimode dispersion waveguide structure can include a first input channel structure 642A, a second input channel structure 642B, a plurality of first output channel structures (e.g., output structure 646A, output structure 646B, output structure 646C, and output structure 646D), and a plurality of second output channel structures (e.g., output structure 648A, output structure 648B, output structure 646C, and output structure 648D). In some aspects, the first input channel structure 642A and the second input channel structure 642B can be configured to collect multiple sets of photons from multiple different diffracted radiation beams at multiple different wavelengths (e.g., 2, 4, 16, or hundreds of different wavelengths).

In some aspects, the first input channel structure 642A can be configured to collect a first set of photons at a first angle 643A from a longitudinal axis 641 of the example multimode dispersion waveguide structure 640. In some aspects, the first set of photons can be included in a first diffracted radiation beam indicative of "positive" first order diffraction from a region of a surface of a substrate that includes an alignment mark (e.g., an alignment diffraction grating or a portion thereof) in response to illumination of the region by a first radiation beam at a first wavelength, a first polarization, and a first incident angle.

In some aspects, the second input channel structure 642B can be configured to collect a second set of photons at a second angle 643B from the longitudinal axis 641. In some aspects, the second set of photons can be included in a second diffracted radiation beam indicative of "negative" first order diffraction from the region in response to illumination of the region by a second radiation beam at the first wavelength, a second polarization (e.g., the same as the first polarization or rotated by any suitable amount such as 90 degrees), and a second incident angle.

In some aspects, the first set of photons and the second set of photons can propagate through the channel structure 644. In some aspects, there can be a phase difference between the first set of photons and the second set of photons. In some aspects, the first set of photons and the second set of photons can constructively and destructively interfere with each other while propagating through the channel structure 644.

In some aspects, the plurality of first output channel structures can include output structure 646A, output structure 646B, output structure 646C, output structure 646D, any other suitable structure or component, or any combination thereof. In some aspects, the plurality of first output channel structures can be configured to output one or more first optical signals (e.g., difference signals) at a third angle 647 from the longitudinal axis 641. In some aspects, the wavelength output via output structure 646D can be greater than the wavelength output via output structure 646C; the wavelength output via output structure 646C can be greater than the wavelength output via output structure 646B; and the wavelength output via output structure 646B can be greater than the wavelength output via output structure 646A.

In some aspects, the plurality of second output channel structures can include output structure 648A, output structure 648B, output structure 648C, output structure 648D, any other suitable structure or component, or any combination thereof. In some aspects, the plurality of second output channel structures can be configured to output one or more second optical signals (e.g., summation signals) at a fourth angle 649 from the longitudinal axis 641. In some aspects, the wavelength output via output structure 648D can be greater than the wavelength output via output structure 648C; the wavelength output via output structure 648C can be greater than the wavelength output via output structure 648B; and the wavelength output via output structure 648B can be greater than the wavelength output via output structure 648A.

In some aspects, for a particular wavelength (e.g., the first wavelength), the phase difference between the first set of photons and the second set of photons can depend on the position of the alignment mark. In some aspects, depending on the phase difference, the example multimode dispersion waveguide structure 640 can output one or more optical signals from: one or more of the plurality of first output channel structures; or one or more of the plurality of second output channel structures. In one example, the example multimode dispersion waveguide structure 640 can be further configured to generate a first optical signal indicative of a difference between the first set of photons and the second set of photons and output the first optical signal from one of the plurality of first output channel structures to a first detector. In another example, the example multimode dispersion waveguide structure 640 can be further configured to generate a second optical signal indicative of a summation of the first set of photons and the second set of photons and output the second optical signal from one of the plurality of second output channel structures to a second detector (e.g., the same as, or different from, the first detector).

In some aspects where the alignment mark is continuously moving (e.g., at 1 period per second), the example multimode dispersion waveguide structure 640 can alternatively output optical signals from one or more of the plurality of first output channel structures and one or more of the plurality of second output channel structures (e.g., at 2 cycles per second). In such aspects, the detection system can be configured to detect intensity rather than the field itself.

Figure 6C:
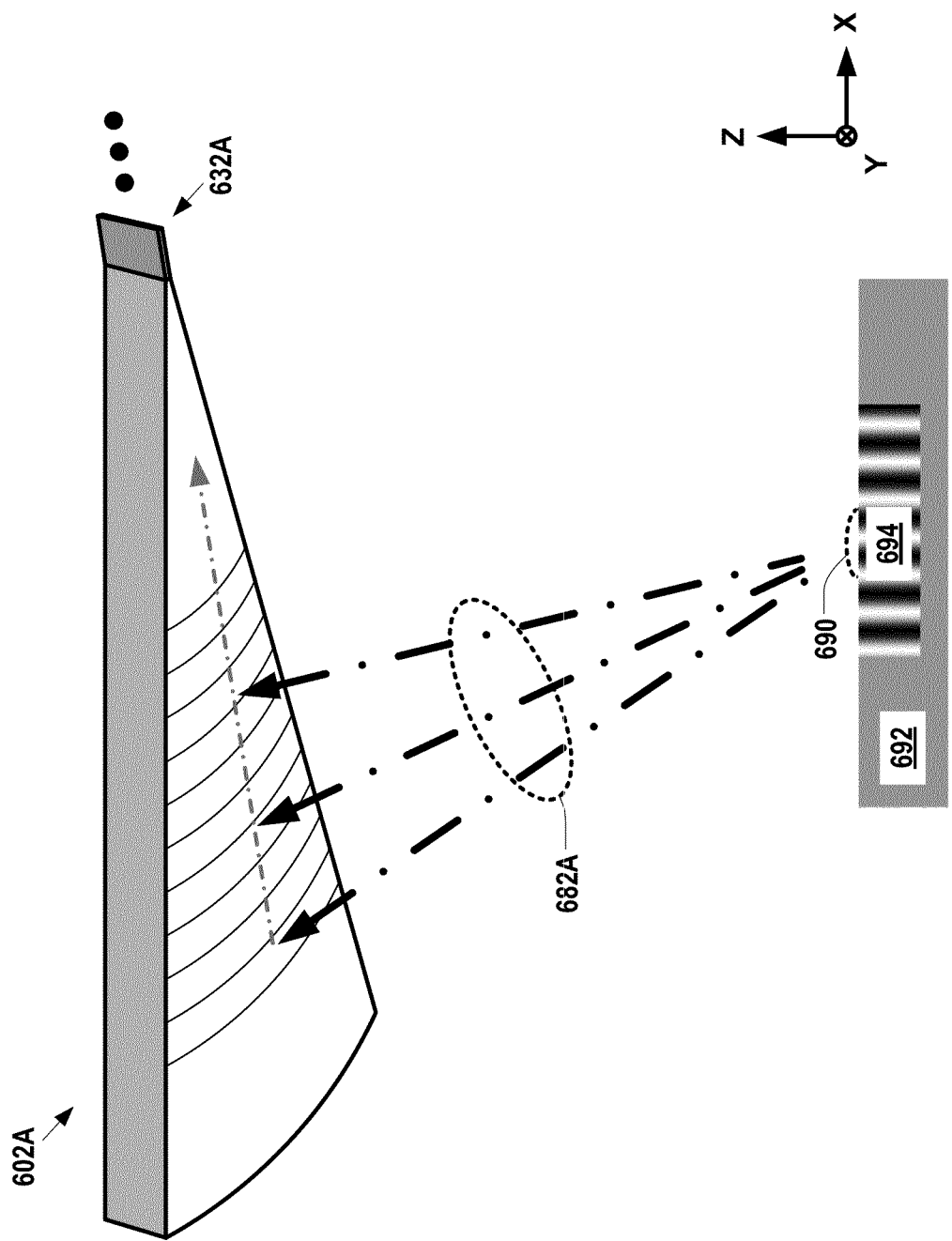
FIGS. 6C and 6D are schematic illustrations of example off-axis detection subsystems according to some aspects of the present disclosure.

FIG. 6C shows an example implementation of the first off-axis detection subsystem 602A and a portion of the first optical path structure 632A. In some aspects, the first off-axis detection subsystem 602A can be, or include, a multi-period grating coupler having chirp in between peak locations that can receive different wavelength sub-bands of the first off-axis diffracted radiation beam 682A (e.g., "positive" first order diffraction) at different parts of the multi-period grating coupler and transmit the received wavelength sub-bands to the example multimode dispersion waveguide structure 640 via the first optical path structure 632A.

In one example, the first off-axis detection subsystem 602A can include a first region having a first grating structure and configured to receive a first set of photons in a first wavelength sub-band of the first off-axis diffracted radiation beam 682A (e.g., "positive" first order diffraction at about a first wavelength) and transmit the received first set of photons to the first input channel structure 642A of the example multimode dispersion waveguide structure 640 via the first optical path structure 632A. In another example, the first off-axis detection subsystem 602A can include a second region having a second grating structure and configured to receive a second set of photons in a second wavelength sub-band of the first off-axis diffracted radiation beam 682A (e.g., "positive" first order diffraction at about a second wavelength) and transmit the received second set of photons to the first input channel structure 642A of the example multimode dispersion waveguide structure 640 via the first optical path structure 632A. In yet another example, the first off-axis detection subsystem 602A can include a third region having a third grating structure and configured to receive a third set of photons in a third wavelength sub-band of the first off-axis diffracted radiation beam 682A (e.g., "positive" first order diffraction at about a third wavelength) and transmit the received third set of photons to the first input channel structure 642A of the example multimode dispersion waveguide structure 640 via the first optical path structure 632A.

Figure 6D:
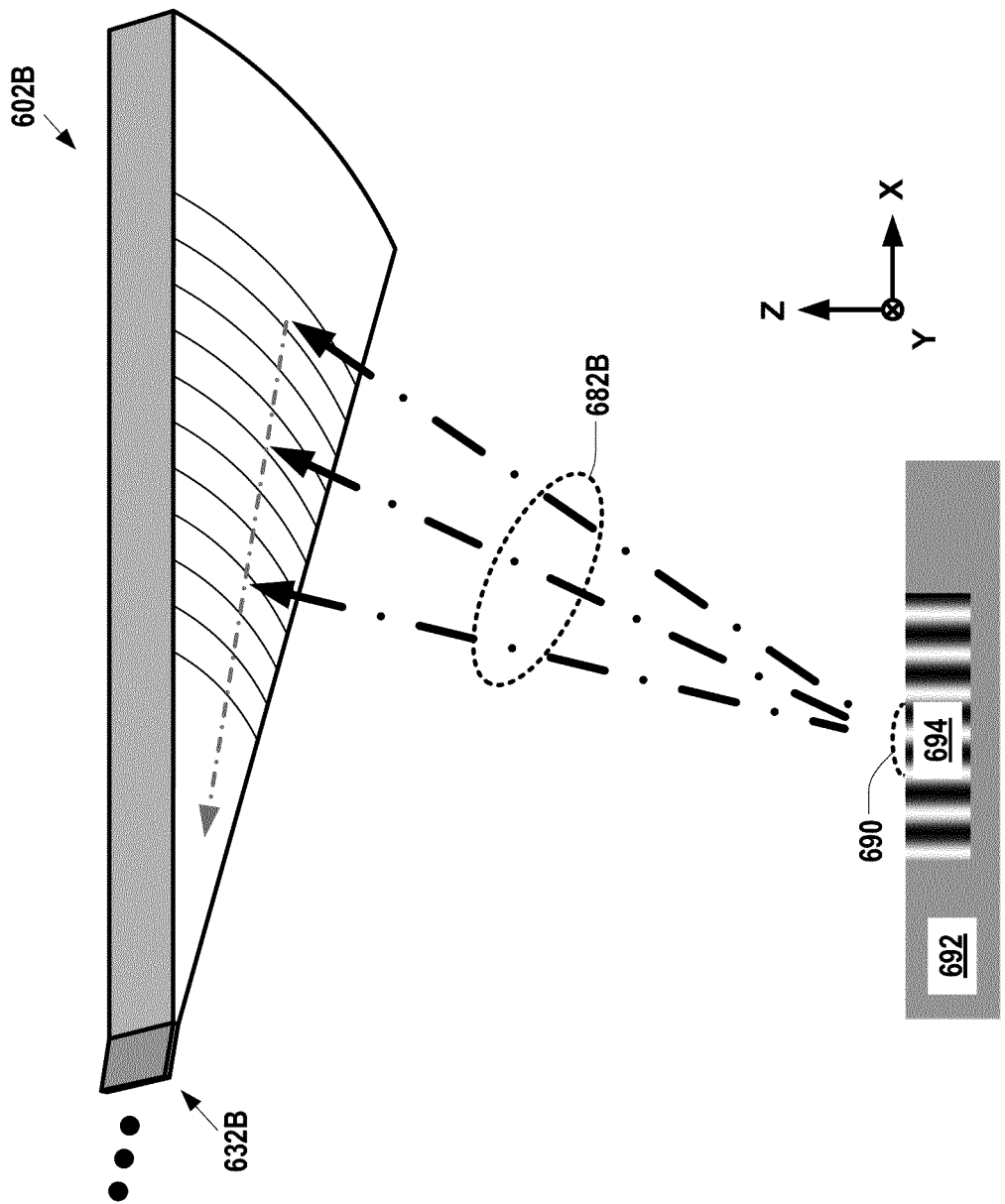

FIG. 6D shows an example implementation of the second off-axis detection subsystem 602B and a portion of the second optical path structure 632B. In some aspects, the second off-axis detection subsystem 602B can be, or include, a multi-period grating coupler having chirp in between peak locations that can receive different wavelength sub-bands of the second off-axis diffracted radiation beam 682B (e.g., "negative" first order diffraction) at different parts of the multi-period grating coupler and transmit the received wavelength sub-bands to the example multimode dispersion waveguide structure 640 via the second optical path structure 632B.

In one example, the second off-axis detection subsystem 602B can include a fourth region having a fourth grating structure and configured to receive a first set of photons in a fourth wavelength sub-band of the second off-axis diffracted radiation beam 682B (e.g., "negative" first order diffraction at about the first wavelength described with reference to FIG. 6C) and transmit the received fourth set of photons to the second input channel structure 642B of the example multimode dispersion waveguide structure 640 via the second optical path structure 632B. In another example, the second off-axis detection subsystem 602B can include a fifth region having a fifth grating structure and configured to receive a fifth set of photons in a fifth wavelength sub-band of the second off-axis diffracted radiation beam 682B (e.g., "negative" first order diffraction at about the second wavelength described with reference to FIG. 6C) and transmit the received fifth set of photons to the second input channel structure 642B of the example multimode dispersion waveguide structure 640 via the second optical path structure 632B. In yet another example, the second off-axis detection subsystem 602B can include a sixth region having a sixth grating structure and configured to receive a sixth set of photons in a sixth wavelength sub-band of the second off-axis diffracted radiation beam 682B (e.g., "negative" first order diffraction at about the third wavelength described with reference to FIG. 6C) and transmit the received sixth set of photons to the second input channel structure 642B of the example multimode dispersion waveguide structure 640 via the second optical path structure 632B.

Figure 7:
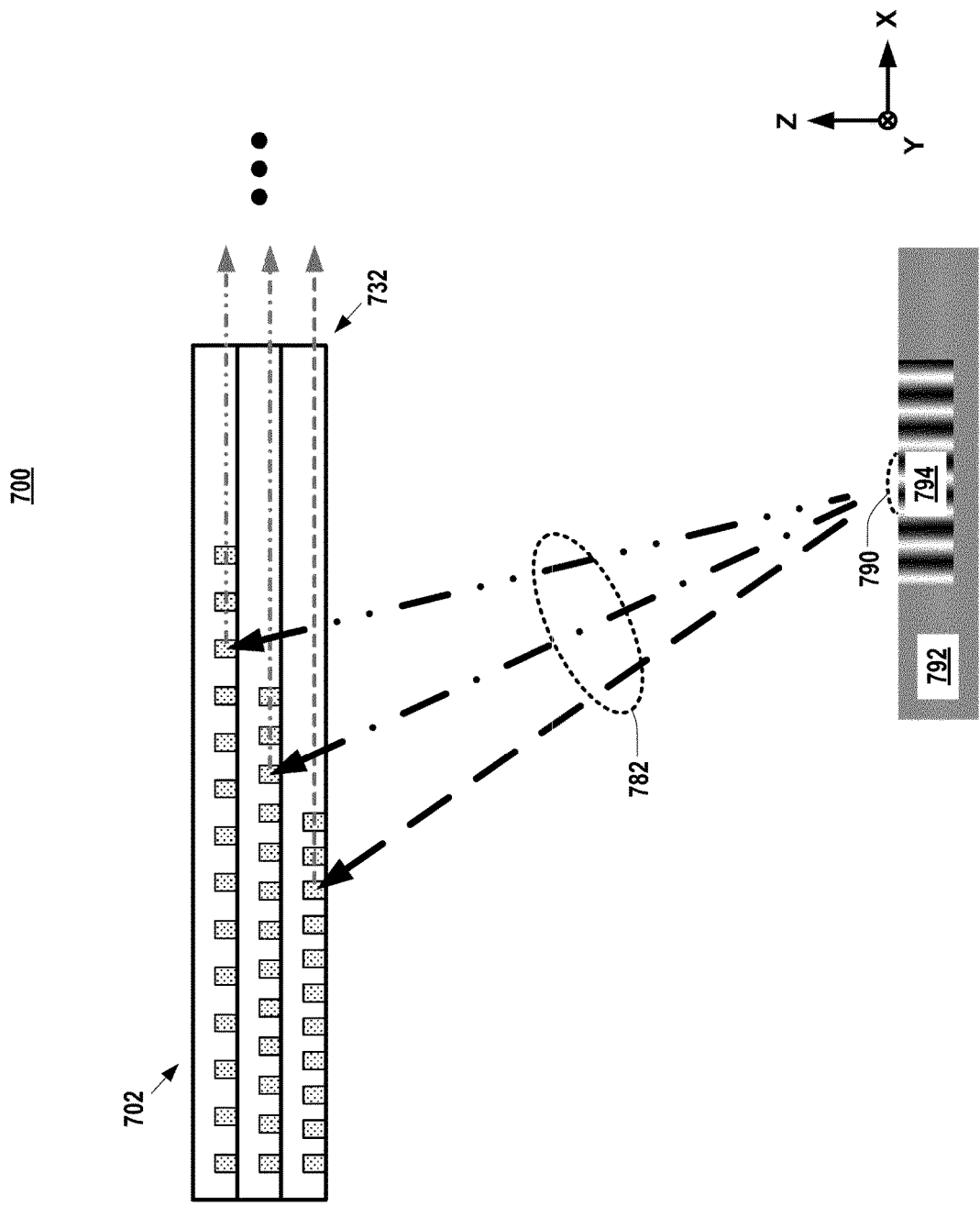
FIG. 7 is a schematic illustration of a portion of an example substrate alignment sensing system configured to utilize off-axis detection according to some aspects of the present disclosure.

FIG. 7 shows an example portion of an example detection system of an example substrate alignment sensing system 700 that can include an integrated optical device (e.g., a single-chip SiN-based system) including, among other components and structures, an example implementation of an example off-axis detection subsystem 702 and a portion of an optical path structure 732.

In some aspects, the example substrate alignment sensing system 700, or any portion thereof, can be implemented using any of the structures, components, features, or techniques described with reference to the example substrate alignment sensing system 400 described with reference to FIG. 4; the example substrate alignment sensing systems 500 and 500' described with reference to FIGS. 5A and 5B; the example substrate alignment sensing system 600 described with reference to FIGS. 6A, 6B, 6C, and 6D; the example substrate alignment sensing system 800 described with reference to FIG. 8; the example substrate alignment sensing system 1000 described with reference to FIG. 10; the example substrate alignment sensing system 1100 described with reference to FIGS. 11A, 11B, 11C, 11D, 11E, and 11F; the example computing system 1300 described with reference to FIG. 13; any other suitable structure, component, feature, or technique; any portion thereof; or any combination thereof.

In some aspects, the example off-axis detection subsystem 702 can be configured to receive a plurality of wavelength sub-bands of an off-axis diffracted radiation beam 782 from a region 790 of a surface of a substrate 792 in response to an illumination (e.g., irradiation) of the region 790 by a multi-wavelength radiation beam (e.g., an on-axis multi-wavelength radiation beam). In some aspects, the region 790 can include a portion of an alignment grating structure 794. The off-axis diffracted radiation beam 782 can be indicative of positive or negative first order diffraction and include multi-wavelength radiation at a plurality of different wavelength sub-bands.

In some aspects, the example off-axis detection subsystem 702 can be, or include, a multi-level grating coupler having different grating structures (e.g., chirped grating structures) in different layers that can receive different wavelength sub-bands of the off-axis diffracted radiation beam 782 at different parts of the multi-level grating coupler and transmit the received wavelength sub-bands to another portion of the detection system (e.g., a detector; an input of an optical coupler or a multimode dispersion waveguide structure, or a plurality of inputs thereof where each input is configured to receive a respective wavelength sub-band; an optic such as a lens or mirror; free-space; or any other suitable portion of the detection system) via the optical path structure 732.

In one example, the example off-axis detection subsystem 702 can include a first layer having a first grating structure and configured to receive a first set of photons in a first wavelength sub-band of the off-axis diffracted radiation beam 782 and transmit the received first set of photons to another portion of the detection system via a first portion of the optical path structure 732. In another example, the example off-axis detection subsystem 702 can include a second layer having a second grating structure and configured to receive a second set of photons in a second wavelength sub-band of the off-axis diffracted radiation beam 782 and transmit the received second set of photons to another portion of the detection system via a second portion of the optical path structure 732. In yet another example, the example off-axis detection subsystem 702 can include a third layer having a third grating structure and configured to receive a third set of photons in a third wavelength sub-band of the off-axis diffracted radiation beam 782 and transmit the received third set of photons to another portion of the detection system via a third portion of the optical path structure 732.

Figure 8:
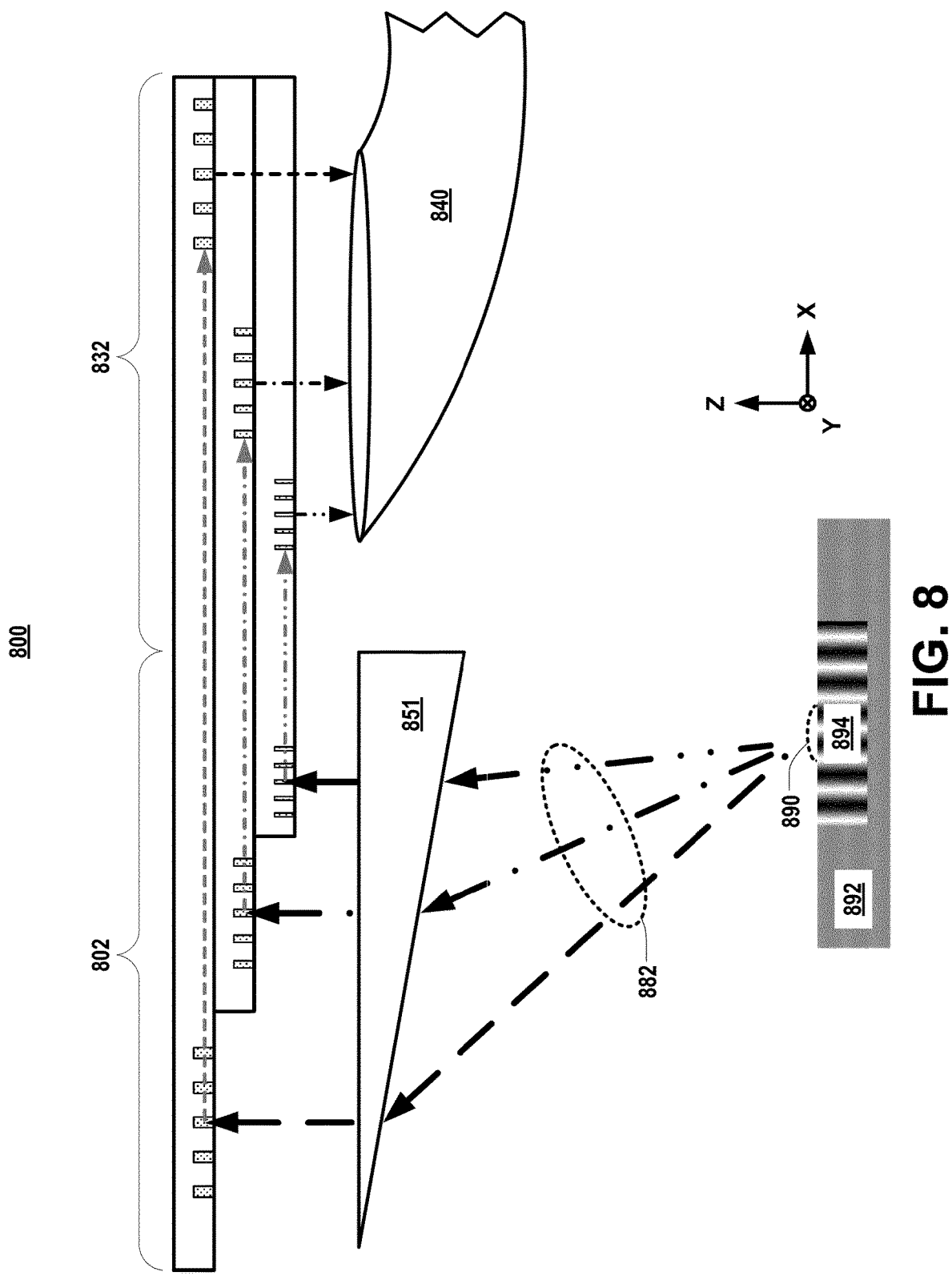
FIG. 8 is a schematic illustration of a portion of another example substrate alignment sensing system configured to utilize off-axis detection according to some aspects of the present disclosure.

FIG. 8 shows an example portion of an example detection system of an example substrate alignment sensing system 800 that can include an integrated optical device (e.g., a single-chip SiN-based system) including, among other components and structures, an example implementation of an example off-axis detection subsystem 802 and an example optical path structure 832. In some aspects, the example off-axis detection subsystem 802 can be coupled to an optic 851 (e.g., a wedge lens, a prism) configured to redirect different wavelength sub-bands of the diffracted radiation beam 882 toward different portions of the example off-axis detection subsystem 802.

In some aspects, the example substrate alignment sensing system 800, or any portion thereof, can be implemented using any of the structures, components, features, or techniques described with reference to the example substrate alignment sensing system 400 described with reference to FIG. 4; the example substrate alignment sensing systems 500 and 500' described with reference to FIGS. 5A and 5B; the example substrate alignment sensing system 600 described with reference to FIGS. 6A, 6B, 6C, and 6D; the example substrate alignment sensing system 800 described with reference to FIG. 8; the example substrate alignment sensing system 1000 described with reference to FIG. 10; the example substrate alignment sensing system 1100 described with reference to FIGS. 11A, 11B, 11C, 11D, 11E, and 11F; the example computing system 1300 described with reference to FIG. 13; any other suitable structure, component, feature, or technique; any portion thereof; or any combination thereof.

In some aspects, the example off-axis detection subsystem 802 can be configured to receive, via the optic 851, a plurality of wavelength sub-bands an off-axis diffracted radiation beam 882 from a region 890 of a surface of a substrate 892 in response to an illumination (e.g., irradiation) of the region 890 by a multi-wavelength radiation beam (e.g., an on-axis multi-wavelength radiation beam; an on-axis multi-wavelength radiation beam having an off-axis incident angle of, e.g., 70 degrees). In some aspects, the region 890 can include a portion of an alignment grating structure 894. The off-axis diffracted radiation beam 882 can be indicative of positive or negative first order diffraction and include multi-wavelength radiation at a plurality of different wavelength sub-bands.

In some aspects, the example off-axis detection subsystem 802 can be, or include, a multi-level grating coupler having different grating structures (e.g., chirped grating structures) in different layers that can receive, via the optic 851, different wavelength sub-bands of the off-axis diffracted radiation beam 882 at different parts of the multi-level grating coupler and transmit the received wavelength sub-bands to an example optical coupler 840 (e.g., a wideband grating coupler; a multimode dispersion waveguide structure; an elephant coupler; a multi-mode optical fiber; or any other suitable optical coupler) of the example detection system via the example optical path structure 832.

In one example, the example off-axis detection subsystem 802 can include a first layer having a first grating structure and a second grating structure. The first grating structure can be configured to receive, via a first portion of the optic 851, a first set of photons in a first wavelength sub-band of the off-axis diffracted radiation beam 882. The received first set of photons can propagate through first layer to the second grating structure. The second grating structure can be configured to transmit (e.g., emit) the first set of photons to the example optical coupler 840.

In another example, the example off-axis detection subsystem 802 can include a second layer having a third grating structure and a fourth grating structure. The third grating structure can be configured to receive, via a second portion of the optic 851, a second set of photons in a second wavelength sub-band of the off-axis diffracted radiation beam 882. The received second set of photons can propagate through the second layer to the fourth grating structure. The fourth grating structure can be configured to transmit the second set of photons to the example optical coupler 840.

In yet another example, the example off-axis detection subsystem 802 can include a third layer having a fifth grating structure and a sixth grating structure. The fifth grating structure can be configured to receive, via a third portion of the optic 851, a third set of photons in a third wavelength sub-band of the off-axis diffracted radiation beam 882. The received third set of photons can propagate through the third layer to the sixth grating structure. The sixth grating structure can be configured to transmit the third set of photons to the example optical coupler 840.

Figure 9:
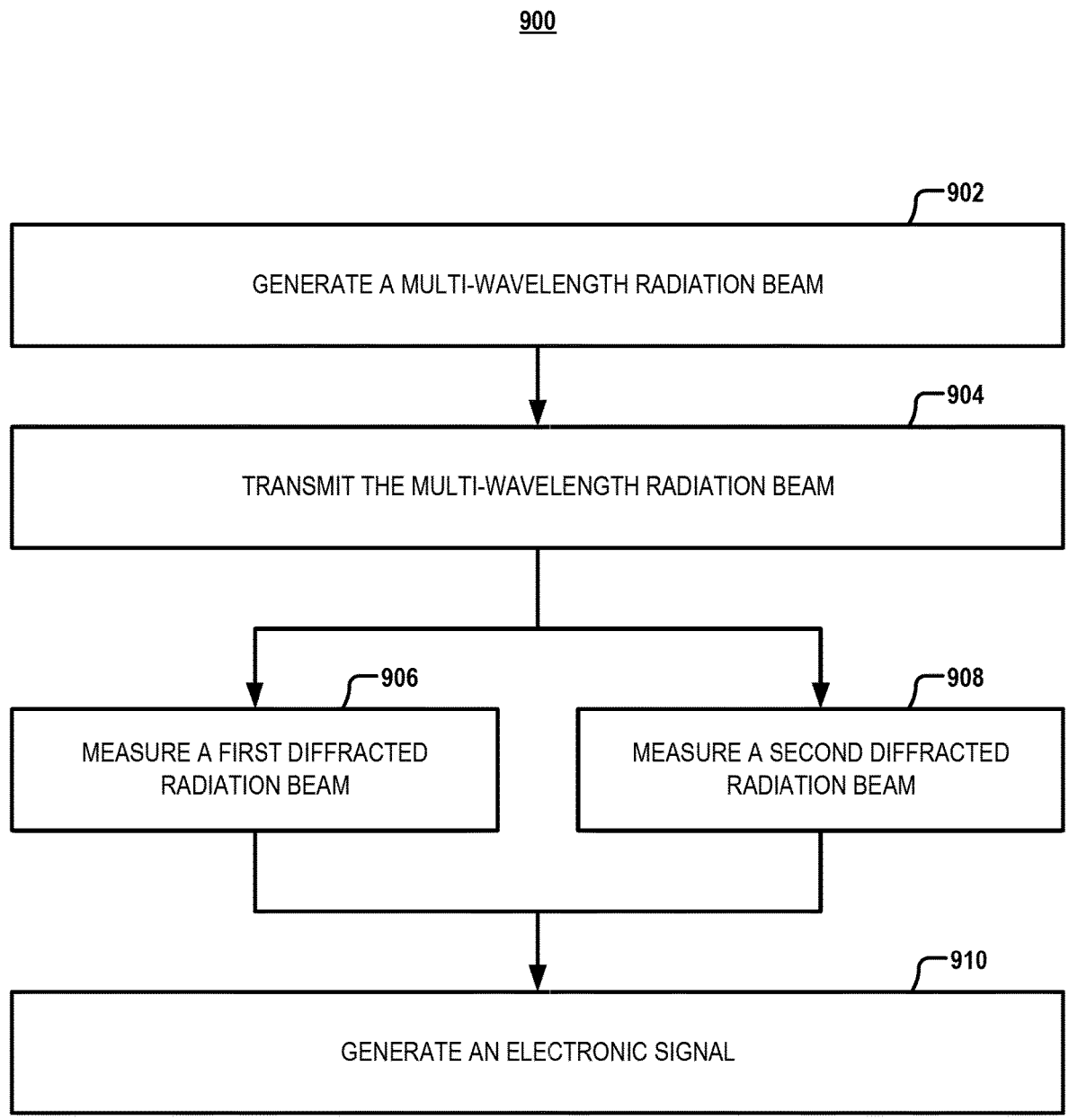
FIG. 9 is an example method for determining the alignment of a substrate utilizing on-axis illumination and off-axis detection according to some aspects of the present disclosure or portion(s) thereof.

Example Process for Aligning a Substrate Using On-Axis Illumination and Off-Axis Detection FIG. 9 is an example method 900 for determining the alignment of a substrate using on-axis illumination and off-axis detection according to some aspects of the present disclosure or portion(s) thereof. The operations described with reference to the example method 900 can be performed by, or according to, any of the systems, apparatuses, components, structures, features, techniques, or combinations thereof described herein, such as those described with reference to FIGS. 1-8 above and FIGS. 10-13 below.

At operation 902, the method can include generating, by an illumination system (e.g., by an on-axis illumination subsystem), a multi-wavelength radiation beam that includes a first wavelength and a second wavelength. In some aspects, the multi-wavelength radiation beam can include one of the on-axis multi-wavelength radiation beams 480, 580, 680, or any other suitable radiation beam. In some aspects, the generation of the multi-wavelength radiation beam can be accomplished using suitable mechanical or other methods and include generating the multi-wavelength radiation beam in accordance with any aspect or combination of aspects described with reference to FIGS. 1-8 above and FIGS. 10-13 below.

At operation 904, the method can include transmitting, by the illumination system, the multi-wavelength radiation beam toward a region (e.g., region 490, 590, 690, 790, 890) of a surface of a substrate (e.g., substrate 492, 592, 692, 792, 892) at an incident angle that is substantially coincident with the surface normal of the surface of the substrate (e.g., substantially perpendicular to the surface of the substrate). In some aspects, the transmission of the multi-wavelength radiation beam can be accomplished using suitable mechanical or other methods and include transmitting the multi-wavelength radiation beam in accordance with any aspect or combination of aspects described with reference to FIGS. 1-8 above and FIGS. 10-13 below.

At operation 906, the method can include measuring, by a detection system (e.g., by a first off-axis detection subsystem), a first diffracted radiation beam. In some aspects, the first diffracted radiation beam can include a first set of photons at the first wavelength and diffracted from the region of the surface of the substrate in response to an illumination (e.g., irradiation) of the region by the multi-wavelength radiation beam. In some aspects, the first diffracted radiation beam can include one of the off-axis diffracted radiation beams 482A, 482B, 484A, 484B, 581A, 581B, 582A, 582B, 583A, 583B, 682A, 682B, 782, and 882, or any other suitable diffracted radiation beam (e.g., zeroth order, +/− first order, +/− second order, and so forth). In some aspects, the measurement of the first diffracted radiation beam can be accomplished using suitable mechanical or other methods and include measuring the first diffracted radiation beam in accordance with any aspect or combination of aspects described with reference to FIGS. 1-8 above and FIGS. 10-13 below.

At operation 908, the method can include measuring, by the detection system (e.g., by a second off-axis detection subsystem), a second diffracted radiation beam. In some aspects, the second diffracted radiation beam can include a second set of photons at the second wavelength and diffracted from the region of the surface of the substrate in response to the illumination of the region by the multi-wavelength radiation beam. In some aspects, the second diffracted radiation beam can include another of the off-axis diffracted radiation beams 482A, 482B, 484A, 484B, 581A, 581B, 582A, 582B, 583A, 583B, 682A, 682B, 782, and 882, or any other suitable diffracted radiation beam. In some aspects, the measurement of the second diffracted radiation beam can be accomplished using suitable mechanical or other methods and include measuring the second diffracted radiation beam in accordance with any aspect or combination of aspects described with reference to FIGS. 1-8 above and FIGS. 10-13 below.

At operation 910, the method can include generating, by the detection system, an electronic signal based on the measured first set of photons and the measured second set of photons. In some aspects, the electronic signal can be indicative of a phase difference between the first set of photons and the second set of photons. In some aspects, the electronic signal can be indicative of an alignment of the surface of the substrate. In some aspects, the generation of the electronic signal can be accomplished using suitable mechanical or other methods and include generating the electronic signal in accordance with any aspect or combination of aspects described with reference to FIGS. 1-8 above and FIGS. 10-13 below.

Example Substrate Alignment Sensing Systems Having Off-Axis Illumination and On-Axis Detection In some aspects, the present disclosure describes a system that can include a first off-axis illumination system, a second off-axis illumination system, and an on-axis detection system. In some aspects, the first off-axis illumination system, the second off-axis illumination system, and the on-axis detection system can be included in an integrated optical device.

The first off-axis illumination system can be configured to generate a first off-axis radiation beam (e.g., a first off-axis coherent radiation beam) at a first wavelength. The first off-axis illumination system can be further configured to transmit the first off-axis radiation beam to a region of a surface of a substrate at a first incident angle. In some aspects, an area of the region of the surface of the substrate is about 1.0 square millimeter. For example, a diameter of the region of the surface of the substrate can be about 35 micrometers (microns). In some aspects, the region of the surface of the substrate can include a portion of an alignment grating structure.

The second off-axis illumination system can be configured to generate a second off-axis radiation beam (e.g., a second off-axis coherent radiation beam) at a second wavelength. The second off-axis illumination system can be further configured to transmit the second off-axis radiation beam to the region of the surface of the substrate at a second incident angle. In some aspects, the second wavelength can be equal to about the first wavelength. In some aspects, the second wavelength can be different from the first wavelength. In some aspects, a first magnitude of the first incident angle can be equal to about a second magnitude of the second incident angle. For example, the first incident angle can be about +5.0 degrees from the surface normal of the surface of the substrate under measurement, and the second incident angle can be about −5.0 degrees from the surface normal. In some aspects, the second incident angle can be different from the first incident angle. For example, the first incident angle can be about +5.0 degrees from the surface normal of the surface of the substrate under measurement, and the second incident angle can be about +7.5 degrees from the surface normal. In another example, the first incident angle can be about +5.0 degrees from the surface normal of the surface of the substrate under measurement, and the second incident angle can be about −7.5 degrees from the surface normal.

The on-axis detection system can be configured to receive a first on-axis diffracted radiation beam that includes a first set of photons diffracted from the region of the surface of the substrate in response to a first off-axis illumination of the region by the first off-axis radiation beam. In some aspects, the first set of photons included in the first on-axis diffracted radiation beam can be indicative of first order diffraction in response to the first off-axis illumination of the region by the first off-axis radiation beam.

The on-axis detection system can be further configured to receive a second on-axis diffracted radiation beam that includes a second set of photons diffracted from the region of the surface of the substrate in response to a second off-axis illumination of the region by the second off-axis radiation beam. In some aspects, the second set of photons included in the second on-axis diffracted radiation beam can be indicative of first order diffraction in response to the second off-axis illumination of the region by the second off-axis radiation beam.

The on-axis detection system can be further configured to generate an electronic signal based on the first set of photons and the second set of photons. In some aspects, the electronic signal can be indicative of a phase difference between the first set of photons and the second set of photons. In some aspects, the on-axis detection system can be further configured to determine an alignment position of the alignment grating structure based on the electronic signal.

In some aspects, the on-axis detection system can include an optic configured to collect the first on-axis diffracted radiation beam from the region of the surface of the substrate at a first diffraction angle. In some aspects, the first on-axis diffracted radiation beam can be indicative of first order diffraction in response to the first off-axis illumination of the region by the first off-axis radiation beam. In some aspects, the optic can be further configured to collect the second on-axis diffracted radiation beam from the region of the surface of the substrate at a second diffraction angle. In some aspects, the second on-axis diffracted radiation beam can be indicative of first order diffraction in response to the second off-axis illumination of the region by the second off-axis radiation beam. In some aspects, the second diffraction angle can be equal to about the first diffraction angle. In some aspects, the optic can include a microlens structure.

In some aspects, the system can further include a coupler (e.g., a MEMS-based optical coupler) configured to receive a multi-wavelength radiation beam from a source illumination subsystem via an optical fiber (e.g., a polarization maintaining (PM) fiber). In some aspects, the coupler can be further configured to transmit a first portion of the multi-wavelength radiation beam to the first off-axis illumination system. In some aspects, the coupler can be further configured to transmit a second portion of the multi-wavelength radiation beam to the second off-axis illumination system. In some aspects, the first off-axis illumination system can be further configured to receive the first portion of the multi-wavelength radiation beam and generate the first off-axis radiation beam based on the first portion of the multi-wavelength radiation beam. In some aspects, the second off-axis illumination system can be further configured to receive the second portion of the multi-wavelength radiation beam and generate the second off-axis radiation beam based on the second portion of the multi-wavelength radiation beam.

In some aspects, the first off-axis illumination system can include a first phase array configured to steer the first off-axis radiation beam toward the region of the surface of the substrate at the first incident angle. In some aspects, the first phase array can include a first plurality of phase shifters. In some aspects, the first phase array can include a first plurality of optical phase modulators.

In some aspects, the second off-axis illumination system can include a second phase array configured to steer the second off-axis radiation beam toward the region of the surface of the substrate at the second incident angle. In some aspects, the second phase array can include a second plurality of phase shifters. In some aspects, the second phase array can include a second plurality of optical phase modulators.

In some aspects, the first and second off-axis illumination systems can include first and second emitters, respectively, of substantially monochromatic radiation at the same wavelength. For example, the first and second off-axis illumination systems can include a positive blue light emitter and a negative blue light emitter, respectively. In another example, the first and second off-axis illumination systems can include a positive green light emitter and a negative green light emitter, respectively. In yet another example, the first and second off-axis illumination systems can include a positive red light emitter and a negative red light emitter, respectively.

In some aspects, the first and second off-axis illumination systems can include first and second emitters, respectively, of substantially monochromatic radiation at different wavelengths. For example, the first and second off-axis illumination systems can include a positive blue light emitter and a positive greed light emitter, respectively. In another example, the first and second off-axis illumination systems can include a positive green light emitter and a negative red light emitter, respectively.

In some aspects, the on-axis detection system can include a multimode dispersion waveguide structure. In some aspects, the multimode dispersion waveguide structure can include a first input channel structure, a second input channel structure, a first output channel structure, and a second output channel structure. In some aspects, the multimode dispersion waveguide structure can be configured to receive the first set of photons from the first input channel structure. In some aspects, the multimode dispersion waveguide structure can be further configured to receive the second set of photons from the second input channel structure. In some aspects, the multimode dispersion waveguide structure can be further configured to generate a first optical signal indicative of a difference between the first set of photons and the second set of photons. In some aspects, the multimode dispersion waveguide structure can be further configured to generate a second optical signal indicative of a summation of the first set of photons and the second set of photons. In some aspects, the multimode dispersion waveguide structure can be further configured to transmit the first optical signal to a first detector via the first output channel structure. In some aspects, the multimode dispersion waveguide structure can be further configured to transmit the second optical signal to a second detector via the second output channel structure. In some aspects, the first detector can be further configured to receive the first optical signal. In some aspects, the first detector can be further configured to generate difference measurement data based on a first set of measurements of the first optical signal. In some aspects, the second detector can be further configured to receive the second optical signal. In some aspects, the second detector can be further configured to generate summation measurement data based on a second set of measurements of the second optical signal. In some aspects, the on-axis detection system can be further configured to generate the electronic signal based on the difference measurement data and the summation measurement data.

In some aspects, the present disclosure describes an apparatus. The apparatus can include an integrated optical device. The integrated optical device can include a first radiation source configured to emit a first off-axis radiation beam at a first wavelength toward a region of a surface of a substrate at a first incident angle. The integrated optical device can further include a second radiation source configured to emit a second off-axis radiation beam at a second wavelength toward the region of the surface of the substrate at a second incident angle. The integrated optical device can further include a metrology system configured to measure a first on-axis diffracted radiation beam indicative of first order diffraction in response to a first off-axis irradiation of the region by the first off-axis radiation beam. The metrology system can be further configured to measure a second on-axis diffracted radiation beam indicative of first order diffraction in response to a second off-axis irradiation of the region by the second off-axis radiation beam. The radiation metrology system can be further configured to generate an electronic signal based on the measured first on-axis radiation beam and the measured second on-axis radiation beam.

In some aspects, the present disclosure describes a method for determining an alignment of a substrate. The method can include generating, by a first off-axis radiation source, a first off-axis radiation beam at a first wavelength. The method can further include transmitting, by the first off-axis radiation source, the first off-axis radiation beam toward a region of a surface of a substrate at a first incident angle. The method can further measuring, by an on-axis detection system, a first set of photons diffracted from the region of the surface of the substrate in response to a first off-axis irradiation of the region by the first off-axis radiation beam. The method can further generating, by a second off-axis radiation source, a second off-axis radiation beam at a second wavelength. The method can further transmitting, by the second off-axis radiation source, the second off-axis radiation beam toward the region of the surface of the substrate at a second incident angle. The method can further measuring, by the on-axis detection system, a second set of photons diffracted from the region of the surface of the substrate in response to a second off-axis irradiation of the region by the second off-axis radiation beam. The method can further generating, by the on-axis detection system, an electronic signal based on the measured first set of photons and the measured second set of photons.

Figure 10:
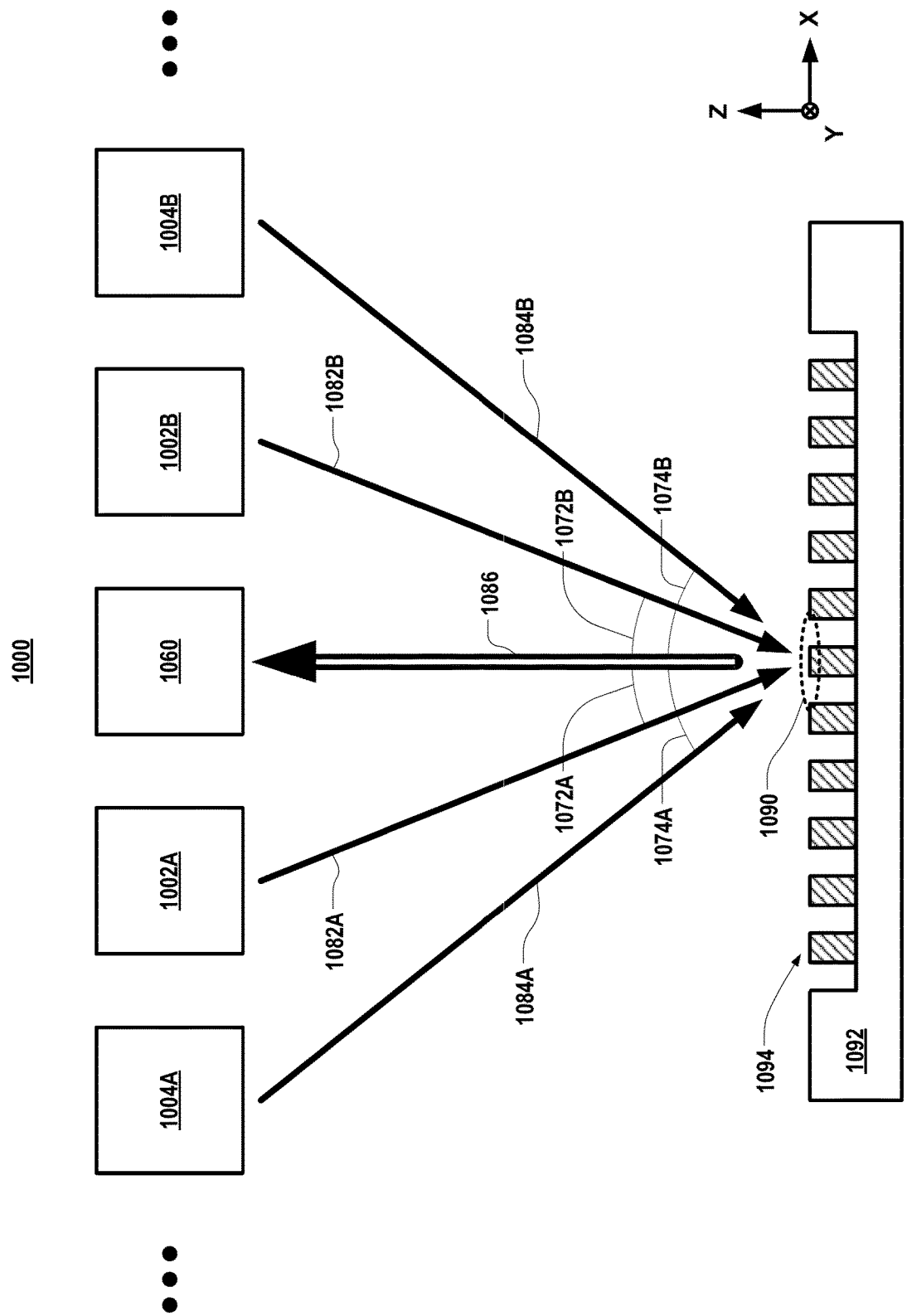
FIG. 10 is a schematic illustration of an example substrate alignment sensing system configured to utilize off-axis illumination and on-axis detection according to some aspects of the present disclosure.

FIG. 10 is a schematic illustration of an example substrate alignment sensing system 1000 utilizing off-axis illumination and on-axis detection according to some aspects of the present disclosure. In some aspects, the example substrate alignment sensing system 1000, or any portion thereof can be implemented using any of the structures, components, features, or techniques described with reference to the example substrate alignment sensing system 400 described with reference to FIG. 4; the example substrate alignment sensing systems 500 and 500' described with reference to FIGS. 5A and 5B; the example substrate alignment sensing system 600 described with reference to FIGS. 6A, 6B, 6C, and 6D; the example substrate alignment sensing system 700 described with reference to FIG. 7; the example substrate alignment sensing system 800 described with reference to FIG. 8; the example substrate alignment sensing system 1100 described with reference to FIGS. 11A, 11B, 11C, 11D, 11E, and 11F; the example computing system 1300 described with reference to FIG. 13; any other suitable structure, component, feature, or technique; any portion thereof; or any combination thereof.

As shown in FIG. 10, the example substrate alignment sensing system 1000 can include a plurality of off-axis illumination subsystems (e.g., radiation sources). In some aspects, the plurality of off-axis illumination subsystems can include a first off-axis illumination subsystem 1002A, a second off-axis illumination subsystem 1002B, a third off-axis illumination subsystem 1004A, a fourth off-axis illumination subsystem 1004B, any other suitable off-axis illumination subsystem (e.g., tens or hundreds of off-axis illumination subsystems), or any combination thereof. In some aspects, the example substrate alignment sensing system 1000 can further include an on-axis detection subsystem 1060. In some aspects, the example substrate alignment sensing system 1000 can include an integrated optical device that includes the plurality of off-axis illumination subsystems and the on-axis detection subsystem 1060. In some aspects, the example substrate alignment sensing system 1000, the plurality of off-axis illumination subsystems, the on-axis detection subsystem 1060, or a combination thereof can include, or be in communication with, a substrate alignment sensing controller (e.g., example computing system 1300 shown in FIG. 13) configured to perform the functions and operations described herein.

In some aspects, each of the plurality of off-axis illumination subsystems can be configured to emit an off-axis radiation beam (e.g., a beam of substantially coherent radiation) towards a region 1090 of a surface of a substrate 1092 at a different off-axis incident angle. In some aspects, an area of the region 1090 can be about 1.0 square millimeter. In one illustrative and non-limiting example, a diameter of the region 1090 can be about 35 microns. In some aspects, the region 1090 can include a portion of an alignment grating structure 1094. In some aspects, each of the plurality of off-axis illumination subsystems can include an optical coupler (e.g., a wideband, wavelength-insensitive in-and-out optical coupler) and can function as both an off-axis illumination subsystem and an off-axis detection subsystem (e.g., also referred to herein as an "emitter-detector"). In some aspects, each of the plurality of off-axis illumination subsystems can be included in, or function as, a 1D or 2D array for beam steering, focusing, and controlling of the illumination spot incident on the region 1090. In some aspects, the plurality of off-axis illumination subsystems can be disposed on a single-chip, SiN-based alignment system. For example, the single-chip, SiN-based alignment system can include a substrate (e.g., a Si substrate), an insulation layer (e.g., an $SiO_2$ insulation layer), a plurality of SiN gratings (e.g., $Si_3N_4$ gratings), and a plurality of phase shifters respectively disposed on the plurality of SiN gratings (e.g., one phase shifter per grating).

In some aspects, each of the plurality of off-axis illumination subsystems can include a phase array configured to steer an off-axis radiation beam toward the region 1090. In some aspects, each phase array can include a plurality of phase shifters (e.g., delay lines, thermo-optic phase shifters, or any other suitable phase shifters). In some aspects, each phase array can include a plurality of variable phase modulators, such as a plurality of optical phase modulators (OPMs). In some aspects, each of the plurality of off-axis illumination subsystems can include, or be in optical communication with, one or more optical couplers, illumination sources, fibers, mirrors, prisms, lenses, waveguides, detectors, processors, other suitable structures, and combinations thereof.

In some aspects, the example substrate alignment sensing system 1000 can include an optical coupler that is configured to be optically coupled to each of the plurality of off-axis illumination subsystems and a source illumination subsystem. In some aspects, the optical coupler can include, for example, a wideband, on-chip optical coupler; a lensed-top, vertically-curved coupler; direct laser writing for a lensed vertical coupler; a wideband, wavelength-insensitive in-and-out coupler; or any other suitable optical coupler. In some aspects, the optical coupler can be configured to receive multi-wavelength radiation (e.g., white light, incoherent radiation, dual-wavelength radiation, tri-wavelength radiation, quad-wavelength radiation, and so forth) from the source illumination subsystem, filter the received multi-wavelength radiation into a plurality of coherent radiation beams each at a different wavelength, and transmit each of the plurality of coherent off-axis radiation beams to a respective one of the plurality of off-axis illumination subsystems. In some aspects, the source illumination subsystem can include a light source such as an optical fiber or light pipe coupled to a light-emitting diode (LED) light source. In some aspects, the source illumination subsystem can include an integrated laser diode such as a vertical-cavity surface-emitting laser (VCSEL).

In one illustrative example, the optical coupler can be configured to receive a white light beam from the source illumination subsystem, filter the white light beam into a blue light beam and a green light beam, transmit (e.g., using a first optical splitter) the blue light beam to the first off-axis illumination subsystem 1002A and the second off-axis illumination subsystem 1002B, and transmit (e.g., using a second optical splitter) the green light beam to the third off-axis illumination subsystem 1004A and the fourth off-axis illumination subsystem 1004B. In some aspects, the example substrate alignment sensing system 1000 can include a polarization rotator disposed along the optical path between the optical coupler and one or more of the plurality of off-axis illumination subsystems. For example, to continue the illustrative example above, the example substrate alignment sensing system 1000 can include: a first polarization rotator disposed between the optical coupler and the second off-axis illumination subsystem 1002B (e.g., such that the blue light beam received by the second off-axis illumination subsystem 1002B differs in rotation (e.g., by 90 degrees) from the blue light beam received by the first off-axis illumination subsystem 1002A); and a second polarization rotator disposed between the optical coupler and the fourth off-axis illumination subsystem 1004B (e.g., such that the green light beam received by the fourth off-axis illumination subsystem 1004B differs in rotation (e.g., by 90 degrees) from the green light beam received by the third off-axis illumination subsystem 1004A).

In some aspects, the on-axis detection subsystem 1060 can be configured to receive one or more on-axis diffracted radiation beams (e.g., indicative of first order diffraction) from the region 1090 in response to the illumination of the region 1090 by one or more off-axis radiation beams. In some aspects, the on-axis detection subsystem 1060 can include an optic configured to collect the on-axis diffracted radiation beams from the region 1090. In some aspects, the optic can include a microlens structure. In some aspects, the on-axis detection subsystem 1060 can include a multimode dispersion waveguide coupled to one or more sensors. In some aspects, the on-axis detection subsystem 1060 can include an angled MMI device. In some aspects, the on-axis detection subsystem 1060 can include a wideband grating coupler. In some aspects, the on-axis detection subsystem 1060 can include a multi-period grating or a chirped grating. In some aspects, the on-axis detection subsystem 1060 can include a multi-level optical coupler. In some aspects, the on-axis detection subsystem 1060 can include multi-period gratings with chirp in between peak locations. In some aspects, the on-axis detection subsystem 1060 can include a wideband, on-chip optical coupler. In some aspects, the on-axis detection subsystem 1060 can include a lensed-top, vertically-curved optical coupler (e.g., an elephant coupler). In some aspects, the on-axis detection subsystem 1060 can include a direct laser writing for a lensed vertical optical coupler. In some aspects, the on-axis detection subsystem 1060 can include a wideband, wavelength-insensitive in-and-out optical coupler. In some aspects, the on-axis detection subsystem 1060 can include an AOTF configured to generate a grating that mimics the alignment mark pitch. In some aspects, the AOTF can include, or be integrated with, a SAW transducer. In some aspects, the on-axis detection subsystem 1060 can include one or more optical couplers, fibers, mirrors, lenses, prisms, beam splitters, wave plates, waveguides, polarizers, polarization rotators, detectors (e.g., photodetectors, photodiodes, charge-coupled devices (CCD) imaging devices, complementary metal-oxide-semiconductor (CMOS) imaging devices, polarimeters, and other suitable detectors), processors, and other suitable structures.

As a foundation for some aspects, the example substrate alignment sensing system 1000 can include a first off-axis illumination subsystem 1002A configured to generate a first off-axis radiation beam 1082A (e.g., a first beam of substantially coherent radiation) at a first wavelength. In some aspects, the first off-axis illumination subsystem 1002A can be further configured to transmit the first off-axis radiation beam 1082A to the region 1090 of the surface of the substrate 1092 at a first off-axis incident angle 1072A.

In some aspects, the example substrate alignment sensing system 1000 can include a second off-axis illumination subsystem 1002B configured to generate a second off-axis radiation beam 1082B (e.g., a second beam of substantially coherent radiation) at a second wavelength. In some aspects, the second off-axis illumination subsystem 1002B can be further configured to transmit the second off-axis radiation beam 1082B to the region 1090 at a second off-axis incident angle 1072B.

In some aspects, the second wavelength can be equal to about the first wavelength. In some aspects, the second wavelength can be different from the first wavelength. In some aspects, the second off-axis incident angle 1072B can be equal to about the first off-axis incident angle 1072A (e.g., a magnitude of the second off-axis incident angle 1072B can be about equal to a magnitude of the first off-axis incident angle 1072A). In some aspects, the second off-axis incident angle 1072B can be different from the first off-axis incident angle 1072A. In some aspects, a first rotation of the first off-axis radiation beam 1082A can be equal to a second rotation of the second off-axis radiation beam 1082B. In some aspects, the first rotation of the first off-axis radiation beam 1082A can be different from the second rotation of the second off-axis radiation beam 1082B (e.g., the first off-axis radiation beam 1082A and the second off-axis radiation beam 1082B can have the same wavelength but differ in rotation by 90 degrees).

In some aspects, the example substrate alignment sensing system 1000 can include a third off-axis illumination subsystem 1004A configured to generate a third off-axis radiation beam 1084A (e.g., a third beam of substantially coherent radiation) at a third wavelength. In some aspects, the third off-axis illumination subsystem 1004A can be further configured to transmit the third off-axis radiation beam 1084A to the region 1090 at a third off-axis incident angle 1074A.

In some aspects, the example substrate alignment sensing system 1000 can include a fourth off-axis illumination subsystem 1004B configured to generate a fourth off-axis radiation beam 1084B (e.g., a fourth beam of substantially coherent radiation) at a fourth wavelength. In some aspects, the fourth off-axis illumination subsystem 1004B can be further configured to transmit the fourth off-axis radiation beam 1084B to the region 1090 at a fourth off-axis incident angle 1074B.

In some aspects, the fourth wavelength can be equal to about the third wavelength. In some aspects, the fourth wavelength can be different from the third wavelength. In some aspects, the fourth off-axis incident angle 1074B can be equal to about the third off-axis incident angle 1074A (e.g., a magnitude of the fourth off-axis incident angle 1074B can be about equal to a magnitude of the third off-axis incident angle 1074A). In some aspects, the fourth off-axis incident angle 1074B can be different from the third off-axis incident angle 1074A. In some aspects, a third rotation of the third off-axis radiation beam 1084A can be equal to a fourth rotation of the fourth off-axis radiation beam 1084B. In some aspects, the third rotation of the third off-axis radiation beam 1084A can be different from the fourth rotation of the fourth off-axis radiation beam 1084B (e.g., the third off-axis radiation beam 1084A and the fourth off-axis radiation beam 1084B can have the same wavelength but differ in rotation by 90 degrees).

In some aspects, the example substrate alignment sensing system 1000 can further include a coupler (e.g., an optical coupler) configured to receive a multi-wavelength radiation beam from a source illumination subsystem via an optical fiber (e.g., a PM fiber). In some aspects, the coupler can be further configured to transmit a first portion of the multi-wavelength radiation beam to the first off-axis illumination subsystem 1002A. In some aspects, the coupler can be further configured to transmit a second portion of the multi-wavelength radiation beam to the second off-axis illumination subsystem 1002B. In some aspects, the coupler can be further configured to transmit a third portion of the multi-wavelength radiation beam to the third off-axis illumination subsystem 1004A. In some aspects, the coupler can be further configured to transmit a fourth portion of the multi-wavelength radiation beam to the fourth off-axis illumination subsystem 1004B.

In some aspects, the first off-axis illumination subsystem 1002A can be further configured to receive the first portion of the multi-wavelength radiation beam and generate the first off-axis radiation beam 1082A based on the first portion of the multi-wavelength radiation beam. In some aspects, the second off-axis illumination subsystem 1002B can be further configured to receive the second portion of the multi-wavelength radiation beam and generate the second off-axis radiation beam 1082B based on the second portion of the multi-wavelength radiation beam. In some aspects, the third off-axis illumination subsystem 1004A can be further configured to receive the third portion of the multi-wavelength radiation beam and generate the third off-axis radiation beam 1084A based on the third portion of the multi-wavelength radiation beam. In some aspects, the fourth off-axis illumination subsystem 1004B can be further configured to receive the fourth portion of the multi-wavelength radiation beam and generate the fourth off-axis radiation beam 1084B based on the fourth portion of the multi-wavelength radiation beam.

In some aspects, the first off-axis illumination subsystem 1002A can include a first phase array configured to steer the first off-axis radiation beam 1082A toward the region 1090 of the surface of the substrate 1092 at the first off-axis incident angle 1072A. In some aspects, the first phase array can include a first plurality of phase shifters. In some aspects, the first phase array can include a first plurality of OPMs.

In some aspects, the second off-axis illumination subsystem 1002B can include a second phase array configured to steer the second off-axis radiation beam 1082B toward the region 1090 of the surface of the substrate 1092 at the second off-axis incident angle 1072B. In some aspects, the second phase array can include a second plurality of phase shifters. In some aspects, the second phase array can include a second plurality of OPMs.

In some aspects, the third off-axis illumination subsystem 1004A can include a third phase array configured to steer the third off-axis radiation beam 1084A toward the region 1090 of the surface of the substrate 1092 at the third off-axis incident angle 1074A. In some aspects, the third phase array can include a third plurality of phase shifters. In some aspects, the third phase array can include a third plurality of OPMs.

In some aspects, the fourth off-axis illumination subsystem 1004B can include a fourth phase array configured to steer the fourth off-axis radiation beam 1084B toward the region 1090 of the surface of the substrate 1092 at the fourth off-axis incident angle 1074B. In some aspects, the fourth phase array can include a fourth plurality of phase shifters. In some aspects, the fourth phase array can include a fourth plurality of OPMs.

In some aspects, the first off-axis illumination subsystem 1002A and the second off-axis illumination subsystem 1002B can include first and second emitters, respectively, of substantially monochromatic radiation at a first wavelength. For example, the first off-axis illumination subsystem 1002A can include a positive blue light emitter, and the second off-axis illumination subsystem 1002B can include a negative blue light emitter. In some aspects, the third off-axis illumination subsystem 1004A and the fourth off-axis illumination subsystem 1004B can include third and fourth emitters, respectively, of substantially monochromatic radiation at a second wavelength different from the first wavelength. For example, the third off-axis illumination subsystem 1004A can include a positive green light emitter, and the fourth off-axis illumination subsystem 1004B can include a negative green light emitter.

In some aspects, each of the first off-axis incident angle 1072A, the second off-axis incident angle 1072B, the third off-axis incident angle 1074A, and the fourth off-axis incident angle 1074B can be defined relative to the surface normal of the surface of the substrate 1092. In some aspects, an on-axis diffracted radiation beam path 1086 can be coincident with the surface normal (e.g., the angle between the on-axis diffracted radiation beam path 1086 and the surface normal can be about zero). In other aspects, the on-axis diffracted radiation beam path 1086 can be non-coincident with the surface normal (e.g., the angle between the on-axis diffracted radiation beam path 1086 and the surface normal can be non-zero).

In some aspects, on-axis detection subsystem 1060 can be configured to receive, via the on-axis diffracted radiation beam path 1086, a first on-axis diffracted radiation beam that includes a first set of photons diffracted from the region 1090 in response to a first illumination of the region 1090 by the first off-axis radiation beam 1082A. In some aspects, the first set of photons included in the first on-axis diffracted radiation beam can be indicative of first order diffraction in response to the first illumination of the region 1090 by the first off-axis radiation beam 1082A.

In some aspects, the on-axis detection subsystem 1060 can be further configured to receive, via the on-axis diffracted radiation beam path 1086, a second on-axis diffracted radiation beam that includes a second set of photons diffracted from the region 1090 in response to a second illumination of the region 1090 by the second off-axis radiation beam 1082B. In some aspects, the second set of photons included in the second on-axis diffracted radiation beam can be indicative of first order diffraction in response to the second illumination of the region 1090 by the second off-axis radiation beam 1082B.

In some aspects, the on-axis detection subsystem 1060 can be further configured to receive, via the on-axis diffracted radiation beam path 1086, a third on-axis diffracted radiation beam that includes a third set of photons diffracted from the region 1090 in response to a third illumination of the region 1090 by the third off-axis radiation beam 1084A. In some aspects, the third set of photons included in the third on-axis diffracted radiation beam can be indicative of first order diffraction in response to the third illumination of the region 1090 by the third off-axis radiation beam 1084A.

In some aspects, the on-axis detection subsystem 1060 can be further configured to receive, via the on-axis diffracted radiation beam path 1086, a fourth on-axis diffracted radiation beam that includes a fourth set of photons diffracted from the region 1090 in response to a fourth illumination of the region 1090 by the fourth off-axis radiation beam 1084B. In some aspects, the fourth set of photons included in the fourth on-axis diffracted radiation beam can be indicative of first order diffraction in response to the fourth illumination of the region 1090 by the fourth off-axis radiation beam 1084B.

In some aspects, the on-axis detection subsystem 1060 can be further configured to generate an electronic signal based on the first on-axis diffracted radiation beam (e.g., the first set of photons), the second on-axis diffracted radiation beam (e.g., the second set of photons), the third on-axis diffracted radiation beam (e.g., the third set of photons), the fourth on-axis diffracted radiation beam (e.g., the fourth set of photons), or a combination thereof. In some aspects, the electronic signal can include a first sub-signal indicative of a first phase difference between the first on-axis diffracted radiation beam and the second on-axis diffracted radiation beam. In some aspects, the electronic signal can further include a second sub-signal indicative of a second phase difference between the third on-axis diffracted radiation beam and the fourth on-axis diffracted radiation beam. In some aspects, the on-axis detection subsystem 1060 can be further configured to determine an alignment position of the alignment grating structure 1094 based on the electronic signal or any portion (e.g., sub-signal) or combination of portions thereof.

In some aspects, the on-axis detection subsystem 1060 can include a multimode dispersion waveguide structure. In some aspects, the multimode dispersion waveguide structure can be configured to generate a first optical signal indicative of a difference between the first set of photons and the second set of photons. In some aspects, the multimode dispersion waveguide structure can be further configured to generate a second optical signal indicative of a summation of the first set of photons and the second set of photons. In some aspects, the on-axis detection subsystem 1060 can be further configured to generate first difference measurement data based on the first optical signal. In some aspects, the on-axis detection subsystem 1060 can be further configured to generate first summation measurement data based on the second optical signal. In some aspects, the multimode dispersion waveguide structure can be further configured to generate a third optical signal indicative of a difference between the third set of photons and the fourth set of photons. In some aspects, the multimode dispersion waveguide structure can be further configured to generate a fourth optical signal indicative of a summation of the third set of photons and the fourth set of photons. In some aspects, the on-axis detection subsystem 1060 can be further configured to generate second difference measurement data based on the third optical signal. In some aspects, the on-axis detection subsystem 1060 can be further configured to generate second summation measurement data based on the fourth optical signal. In some aspects, the on-axis detection subsystem can be further configured to generate the electronic signal based on the first difference measurement data, the first summation measurement data, the second difference measurement data, the second summation measurement data, any other suitable data or signal, or any combination thereof.

FIGS. 11A, 11B, 11C, 11D, 11E, and 11F are schematic illustrations of an example substrate alignment sensing system 1100 according to some aspects of the present disclosure. As shown in FIGS. 11A, 11B, 11C, 11D, 11E, and 11F, the example substrate alignment sensing system 1100 can include an integrated optical device (e.g., a single-chip SiN-based system) that can include: an integrated optical device substrate 1101; a plurality of off-axis illumination subsystems; an optical coupler 1140 configured to be optically coupled to each of the plurality of off-axis illumination subsystems (e.g., coherent radiation sources) and a source illumination subsystem (e.g., a multi-wavelength radiation source); and an on-axis detection subsystem that can include an optic 1150 (e.g., a microlens structure).

In some aspects, the example substrate alignment sensing system 1100 can be implemented using any of the structures, components, features, or techniques described with reference to the example substrate alignment sensing system 400 described with reference to FIG. 4; the example substrate alignment sensing systems 500 and 500' described with reference to FIGS. 5A and 5B; the example substrate alignment sensing system 600 described with reference to FIG. 6A; the example multimode dispersion waveguide structure 640 described with reference to FIGS. 6A, 6B, 6C, and 6D; the example substrate alignment sensing system 700 described with reference to FIG. 7; the example substrate alignment sensing system 800 described with reference to FIG. 8; the example substrate alignment sensing system 1000 described with reference to FIG. 10; the example computing system 1300 described with reference to FIG. 13; any other suitable structure, component, feature, or technique; any portion thereof; or any combination thereof.

In some aspects, as shown in FIGS. 11A, 11B, 11C, 11D, 11E, and 11F, the plurality of off-axis illumination subsystems can be disposed substantially parallel to the X-axis. In other aspects, the plurality of off-axis illumination subsystems can be disposed substantially parallel to the Y-axis. In still other aspects, the plurality of off-axis illumination subsystems can include (i) a first subset of the plurality of off-axis illumination subsystems disposed substantially parallel to the X-axis and (ii) a second subset of the plurality of off-axis illumination subsystems disposed substantially parallel to the Y-axis. In some aspects, one or more of the emitters described with reference to FIG. 11A, 11B, 11C, 11D, 11E, or 11F can function as both an illuminator and a detector. In some aspects, one or more of the phase arrays described with reference to FIG. 11A, 11B, 11C, 11D, 11E, or 11F can include a phase shifter, a phase modulator (e.g., an OPM), or any other suitable component or structure.

Figure 11A:
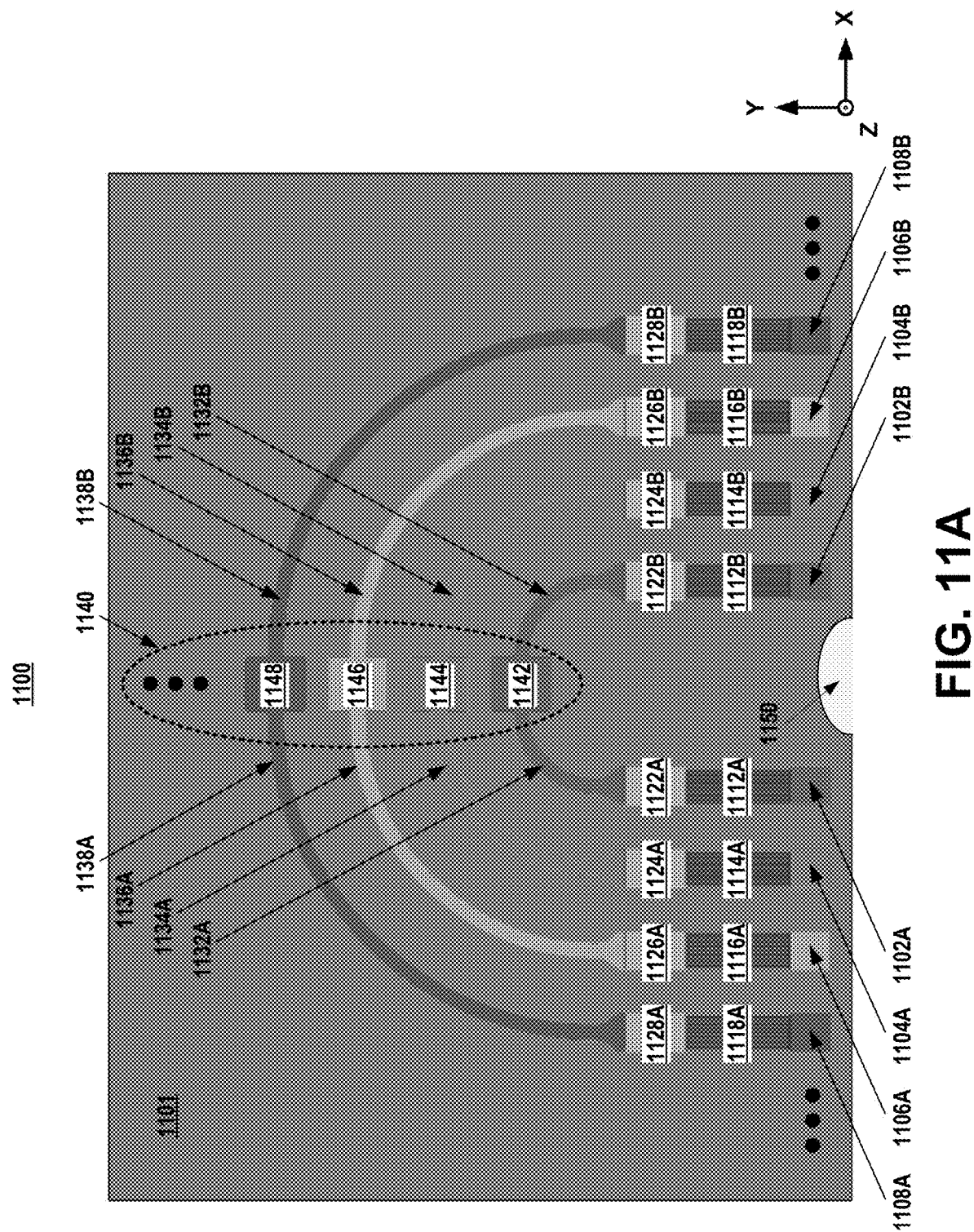

In some aspects, as shown in FIG. 11A, the plurality of off-axis illumination subsystems can include: (i) a first off-axis illumination subsystem that includes an emitter 1102A, a grating structure 1112A (e.g., $Si_3N_4$ grating), and a phase array 1122A; (ii) a second off-axis illumination subsystem that includes an emitter 1102B, a grating structure 1112B, and a phase array 1122B; (iii) a third off-axis illumination subsystem that includes an emitter 1104A, a grating structure 1114A, and a phase array 1124A; (iv) a fourth off-axis illumination subsystem that includes an emitter 1104B, a grating structure 1114B, and a phase array 1124B; (v) a fifth off-axis illumination subsystem that includes an emitter 1106A, a grating structure 1116A, and a phase array 1126A; (vi) a sixth off-axis illumination subsystem that includes an emitter 1106B, a grating structure 1116B, and a phase array 1126B; (vii) a seventh off-axis illumination subsystem that includes an emitter 1108A, a grating structure 1118A, and a phase array 1128A; (viii) an eighth off-axis illumination subsystem that includes an emitter 1108B, a grating structure 1118B, and a phase array 1128B; any other suitable illumination subsystem, device, or structure; or any combination thereof. In some aspects, one or more of the emitters can function as both an illuminator and a detector. In some aspects, one or more of the phase arrays can include a phase shifter, a phase modulator (e.g., an OPM), or any other suitable component or structure.

In some aspects, the optical coupler 1140 can include an input structure that is configured to be optically coupled to a source illumination subsystem disposed optically upstream of the optical coupler 1140. In some aspects, the optical coupler 1140 can have a plurality of output structures, where each of the plurality of output structures is configured to be optically coupled a respective one of the plurality of off-axis illumination subsystems disposed optically downstream of the optical coupler 1140. In some aspects, the optical coupler 1140 can be configured to receive multi-wavelength radiation from the source illumination subsystem, filter the received multi-wavelength radiation into a plurality of coherent radiation beams each at a different wavelength, and transmit each of the plurality of coherent radiation beams to a respective one of the plurality of off-axis illumination subsystems via a respective optical path structure (e.g., a respective optical fiber, waveguide, or other suitable optical transmission structure). In some aspects, the optical coupler 1140 can be configured to transmit each of the plurality of coherent radiation beams to two of the plurality of off-axis illumination subsystems (e.g., two off-axis illumination subsystems disposed substantially parallel to the X-axis or the Y-axis) via two separate optical path structures. In some aspects, the optical coupler 1140 can be configured to transmit each of the plurality of coherent radiation beams to four of the plurality of off-axis illumination subsystems (e.g., two off-axis illumination subsystems disposed substantially parallel to the X-axis and another two off-axis illumination subsystems disposed substantially parallel to the Y-axis) via four separate optical path structures.

In some aspects, the optical coupler 1140 can include an optical filter structure 1142 configured to filter the received multi-wavelength radiation into a first radiation beam at a first wavelength (e.g., blue light), transmit a "positive" first radiation beam to the first off-axis illumination subsystem (e.g., to the phase array 1122A) via an optical path structure 1132A, and transmit a "negative" first radiation beam (e.g., which can be the same as the "positive" first radiation beam or a modified (e.g., rotated by 90 degrees) version of the "positive" first radiation beam) to the second off-axis illumination subsystem (e.g., to the phase array 1122B) via an optical path structure 1132B.

In some aspects, the optical coupler 1140 can include an optical filter structure 1144 configured to filter the received multi-wavelength radiation into a second radiation beam at a second wavelength (e.g., green light), transmit a "positive" second radiation beam to the third off-axis illumination subsystem (e.g., to the phase array 1124A) via an optical path structure 1134A, and transmit a "negative" second radiation beam (e.g., which can be the same as the "positive" second radiation beam or a modified (e.g., rotated by 90 degrees) version of the "positive" second radiation beam) to the fourth off-axis illumination subsystem (e.g., to the phase array 1124B) via an optical path structure 1134B.

In some aspects, the optical coupler 1140 can include an optical filter structure 1146 configured to filter the received multi-wavelength radiation into a third radiation beam at a third wavelength (e.g., orange light), transmit a "positive" third radiation beam to the fifth off-axis illumination subsystem (e.g., to the phase array 1126A) via an optical path structure 1136A, and transmit a "negative" third radiation beam (e.g., which can be the same as the "positive" third radiation beam or a modified (e.g., rotated by 90 degrees) version of the "positive" third radiation beam) to the sixth off-axis illumination subsystem (e.g., to the phase array 1126B) via an optical path structure 1136B.

In some aspects, the optical coupler 1140 can include an optical filter structure 1148 configured to filter the received multi-wavelength radiation into a fourth radiation beam at a fourth wavelength (e.g., red light), transmit a "positive" fourth radiation beam to the seventh off-axis illumination subsystem (e.g., to the phase array 1128A) via an optical path structure 1138A, and transmit a "negative" fourth radiation beam (e.g., which can be the same as the "positive" fourth radiation beam or a modified (e.g., rotated by 90 degrees) version of the "positive" fourth radiation beam) to the eighth off-axis illumination subsystem (e.g., to the phase array 1128B) via an optical path structure 1138B.

In some aspects, each of the plurality of off-axis illumination subsystems can be configured to emit a radiation beam towards a region of a surface of a substrate at a different incident angle. In some aspects, the region can include a portion of an alignment grating structure. In some aspects, the optic 1150 can be configured to receive one or more diffracted radiation beams (e.g., indicative of first order diffraction) from the region of the surface of the substrate in response to illumination of the region by the radiation beams emitted by the plurality of off-axis illumination subsystem.

Figure 11B:
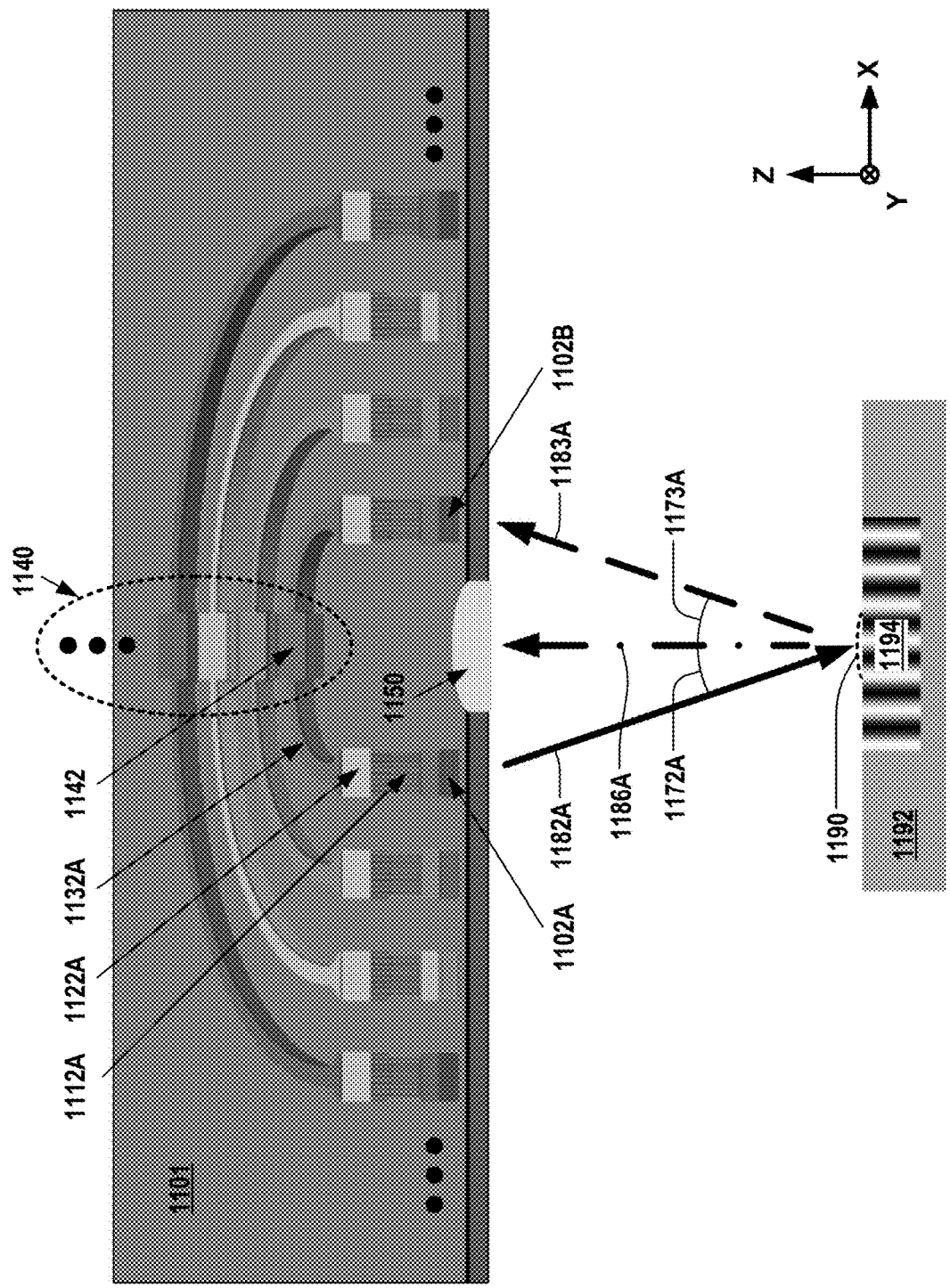
Figure 11C:
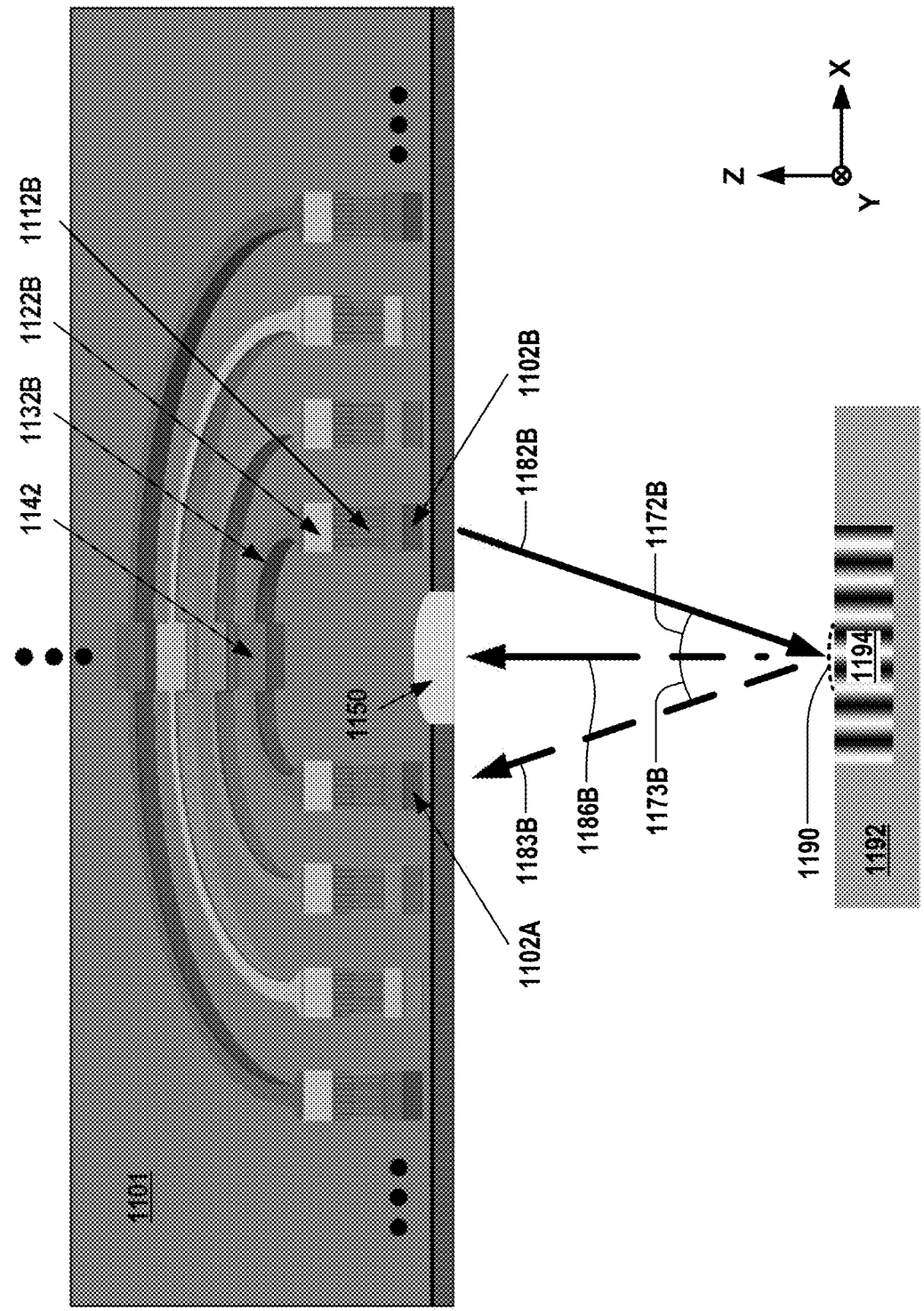

As shown in FIGS. 11B and 11C, in some aspects, the plurality of off-axis illumination subsystems can include the first off-axis illumination subsystem that includes the emitter 1102A, the grating structure 1112A, and the phase array 1122A. In some aspects, the plurality of off-axis illumination subsystems can include the second off-axis illumination subsystem that includes the emitter 1102B, the grating structure 1112B, and the phase array 1122B.

In some aspects, the optical coupler 1140 can be configured to receive multi-wavelength radiation (e.g., incoherent radiation such as white light) from the source illumination subsystem. In some aspects, the optical coupler 1140 can include the optical filter structure 1142. The optical filter structure 1142 can be configured to filter the received multi-wavelength radiation into a stream of photons at a first wavelength (e.g., blue light), transmit a first "positive" stream of photons at the first wavelength to the first off-axis illumination subsystem (e.g., to the phase array 1122A and then to the grating structure 1112A and subsequently to the emitter 1102A) via the optical path structure 1132A, and transmit a first "negative" stream of photons at the first wavelength to the second off-axis illumination subsystem (e.g., to the phase array 1122B and then to the grating structure 1112B and subsequently to the emitter 1102B) via the optical path structure 1132B. In some aspects, the first "negative" stream of photons can be the same as the first "positive" stream of photons. In other aspects, the first "negative" stream of photons can be different from the first "positive" stream of photons. For example, the first "negative" stream of photons can be a modified (e.g., rotated by 90 degrees) version of the first "positive" stream of photons.

As shown in FIG. 11B, in some aspects, the first off-axis illumination subsystem can be configured to generate an off-axis radiation beam 1182A (e.g., a beam of substantially coherent radiation at the first wavelength) based on the first "positive" stream of photons. In some aspects, the first off-axis illumination subsystem can be further configured to transmit the off-axis radiation beam 1182A to a region 1190 of a surface of a substrate 1192 at an off-axis incident angle 1172A. In some aspects, the region 1190 can include a portion of an alignment grating structure 1194.

In some aspects, the on-axis detection subsystem can be configured to receive, via the optic 1150, an on-axis diffracted radiation beam 1186A that includes a set of photons diffracted from the region 1190 in response to an illumination of the region 1190 by the off-axis radiation beam 1182A. In some aspects, the set of photons included in the on-axis diffracted radiation beam 1186A can be indicative of first order diffraction in response to the illumination of the region 1190 by the off-axis radiation beam 1182A.

In some aspects, the emitter 1102B can be configured to receive an off-axis diffracted radiation beam 1183A that includes a set of photons diffracted from the region 1190 at an off-axis diffraction angle 1173A in response to the illumination of the region 1190 by the off-axis radiation beam 1182A. In some aspects, the set of photons included in the off-axis diffracted radiation beam 1183A can be indicative of zero order diffraction in response to the illumination of the region 1190 by the off-axis radiation beam 1182A.

In some aspects, the off-axis incident angle 1172A and the off-axis diffraction angle 1173A can be defined relative to the surface normal of the surface of the substrate 1192. In some aspects, the magnitude of the off-axis incident angle 1172A can be about the same as (e.g., about equal to) the magnitude of the off-axis diffraction angle 1173A. In some aspects, the on-axis diffracted radiation beam 1186A can be coincident with the surface normal (e.g., the angle between the on-axis diffracted radiation beam 1186A and the surface normal can be about zero). In other aspects, the on-axis diffracted radiation beam 1186A can be non-coincident with the surface normal (e.g., the angle between the on-axis diffracted radiation beam 1186A and the surface normal can be non-zero, such as about 1.0 degree, about 3.0 degrees, or about 10.0 degrees).

As shown in FIG. 11C, in some aspects, the second off-axis illumination subsystem can be configured to generate an off-axis radiation beam 1182B (e.g., a beam of substantially coherent radiation at the first wavelength) based on the first "negative" stream of photons. In some aspects, the second off-axis illumination subsystem can be further configured to transmit the off-axis radiation beam 1182B to the region 1190 at an off-axis incident angle 1172B.

In some aspects, the on-axis detection subsystem can be configured to receive, via the optic 1150, an on-axis diffracted radiation beam 1186B that includes a set of photons diffracted from the region 1190 in response to an illumination of the region 1190 by the off-axis radiation beam 1182B. In some aspects, the set of photons included in the on-axis diffracted radiation beam 1186B can be indicative of first order diffraction in response to the illumination of the region 1190 by the off-axis radiation beam 1182B.

In some aspects, the emitter 1102A can be configured to receive an off-axis diffracted radiation beam 1183B that includes a set of photons diffracted from the region 1190 at an off-axis diffraction angle 1173B in response to the illumination of the region 1190 by the off-axis radiation beam 1182B. In some aspects, the set of photons included in the off-axis diffracted radiation beam 1183B can be indicative of zero order diffraction in response to the illumination of the region 1190 by the off-axis radiation beam 1182B.

As shown in FIG. 11C, the off-axis incident angle 1172B and the off-axis diffraction angle 1173B can be defined relative to the surface normal of the surface of the substrate 1192. In some aspects, the magnitude of the off-axis incident angle 1172B can be about the same as (e.g., about equal to) the magnitude of the off-axis diffraction angle 1173B. In some aspects, the on-axis diffracted radiation beam 1186B can be coincident with the surface normal (e.g., the angle between the on-axis diffracted radiation beam 1186B and the surface normal can be about zero). In other aspects, the on-axis diffracted radiation beam 1186B can be non-coincident with the surface normal (e.g., the angle between the on-axis diffracted radiation beam 1186B and the surface normal can be non-zero).

Figure 11D:
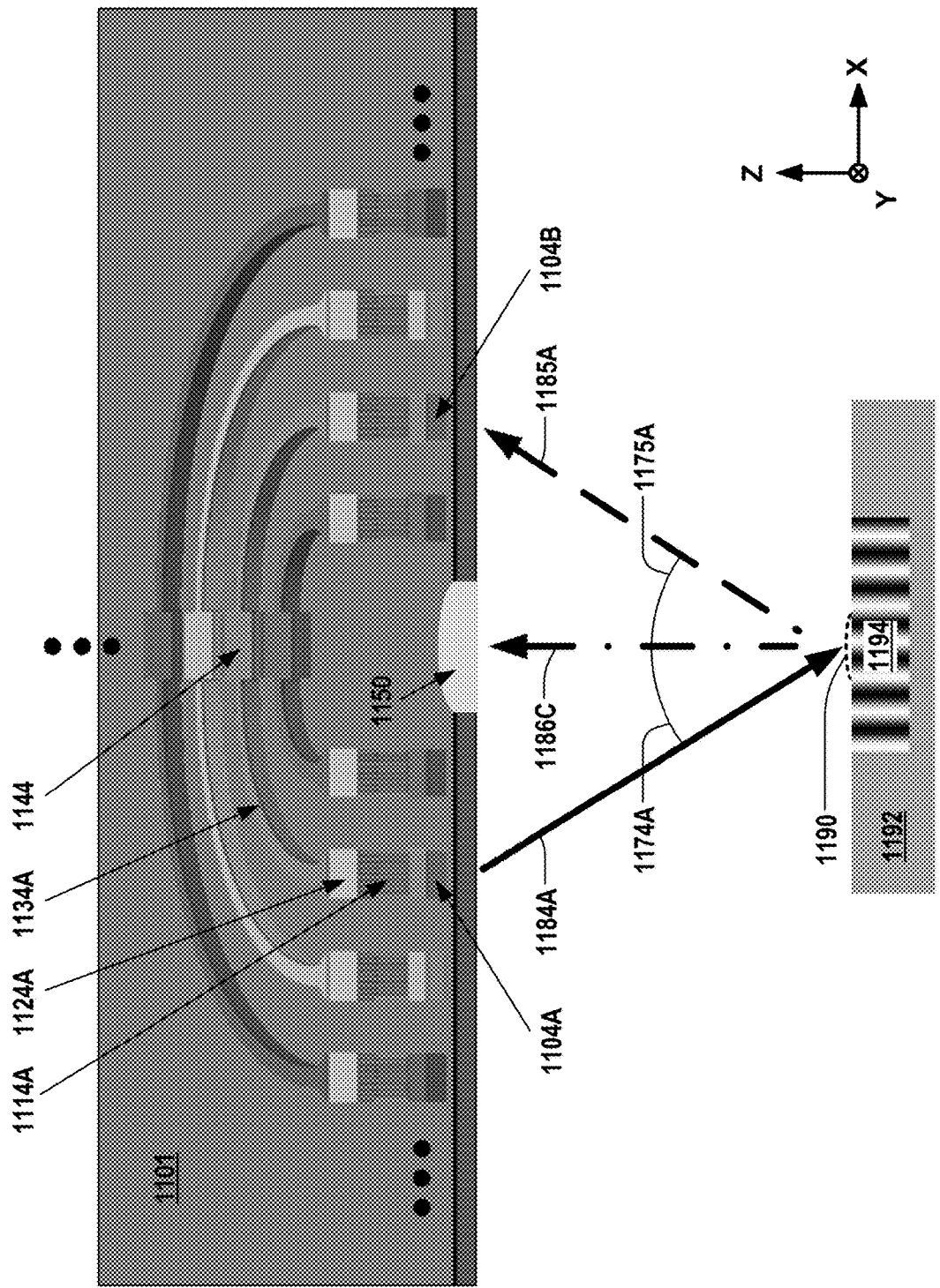
Figure 11E:
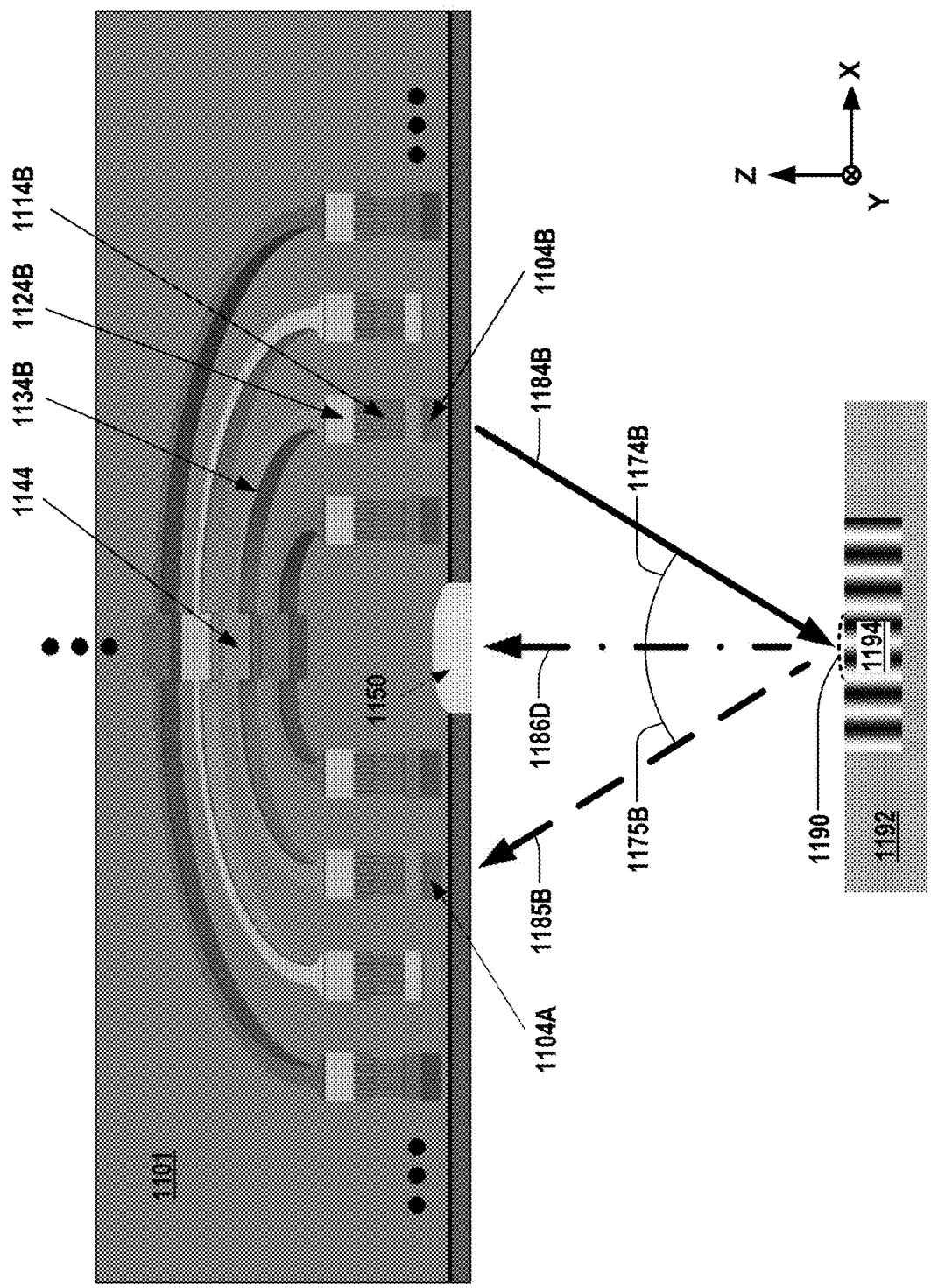

As shown in FIGS. 11D and 11E, in some aspects, the plurality of off-axis illumination subsystems can include the third off-axis illumination subsystem that includes the emitter 1104A, the grating structure 1114A, and the phase array 1124A. In some aspects, the plurality of off-axis illumination subsystems can include the fourth off-axis illumination subsystem that includes the emitter 1104B, the grating structure 1114B, and the phase array 1124B.

In some aspects, the optical coupler 1140 can include the optical filter structure 1144. The optical filter structure 1144 can be configured to filter the received multi-wavelength radiation into a stream of photons at a second wavelength (e.g., green light), transmit a second "positive" stream of photons at the second wavelength to the third off-axis illumination subsystem (e.g., to the phase array 1124A and then to the grating structure 1114A and subsequently to the emitter 1104A) via the optical path structure 1134A, and transmit a second "negative" stream of photons at the second wavelength to the fourth off-axis illumination subsystem (e.g., to the phase array 1124B and then to the grating structure 1114B and subsequently to the emitter 1104B) via the optical path structure 1134B. In some aspects, the second "negative" stream of photons can be the same as the second "positive" stream of photons. In other aspects, the second "negative" stream of photons can be different from the second "positive" stream of photons. For example, the second "negative" stream of photons can be a modified (e.g., rotated by 90 degrees) version of the second "positive" stream of photons.

As shown in FIG. 11D, in some aspects, the third off-axis illumination subsystem can be configured to generate an off-axis radiation beam 1184A (e.g., a beam of substantially coherent radiation at the second wavelength) based on the second "positive" stream of photons. In some aspects, the third off-axis illumination subsystem can be further configured to transmit the off-axis radiation beam 1184A to the region 1190 at an off-axis incident angle 1174A.

In some aspects, the on-axis detection subsystem can be configured to receive, via the optic 1150, an on-axis diffracted radiation beam 1186C that includes a set of photons diffracted from the region 1190 in response to an illumination of the region 1190 by the off-axis radiation beam 1184A. In some aspects, the set of photons included in the on-axis diffracted radiation beam 1186C can be indicative of first order diffraction in response to the illumination of the region 1190 by the off-axis radiation beam 1184A.

In some aspects, the emitter 1104B can be configured to receive an off-axis diffracted radiation beam 1185A that includes a set of photons diffracted from the region 1190 at an off-axis diffraction angle 1175A in response to the illumination of the region 1190 by the off-axis radiation beam 1184A. In some aspects, the set of photons included in the off-axis diffracted radiation beam 1185A can be indicative of zero order diffraction in response to the illumination of the region 1190 by the off-axis radiation beam 1184A.

In some aspects, the off-axis incident angle 1174A and the off-axis diffraction angle 1175A can be defined relative to the surface normal of the surface of the substrate 1192. In some aspects, the magnitude of the off-axis incident angle 1174A can be about the same as (e.g., about equal to) the magnitude of the off-axis diffraction angle 1175A. In some aspects, the on-axis diffracted radiation beam 1186C can be coincident with the surface normal (e.g., the angle between the on-axis diffracted radiation beam 1186C and the surface normal can be about zero). In other aspects, the on-axis diffracted radiation beam 1186C can be non-coincident with the surface normal (e.g., the angle between the on-axis diffracted radiation beam 1186C and the surface normal can be non-zero).

As shown in FIG. 11E, in some aspects, the fourth off-axis illumination subsystem can be configured to generate an off-axis radiation beam 1184B (e.g., a beam of substantially coherent radiation at the second wavelength) based on the second "negative" stream of photons. In some aspects, the fourth off-axis illumination subsystem can be further configured to transmit the off-axis radiation beam 1184B to the region 1190 at an off-axis incident angle 1174B.

In some aspects, the on-axis detection subsystem can be configured to receive, via the optic 1150, an on-axis diffracted radiation beam 1186D that includes a set of photons diffracted from the region 1190 in response to an illumination of the region 1190 by the off-axis radiation beam 1184B. In some aspects, the set of photons included in the on-axis diffracted radiation beam 1186D can be indicative of first order diffraction in response to the illumination of the region 1190 by the off-axis radiation beam 1184B.

In some aspects, the emitter 1104A can be configured to receive an off-axis diffracted radiation beam 1185B that includes a set of photons diffracted from the region 1190 at an off-axis diffraction angle 1175B in response to the illumination of the region 1190 by the off-axis radiation beam 1184B. In some aspects, the set of photons included in the off-axis diffracted radiation beam 1185B can be indicative of zero order diffraction in response to the illumination of the region 1190 by the off-axis radiation beam 1184B.

In some aspects, the off-axis incident angle 1174B and the off-axis diffraction angle 1175B can be defined relative to the surface normal of the surface of the substrate 1192. In some aspects, the magnitude of the off-axis incident angle 1174B can be about the same as (e.g., about equal to) the magnitude of the off-axis diffraction angle 1175B. In some aspects, the on-axis diffracted radiation beam 1186D can be coincident with the surface normal (e.g., the angle between the on-axis diffracted radiation beam 1186D and the surface normal can be about zero). In other aspects, the on-axis diffracted radiation beam 1186D can be non-coincident with the surface normal (e.g., the angle between the on-axis diffracted radiation beam 1186D and the surface normal can be non-zero).

Figure 11F:
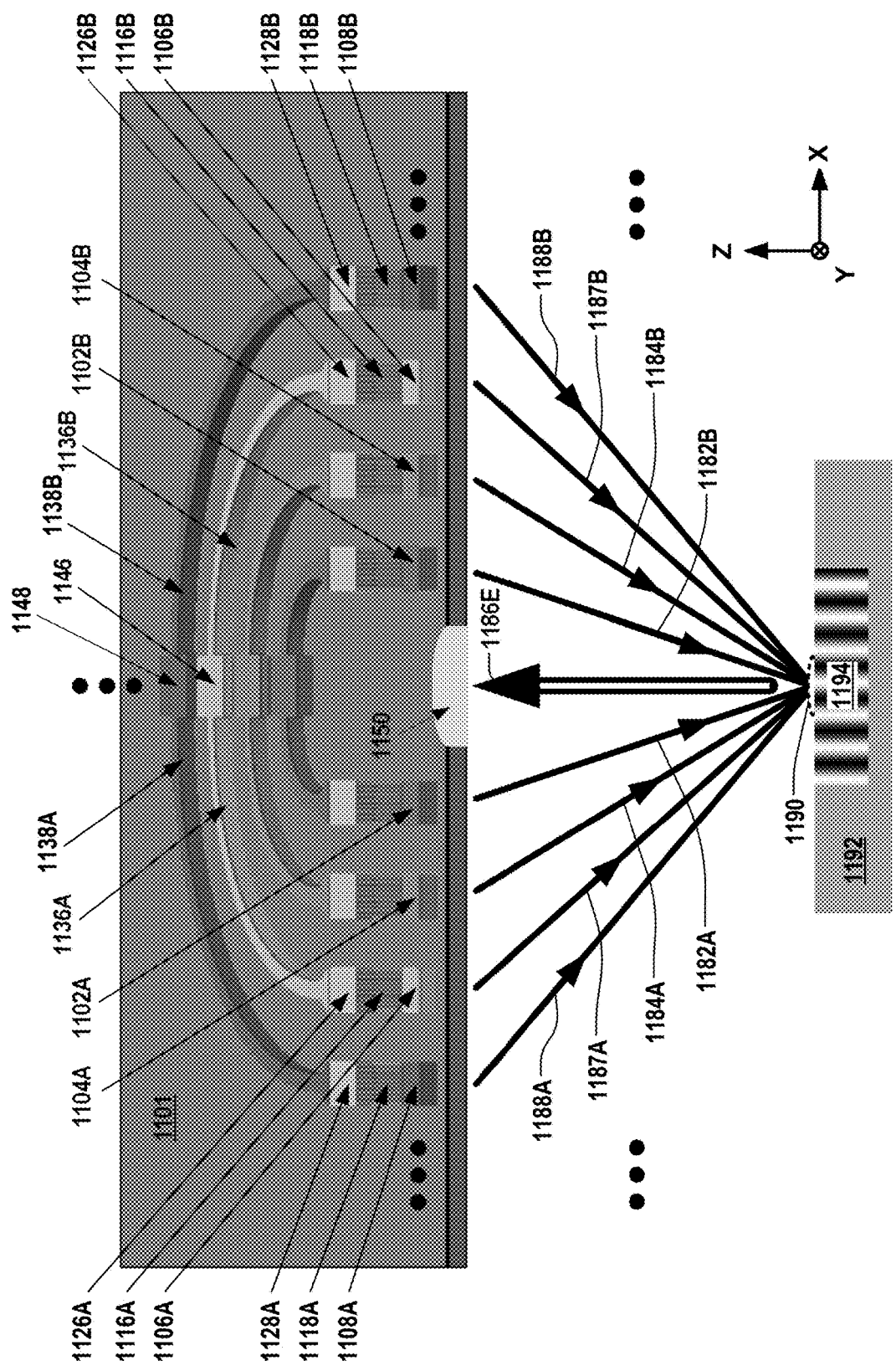

As shown in FIG. 11F, in some aspects, the plurality of off-axis illumination subsystems can include the fifth off-axis illumination subsystem that includes the emitter 1106A, the grating structure 1116A, and the phase array 1126A. In some aspects, the plurality of off-axis illumination subsystems can include the sixth off-axis illumination subsystem that includes the emitter 1106B, the grating structure 1116B, and the phase array 1126B. In some aspects, the plurality of off-axis illumination subsystems can include the seventh off-axis illumination subsystem that includes the emitter 1108A, the grating structure 1118A, and the phase array 1128A. In some aspects, the plurality of off-axis illumination subsystems can include the eighth off-axis illumination subsystem that includes the emitter 1108B, the grating structure 1118B, and the phase array 1128B.

In some aspects, the optical coupler 1140 can include the optical filter structure 1146. The optical filter structure 1146 can be configured to filter the received multi-wavelength radiation into a stream of photons at a third wavelength (e.g., orange light), transmit a third "positive" stream of photons at the third wavelength to the fifth off-axis illumination subsystem (e.g., to the phase array 1126A and then to the grating structure 1116A and subsequently to the emitter 1106A) via the optical path structure 1136A, and transmit a third "negative" stream of photons at the third wavelength to the sixth off-axis illumination subsystem (e.g., to the phase array 1126B and then to the grating structure 1116B and subsequently to the emitter 1106B) via the optical path structure 1136B. In some aspects, the third "negative" stream of photons can be the same as the third "positive" stream of photons. In other aspects, the third "negative" stream of photons can be different from the third "positive" stream of photons. For example, the third "negative" stream of photons can be a modified (e.g., rotated by 90 degrees) version of the third "positive" stream of photons.

In some aspects, the optical coupler 1140 can include the optical filter structure 1148. The optical filter structure 1148 can be configured to filter the received multi-wavelength radiation into a stream of photons at a fourth wavelength (e.g., red light), transmit a fourth "positive" stream of photons at the fourth wavelength to the seventh off-axis illumination subsystem (e.g., to the phase array 1128A and then to the grating structure 1118A and subsequently to the emitter 1108A) via the optical path structure 1138A, and transmit a fourth "negative" stream of photons at the fourth wavelength to the eighth off-axis illumination subsystem (e.g., to the phase array 1128B and then to the grating structure 1118B and subsequently to the emitter 1108B) via the optical path structure 1138B. In some aspects, the fourth "negative" stream of photons can be the same as the fourth "positive" stream of photons. In other aspects, the fourth "negative" stream of photons can be different from the fourth "positive" stream of photons. For example, the fourth "negative" stream of photons can be a modified (e.g., rotated by 90 degrees) version of the fourth "positive" stream of photons.

In some aspects, the fifth off-axis illumination subsystem can be configured to generate an off-axis radiation beam 1187A (e.g., a beam of substantially coherent radiation at the third wavelength) based on the third "positive" stream of photons. In some aspects, the sixth off-axis illumination subsystem can be configured to generate an off-axis radiation beam 1187B (e.g., a beam of substantially coherent radiation at the third wavelength) based on the third "negative" stream of photons. In some aspects, the seventh off-axis illumination subsystem can be configured to generate an off-axis radiation beam 1188A (e.g., a beam of substantially coherent radiation at the fourth wavelength) based on the fourth "positive" stream of photons. In some aspects, the eighth off-axis illumination subsystem can be configured to generate an off-axis radiation beam 1188B (e.g., a beam of substantially coherent radiation at the fourth wavelength) based on the fourth "negative" stream of photons.

In some aspects, the first off-axis illumination subsystem can be further configured to transmit the off-axis radiation beam 1182A to the region 1190 at a first off-axis incident angle. In some aspects, the second off-axis illumination subsystem can be further configured to transmit the off-axis radiation beam 1182B to the region 1190 at a second off-axis incident angle. In some aspects, the third off-axis illumination subsystem can be further configured to transmit the off-axis radiation beam 1184A to the region 1190 at a third off-axis incident angle. In some aspects, the fourth off-axis illumination subsystem can be further configured to transmit the off-axis radiation beam 1184B to the region 1190 at a fourth off-axis incident angle. In some aspects, the fifth off-axis illumination subsystem can be further configured to transmit the off-axis radiation beam 1187A to the region 1190 at a fifth off-axis incident angle. In some aspects, the sixth off-axis illumination subsystem can be further configured to transmit the off-axis radiation beam 1187B to the region 1190 at a sixth off-axis incident angle. In some aspects, the seventh off-axis illumination subsystem can be further configured to transmit the off-axis radiation beam 1188A to the region 1190 at a seventh off-axis incident angle. In some aspects, the eighth off-axis illumination subsystem can be further configured to transmit the off-axis radiation beam 1188B to the region 1190 at an eighth off-axis incident angle. In some aspects, the off-axis radiation beams 1182A, 1182B, 1184A, 1184B, 1187A, 1187B, 1188A, and 1188B can be transmitted to, or incident on, the region 1190 at substantially the same time. In some aspects, the off-axis radiation beams 1182A, 1182B, 1184A, 1184B, 1187A, 1187B, 1188A, and 1188B can be transmitted to, or incident on, the region 1190 at substantially different times.

In some aspects, the on-axis detection subsystem can be configured to receive, via the optic 1150 along the on-axis diffracted radiation beam path 1186E, a first on-axis diffracted radiation beam indicative of first order diffraction that includes a first set of photons diffracted from the region 1190 in response to an illumination of the region 1190 by the off-axis radiation beam 1182A. In some aspects, the on-axis detection subsystem can be configured to receive, via the optic 1150 along the on-axis diffracted radiation beam path 1186E, a second on-axis diffracted radiation beam indicative of first order diffraction that includes a second set of photons diffracted from the region 1190 in response to an illumination of the region 1190 by the off-axis radiation beam 1182B. In some aspects, the on-axis detection subsystem can be configured to receive, via the optic 1150 along the on-axis diffracted radiation beam path 1186E, a third on-axis diffracted radiation beam indicative of first order diffraction that includes a third set of photons diffracted from the region 1190 in response to an illumination of the region 1190 by the off-axis radiation beam 1184A. In some aspects, the on-axis detection subsystem can be configured to receive, via the optic 1150 along the on-axis diffracted radiation beam path 1186E, a fourth on-axis diffracted radiation beam indicative of first order diffraction that includes a fourth set of photons diffracted from the region 1190 in response to an illumination of the region 1190 by the off-axis radiation beam 1184B. In some aspects, the on-axis detection subsystem can be configured to receive, via the optic 1150 along the on-axis diffracted radiation beam path 1186E, a fifth on-axis diffracted radiation beam indicative of first order diffraction that includes a fifth set of photons diffracted from the region 1190 in response to an illumination of the region 1190 by the off-axis radiation beam 1187A. In some aspects, the on-axis detection subsystem can be configured to receive, via the optic 1150 along the on-axis diffracted radiation beam path 1186E, a sixth on-axis diffracted radiation beam indicative of first order diffraction that includes a sixth set of photons diffracted from the region 1190 in response to an illumination of the region 1190 by the off-axis radiation beam 1187B. In some aspects, the on-axis detection subsystem can be configured to receive, via the optic 1150 along the on-axis diffracted radiation beam path 1186E, a seventh on-axis diffracted radiation beam indicative of first order diffraction that includes a seventh set of photons diffracted from the region 1190 in response to an illumination of the region 1190 by the off-axis radiation beam 1188A. In some aspects, the on-axis detection subsystem can be configured to receive, via the optic 1150 along the on-axis diffracted radiation beam path 1186E, an eighth on-axis diffracted radiation beam indicative of first order diffraction that includes an eighth set of photons diffracted from the region 1190 in response to an illumination of the region 1190 by the off-axis radiation beam 1188B.

In some aspects, the on-axis detection subsystem can be configured to receive, via the optic 1150 along the on-axis diffracted radiation beam path 1186E, the first on-axis diffracted radiation beam, the second on-axis diffracted radiation beam, the third on-axis diffracted radiation beam, the fourth on-axis diffracted radiation beam, the fifth on-axis diffracted radiation beam, the sixth on-axis diffracted radiation beam, the seventh on-axis diffracted radiation beam, and the eight on-axis diffracted radiation beam at substantially the same time. In some aspects, the on-axis detection subsystem can be configured to receive, via the optic 1150 along the on-axis diffracted radiation beam path 1186E, the first on-axis diffracted radiation beam, the second on-axis diffracted radiation beam, the third on-axis diffracted radiation beam, the fourth on-axis diffracted radiation beam, the fifth on-axis diffracted radiation beam, the sixth on-axis diffracted radiation beam, the seventh on-axis diffracted radiation beam, and the eight on-axis diffracted radiation beam at substantially different times.

In some aspects, the emitter 1102B can be configured to receive a ninth on-axis diffracted radiation beam indicative of zero order diffraction that includes a ninth set of photons diffracted from the region 1190 at a ninth diffraction angle in response to the illumination of the region 1190 by the off-axis radiation beam 1182A. In some aspects, the emitter 1102A can be configured to receive a tenth on-axis diffracted radiation beam indicative of zero order diffraction that includes a tenth set of photons diffracted from the region 1190 at a tenth diffraction angle in response to the illumination of the region 1190 by the off-axis radiation beam 1182B. In some aspects, the emitter 1104B can be configured to receive a eleventh on-axis diffracted radiation beam indicative of zero order diffraction that includes a eleventh set of photons diffracted from the region 1190 at a eleventh diffraction angle in response to the illumination of the region 1190 by the off-axis radiation beam 1184A. In some aspects, the emitter 1104A can be configured to receive a twelfth on-axis diffracted radiation beam indicative of zero order diffraction that includes a twelfth set of photons diffracted from the region 1190 at a twelfth diffraction angle in response to the illumination of the region 1190 by the off-axis radiation beam 1184B. In some aspects, the emitter 1106B can be configured to receive a thirteenth on-axis diffracted radiation beam indicative of zero order diffraction that includes a thirteenth set of photons diffracted from the region 1190 at a thirteenth diffraction angle in response to the illumination of the region 1190 by the off-axis radiation beam 1187A. In some aspects, the emitter 1106A can be configured to receive a fourteenth on-axis diffracted radiation beam indicative of zero order diffraction that includes a fourteenth set of photons diffracted from the region 1190 at a fourteenth diffraction angle in response to the illumination of the region 1190 by the off-axis radiation beam 1187B. In some aspects, the emitter 1108B can be configured to receive a fifteenth on-axis diffracted radiation beam indicative of zero order diffraction that includes a fifteenth set of photons diffracted from the region 1190 at a fifteenth diffraction angle in response to the illumination of the region 1190 by the off-axis radiation beam 1188A. In some aspects, the emitter 1108A can be configured to receive a sixteenth on-axis diffracted radiation beam indicative of zero order diffraction that includes a sixteenth set of photons diffracted from the region 1190 at a sixteenth diffraction angle in response to the illumination of the region 1190 by the off-axis radiation beam 1188B.

In some aspects, each of the off-axis incident angles and diffraction angles describe with reference to FIG. 11F can be defined relative to the surface normal of the surface of the substrate 1192. In some aspects, the on-axis diffracted radiation beam path 1186E can be coincident with the surface normal (e.g., the angle between the on-axis diffracted radiation beam path 1186E and the surface normal can be about zero). In other aspects, the on-axis diffracted radiation beam path 1186E can be non-coincident with the surface normal (e.g., the angle between the on-axis diffracted radiation beam path 1186E and the surface normal can be non-zero).

In some aspects, the on-axis detection subsystem can be further configured to generate an electronic signal based on the first on-axis diffracted radiation beam; the second on-axis diffracted radiation beam; the third on-axis diffracted radiation beam; the fourth on-axis diffracted radiation beam; the fifth on-axis diffracted radiation beam; the sixth on-axis diffracted radiation beam; the seventh on-axis diffracted radiation beam; the eighth on-axis diffracted radiation beam; any other suitable off-axis radiation beam, set of photons, signals (including, but not limited to sub-signals indicative of phase differences between off-axis radiation beams), data, or electronic information; or any combination thereof or any combination thereof. In some aspects, the electronic signal can include: a first sub-signal indicative of a phase difference between the first on-axis diffracted radiation beam and the second on-axis diffracted radiation beam; a second sub-signal indicative of a phase difference between the third on-axis diffracted radiation beam and the fourth on-axis diffracted radiation beam; a third sub-signal indicative of a phase difference between the fifth on-axis diffracted radiation beam and the sixth on-axis diffracted radiation beam; a fourth sub-signal indicative of a phase difference between the seventh on-axis diffracted radiation beam and the eighth on-axis diffracted radiation beam; any other suitable signal, data, or electronic information; or any combination thereof.

In some aspects, the on-axis detection subsystem can be further configured to generate the electronic signal further based on the ninth on-axis diffracted radiation beam; the tenth on-axis diffracted radiation beam; the eleventh on-axis diffracted radiation beam; the twelfth on-axis diffracted radiation beam; the thirteenth on-axis diffracted radiation beam; the fourteenth on-axis diffracted radiation beam; the fifteenth on-axis diffracted radiation beam; the sixteenth on-axis diffracted radiation beam; any other suitable off-axis radiation beam, set of photons, signals (including, but not limited to sub-signals indicative of phase differences between off-axis radiation beams), data, or electronic information; or any combination thereof or any combination thereof. In some aspects, the electronic signal can further include: a fifth sub-signal indicative of a phase difference between the ninth on-axis diffracted radiation beam and the tenth on-axis diffracted radiation beam; a sixth sub-signal indicative of a phase difference between the eleventh on-axis diffracted radiation beam and the twelfth on-axis diffracted radiation beam; a seventh sub-signal indicative of a phase difference between the thirteenth on-axis diffracted radiation beam and the fourteenth on-axis diffracted radiation beam; a eighth sub-signal indicative of a phase difference between the fifteenth on-axis diffracted radiation beam and the sixteenth on-axis diffracted radiation beam; any other suitable signal, data, or electronic information; or any combination thereof.

In some aspects, the on-axis detection subsystem can be further configured to determine an alignment position of the alignment grating structure 1194 based on the electronic signal or any portion (e.g., sub-signal) or combination of portions thereof.

Figure 12:
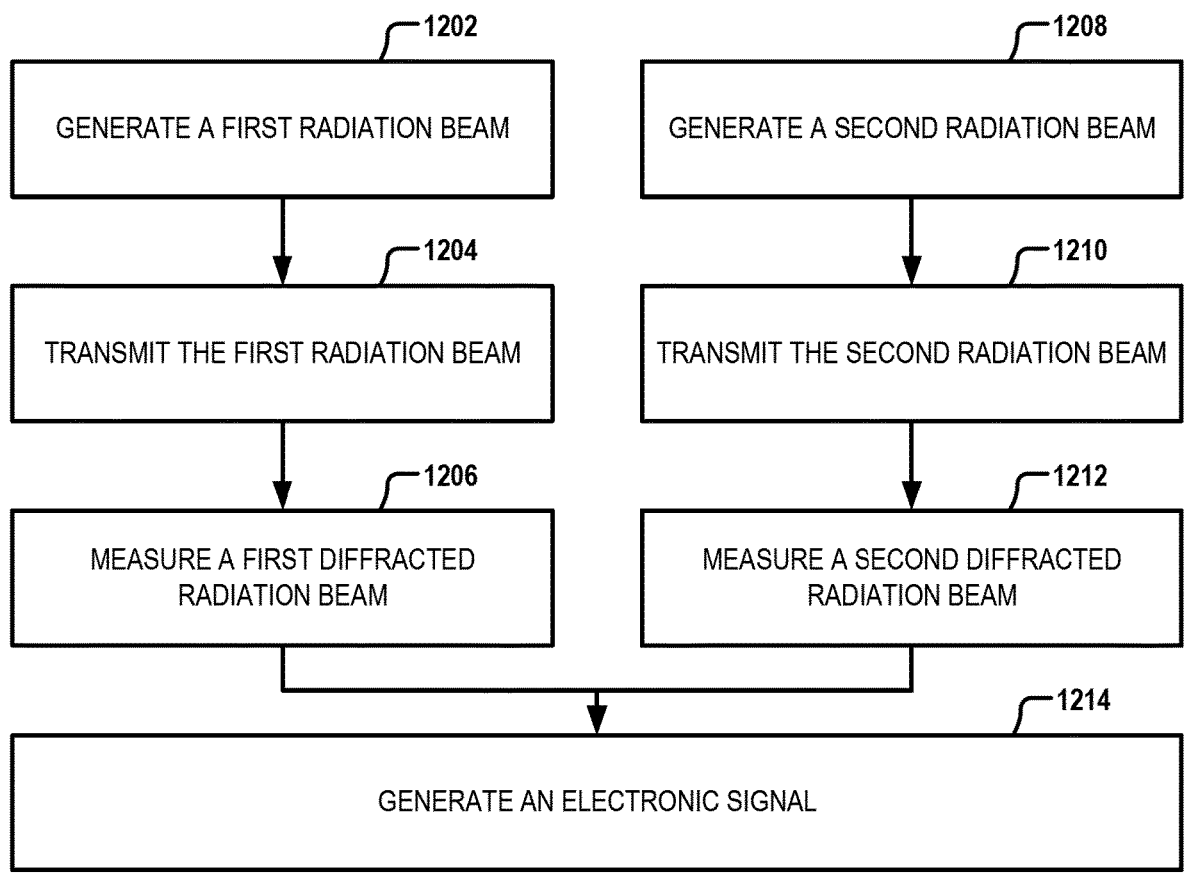
FIG. 12 is an example method for determining the alignment of a substrate utilizing off-axis illumination and on-axis detection according to some aspects of the present disclosure or portion(s) thereof.

Example Process for Aligning a Substrate using Off-Axis Illumination and On-Axis Detection FIG. 12 is an example method 1200 for determining the alignment of a substrate using off-axis illumination and on-axis detection according to some aspects of the present disclosure or portion(s) thereof. The operations described with reference to the example method 1200 can be performed by, or according to, any of the systems, apparatuses, components, structures, features, techniques, or combinations thereof described herein, such as those described with reference to FIGS. 1-11 above and FIG. 13 below.

At operation 1202, the method can include generating, by a first illumination system (e.g., by a first off-axis illumination subsystem), a first radiation beam at a first wavelength. In some aspects, the first radiation beam can include one of the off-axis radiation beams 1082A, 1082B, 1084A, 1084B, 1182A, 1182B, 1184A, 1184B, 1187A, 1187B, 1188A, and 1188B, or any other suitable radiation beam. In some aspects, the generation of the first radiation beam can be accomplished using suitable mechanical or other methods and include generating the first radiation beam in accordance with any aspect or combination of aspects described with reference to FIGS. 1-11 above and FIG. 13 below.

At operation 1204, the method can include transmitting, by the first illumination system, the first radiation beam toward a region (e.g., region 1090, 1190) of a surface of a substrate (e.g., substrate 1092, 1192) at a first incident angle. In some aspects, the first incident angle can include one of the off-axis incident angles 1072A, 1072B, 1074A, 1074B, 1172A, 1172B, 1174A, and 1174B, or any other suitable incident angle. In some aspects, the transmission of the first radiation beam can be accomplished using suitable mechanical or other methods and include transmitting the first radiation beam in accordance with any aspect or combination of aspects described with reference to FIGS. 1-11 above and FIG. 13 below.

At operation 1206, the method can include measuring, by a detection system (e.g., by an on-axis detection subsystem), a first diffracted radiation beam. In some aspects, the first diffracted radiation beam can include a first set of photons diffracted from the region of the surface of the substrate in response to a first illumination of the region by the first radiation beam. In some aspects, the first diffracted radiation beam can include one of: the on-axis diffracted radiation beams 1186A, 1186B, 1186C, and 1186D; the on-axis diffracted radiation beams propagated along the on-axis diffracted radiation beam path 1086 or 1186E; and the off-axis diffracted radiation beams 1183A, 1183B, 1185A, and 1185B; or any other suitable diffracted radiation beam (e.g., zeroth order, +/− first order, +/− second order, and so forth). In some aspects, the measurement of the first diffracted radiation beam can be accomplished using suitable mechanical or other methods and include measuring the first diffracted radiation beam in accordance with any aspect or combination of aspects described with reference to FIGS. 1-11 above and FIG. 13 below.

At operation 1208, the method can include generating, by a second illumination system (e.g., by a second off-axis illumination subsystem), a second radiation beam at a second wavelength. In some aspects, the second radiation beam can include another of the off-axis radiation beams 1082A, 1082B, 1084A, 1084B, 1182A, 1182B, 1184A, 1184B, 1187A, 1187B, 1188A, and 1188B, or any other suitable radiation beam. In some aspects, the first radiation beam can include the first off-axis radiation beam 1082A, and the second radiation beam can include the second off-axis radiation beam 1082B. In other aspects, the first radiation beam can include the first off-axis radiation beam 1082A, and the second radiation beam can include the third off-axis radiation beam 1084A. In still other aspects, the first radiation beam can include the third off-axis radiation beam 1084A, and the second radiation beam can include the fourth off-axis radiation beam 1084B. In still other aspects, the first radiation beam can include the second off-axis radiation beam 1082B, and the second radiation beam can include the fourth off-axis radiation beam 1084B. In some aspects, the generation of the second radiation beam can be accomplished using suitable mechanical or other methods and include generating the second radiation beam in accordance with any aspect or combination of aspects described with reference to FIGS. 1-11 above and FIG. 13 below.

At operation 1210, the method can include transmitting, by the second illumination system, the second radiation beam toward the region of the surface of the substrate at a second incident angle. In some aspects, the second incident angle can include another of the off-axis incident angles 1072A, 1072B, 1074A, 1074B, 1172A, 1172B, 1174A, 1174B; or any other suitable incident angle. In some aspects, the transmission of the second radiation beam can be accomplished using suitable mechanical or other methods and include transmitting the second radiation beam in accordance with any aspect or combination of aspects described with reference to FIGS. 1-11 above and FIG. 13 below.

At operation 1212, the method can include measuring, by the detection system, a second diffracted radiation beam. In some aspects, the second diffracted radiation beam can include a second set of photons diffracted from the region of the surface of the substrate in response to a second illumination of the region by the second coherent radiation beam. In some aspects, the second diffracted radiation beam can include another of: the on-axis diffracted radiation beams 1186A, 1186B, 1186C, and 1186D; the on-axis diffracted radiation beams propagated along the on-axis diffracted radiation beam path 1086 or 1186E; and the off-axis diffracted radiation beams 1183A, 1183B, 1185A, and 1185B; or any other suitable diffracted radiation beam. In some aspects, the measurement of the second diffracted radiation beam can be accomplished using suitable mechanical or other methods and include measuring the second diffracted radiation beam in accordance with any aspect or combination of aspects described with reference to FIGS. 1-11 above and FIG. 13 below.

At operation 1214, the method can include generating, by the detection system, an electronic signal based on the measured first set of photons and the measured second set of photons. In some aspects, the electronic signal can be indicative of a phase difference between the first set of photons and the second set of photons. In some aspects, the electronic signal can be indicative of an alignment of the surface of the substrate. In some aspects, the generation of the electronic signal can be accomplished using suitable mechanical or other methods and include generating the electronic signal in accordance with any aspect or combination of aspects described with reference to FIGS. 1-11 above and FIG. 13 below.

Example Computing System

Aspects of the disclosure can be implemented in hardware, firmware, software, or any combination thereof. Aspects of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical, or other forms of propagated signals (e.g., carrier waves, infrared signals, digital signals, etc.), and others. Further, firmware, software, routines, instructions, and combinations thereof can be described herein as performing certain actions. However, it should be appreciated that such descriptions are merely for convenience and that such actions in fact result from computing devices, processors, controllers, or other devices executing the firmware, software, routines, instructions, or combinations thereof and, in doing so, causing actuators or other devices (e.g., servo motors, robotic devices) to interact with the physical world.

Figure 13:
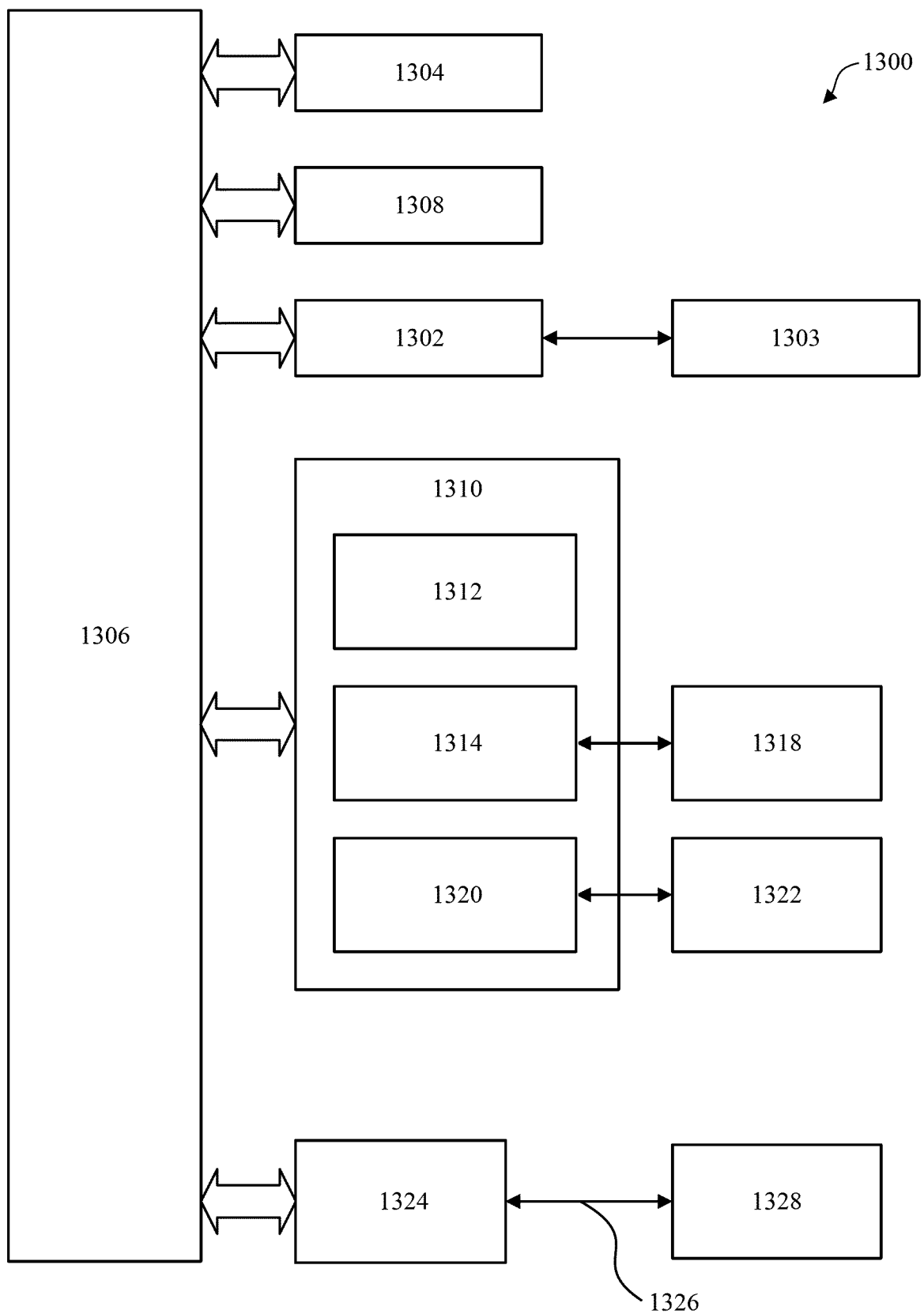
FIG. 13 is an example computer system for implementing some aspects of the present disclosure or portion(s) thereof.

Various aspects can be implemented, for example, using one or more computing systems, such as example computing system 1300 shown in FIG. 13. Example computing system 1300 can be a specialized computer capable of performing the functions described herein such as: the example substrate alignment sensing system 400 described with reference to FIG. 4; the example substrate alignment sensing systems 500 and 500' described with reference to FIGS. 5A and 5B; the example substrate alignment sensing system 600 described with reference to FIG. 6A; the example multimode dispersion waveguide structure 640 described with reference to FIGS. 6A, 6B, 6C, and 6D; the example substrate alignment sensing system 700 described with reference to FIG. 7; the example substrate alignment sensing system 800 described with reference to FIG. 8; the example substrate alignment sensing system 1000 described with reference to FIG. 10; the example substrate alignment sensing system 1100 described with reference to FIGS. 11A, 11B, 11C, 11D, 11E, and 11F; any other suitable system, subsystem, or component; any portion thereof; or any combination thereof. Example computing system 1300 can include one or more processors (also called central processing units, or CPUs), such as a processor 1304. Processor 1304 is connected to a communication infrastructure 1306 (e.g., a bus). Example computing system 1300 can also include user input/output device(s) 1303, such as monitors, keyboards, pointing devices, etc., that communicate with communication infrastructure 1306 through user input/output interface(s) 1302. Example computing system 1300 can also include a main memory 1308 (e.g., one or more primary storage devices), such as random access memory (RAM). Main memory 1308 can include one or more levels of cache. Main memory 1308 has stored therein control logic (e.g., computer software) and/or data.

Example computing system 1300 can also include a secondary memory 1310 (e.g., one or more secondary storage devices). Secondary memory 1310 can include, for example, a hard disk drive 1312 and/or a removable storage drive 1314. Removable storage drive 1314 can be a floppy disk drive, a magnetic tape drive, a compact disk drive, an optical storage device, tape backup device, and/or any other storage device/drive.

Removable storage drive 1314 can interact with a removable storage unit 1318. Removable storage unit 1318 includes a computer usable or readable storage device having stored thereon computer software (control logic) and/or data. Removable storage unit 1318 can be a floppy disk, magnetic tape, compact disk, DVD, optical storage disk, and/or any other computer data storage device. Removable storage drive 1314 reads from and/or writes to removable storage unit 1318.

According to some aspects, secondary memory 1310 can include other means, instrumentalities or other approaches for allowing computer programs and/or other instructions and/or data to be accessed by example computing system 1300. Such means, instrumentalities or other approaches can include, for example, a removable storage unit 1322 and an interface 1320. Examples of the removable storage unit 1322 and the interface 1320 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Example computing system 1300 can further include a communications interface 1324 (e.g., one or more network interfaces). Communications interface 1324 enables example computing system 1300 to communicate and interact with any combination of remote devices, remote networks, remote entities, etc. (individually and collectively referred to as remote devices 1328). For example, communications interface 1324 can allow example computing system 1300 to communicate with remote devices 1328 over communications path 1326, which can be wired and/or wireless, and which can include any combination of LANs, WANs, the Internet, etc. Control logic, data, or both can be transmitted to and from example computing system 1300 via communications path 1326.

The operations in the preceding aspects of the present disclosure can be implemented in a wide variety of configurations and architectures. Therefore, some or all of the operations in the preceding aspects can be performed in hardware, in software or both. In some aspects, a tangible, non-transitory apparatus or article of manufacture includes a tangible, non-transitory computer useable or readable medium having control logic (software) stored thereon is also referred to herein as a computer program product or program storage device. This includes, but is not limited to, example computing system 1300, main memory 1308, secondary memory 1310 and removable storage units 1318 and 1322, as well as tangible articles of manufacture embodying any combination of the foregoing. Such control logic, when executed by one or more data processing devices (such as example computing system 1300), causes such data processing devices to operate as described herein.

Based on the teachings contained in this disclosure, it will be apparent to persons skilled in the relevant art(s) how to make and use aspects of the disclosure using data processing devices, computer systems and/or computer architectures other than that shown in FIG. 13. In particular, aspects of the Disclosure can operate with software, hardware, and/or operating system implementations other than those described herein.

The embodiments may further be described using the following clauses:

1. A system, comprising:
    an illumination system configured to:
        generate a multi-wavelength radiation beam comprising a first wavelength and a second wavelength; and
        transmit the multi-wavelength radiation beam toward a region of a surface of a substrate;
    a detection system configured to:
        receive a first set of photons at the first wavelength and diffracted from the region of the surface of the substrate in response to an illumination of the region by the multi-wavelength radiation beam;
        receive a second set of photons at the second wavelength and diffracted from the region of the surface of the substrate in response to the illumination of the region by the multi-wavelength radiation beam; and
        generate an electronic signal based on the first set of photons and the second set of photons.
2. The system of clause 1, wherein the second wavelength is different from the first wavelength.
3. The system of clause 1, wherein an area of the region of the surface of the substrate is about 1.0 square millimeter.
4. The system of clause 1, wherein the region of the surface of the substrate comprises a portion of an alignment grating structure.
5. The system of clause 1, wherein:
    the first set of photons is indicative of first order diffraction in response to the illumination of the region by the multi-wavelength radiation beam; and
    the second set of photons is indicative of first order diffraction in response to the illumination of the region by the multi-wavelength radiation beam.
6. The system of clause 1, wherein the electronic signal is indicative of a phase difference between the first set of photons and the second set of photons.
7. The system of clause 1, wherein the detection system is further configured to determine an alignment position of the substrate based on the electronic signal.
8. The system of clause 1, wherein:
    the detection system comprises an optic;
    the optic is configured to:
        collect a first diffracted radiation beam from the region of the surface of the substrate at a first diffraction angle;
        collect a second diffracted radiation beam from the region of the surface of the substrate at a second diffraction angle;
    the first diffracted radiation beam comprises the first set of photons;
    the second diffracted radiation beam comprises the second set of photons.
9. The system of clause 8, wherein:
    the first diffracted radiation beam is indicative of first order diffraction in response to the illumination of the region by the multi-wavelength radiation beam; and
    the second diffracted radiation beam is indicative of first order diffraction in response to the illumination of the region by the multi-wavelength radiation beam.
10. The system of clause 9, wherein the optic comprises a microlens structure.
11. The system of clause 1, wherein:
    the detection system comprises:
        a multimode dispersion waveguide structure;
        a first detector; and
        a second detector;
    the multimode dispersion waveguide structure comprises:
        a first input channel structure;
        a second input channel structure;
        a first output channel structure; and
        a second output channel structure; and
    the multimode dispersion waveguide structure is configured to:
        receive the first set of photons from the first input channel structure;
        receive the second set of photons from the second input channel structure;
        generate a first optical signal indicative of a difference between the first set of photons and the second set of photons;
        generate a second optical signal indicative of a summation of the first set of photons and the second set of photons;
        transmit the first optical signal to the first detector via the first output channel structure; and
        transmit the second optical signal to the second detector via the second output channel structure.
12. The system of clause 11, wherein:
    the first detector is configured to:
        receive the first optical signal; and
        generate difference measurement data based on a first set of measurements of the first optical signal; and
    the second detector is configured to:
        receive the second optical signal; and
        generate summation measurement data based on a second set of measurements of the second optical signal.
13. The system of clause 12, wherein:
    the detection system is configured to:
        generate the electronic signal based on the difference measurement data and the summation measurement data.

14. The system of clause 1, wherein:
the system comprises an optical coupler;
the optical coupler is configured to:
receive the first set of photons;
receive the second set of photons;
transmit the first set of photons to the detection system; and
transmit the second set of photons to the detection system.
15. An integrated optical device, comprising:
a radiation source configured to:
emit a multi-wavelength radiation beam toward a region of a surface of a substrate, wherein the multi-wavelength radiation beam comprises a first wavelength and a second wavelength; and
a metrology system configured to:
measure a first diffracted radiation beam indicative of first order diffraction at the first wavelength in response to an irradiation of the region by the multi-wavelength radiation beam;
measure a second diffracted radiation beam indicative of first order diffraction at the second wavelength in response to the irradiation of the region by the multi-wavelength radiation beam; and
generate an electronic signal based on the measured first diffracted radiation beam and the measured second diffracted radiation beam.
16. The integrated optical device of clause 15, wherein the electronic signal is indicative of a phase difference between the measured first diffracted radiation beam and the measured second diffracted radiation beam.
17. The integrated optical device of clause 15, wherein the metrology system is further configured to determine an alignment position of the substrate based on the generated electronic signal.
18. A method, comprising:
generating, by a radiation source, a multi-wavelength radiation beam having a first wavelength and a second wavelength;
transmitting, by the radiation source, the multi-wavelength radiation beam toward a region of a surface of a substrate;
measuring, by a metrology system, a first diffracted radiation beam indicative of first order diffraction at the first wavelength in response to an irradiation of the region by the multi-wavelength radiation beam;
measuring, by the metrology system, a second diffracted radiation beam indicative of first order diffraction at the second wavelength in response to the irradiation of the region by the multi-wavelength radiation beam; and
generating, by the metrology system, an electronic signal based on the measured first set of photons and the measured second set of photons.
19. The method of clause 18, wherein the electronic signal is indicative of a phase difference between the first diffracted radiation beam and the second diffracted radiation beam.
20. The method of clause 18, further comprising determining, by the metrology system, an alignment position of the substrate based on the electronic signal.

Although specific reference may be made in this text to the use of lithographic apparatus in the manufacture of ICs, it should be understood that the lithographic apparatuses described herein can have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself can be patterned and materials added on top of it can also be patterned, or can remain without patterning.

The examples disclosed herein are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific aspects of the disclosure have been described above, it will be appreciated that the aspects can be practiced otherwise than as described. The description is not intended to limit the embodiments of the disclosure.

It is to be appreciated that the Detailed Description section, and not the Background, Summary, and Abstract sections, is intended to be used to interpret the claims. The Summary and Abstract sections may set forth one or more but not all example embodiments as contemplated by the inventor(s), and thus, are not intended to limit the present embodiments and the appended claims in any way.

Some aspects of the disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects of the disclosure will so fully reveal the general nature of the aspects that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein.

The breadth and scope of the present disclosure should not be limited by any of the above-described example aspects or embodiments, but should be defined only in accordance with the following claims and their equivalents.

The invention claimed is:
1. A system, comprising:
an illumination system configured to:
generate a multi-wavelength radiation beam comprising a first wavelength and a second wavelength; and transmit the multi-wavelength radiation beam toward a region of a surface of a substrate;
a detection system comprising a multimode dispersion waveguide structure and first and second detectors,
wherein the multimode dispersion waveguide structure is configured to:
receive and propagate a first set of photons at the first wavelength and diffracted from the region of the surface of the substrate in response to an illumination of the region by the multi-wavelength radiation beam;
receive and propagate a second set of photons at the second wavelength and diffracted from the region of the surface of the substrate in response to the illumination of the region by the multi-wavelength radiation beam; and
wherein at least one of the first and second detectors is configured to generate an electronic signal based on the received first and second set of photons.

2. The system of claim 1, wherein the second wavelength is different from the first wavelength.

3. The system of claim 1, wherein an area of the region of the surface of the substrate is about 1.0 square millimeter.

4. The system of claim 1, wherein the region of the surface of the substrate comprises a portion of an alignment grating structure.

5. The system of claim 1, wherein:
the first set of photons is indicative of first order diffraction in response to the illumination of the region by the multi-wavelength radiation beam; and
the second set of photons is indicative of first order diffraction in response to the illumination of the region by the multi-wavelength radiation beam.

6. The system of claim 1, wherein the electronic signal is indicative of a phase difference between the first set of photons and the second set of photons.

7. The system of claim 1, wherein the detection system is further configured to determine an alignment position of the substrate based on the electronic signal.

8. The system of claim 1, wherein:
the detection system further comprises an optic;
the optic is configured to:
collect a first diffracted radiation beam from the region of the surface of the substrate at a first diffraction angle;
collect a second diffracted radiation beam from the region of the surface of the substrate at a second diffraction angle;
the first diffracted radiation beam comprises the first set of photons; and
the second diffracted radiation beam comprises the second set of photons.

9. The system of claim 8, wherein:
the first diffracted radiation beam is indicative of first order diffraction in response to the illumination of the region by the multi-wavelength radiation beam; and
the second diffracted radiation beam is indicative of first order diffraction in response to the illumination of the region by the multi-wavelength radiation beam.

10. The system of claim 9, wherein the optic comprises a microlens structure.

11. The system of claim 1, wherein:
the multimode dispersion waveguide structure comprises:
a first input channel structure;
a second input channel structure;
a first output channel structure; and
a second output channel structure; and
the multimode dispersion waveguide structure is configured to:
receive the first set of photons from the first input channel structure;
receive the second set of photons from the second input channel structure;
generate a first optical signal indicative of a difference between the first set of photons and the second set of photons;
generate a second optical signal indicative of a summation of the first set of photons and the second set of photons;
transmit the first optical signal to the first detector via the first output channel structure; and
transmit the second optical signal to the second detector via the second output channel structure.

12. The system of claim 11, wherein:
the first detector is configured to:
receive the first optical signal; and
generate difference measurement data based on a first set of measurements of the first optical signal; and
the second detector is configured to:
receive the second optical signal; and
generate summation measurement data based on a second set of measurements of the second optical signal.

13. The system of claim 12, wherein:
the detection system is configured to:
generate the electronic signal based on the difference measurement data and the summation measurement data.

14. The system of claim 1, wherein:
the system comprises an optical coupler;
the optical coupler is configured to:
receive the first set of photons;
receive the second set of photons;
transmit the first set of photons to the detection system; and
transmit the second set of photons to the detection system.

15. An integrated optical device, comprising:
a radiation source configured to:
emit a multi-wavelength radiation beam toward a region of a surface of a substrate, wherein the multi-wavelength radiation beam comprises a first wavelength and a second wavelength; and
a metrology system comprising a multimode dispersion waveguide structure and a detector,
wherein the multimode dispersion waveguide structure is configured to:
receive and propagate a first diffracted radiation beam indicative of first order diffraction at the first wavelength in response to an irradiation of the region by the multi-wavelength radiation beam; and
receive and propagate a second diffracted radiation beam indicative of first order diffraction at the second wavelength in response to the irradiation of the region by the multi-wavelength radiation beam;
wherein the metrology system is configured to measure the first and second diffracted radiation beams, and
wherein the detector is configured to generate an electronic signal based on the measured first diffracted radiation beam and the measured second diffracted radiation beam.

16. The integrated optical device of claim 15, wherein the electronic signal is indicative of a phase difference between the measured first diffracted radiation beam and the measured second diffracted radiation beam.

17. The integrated optical device of claim 15, wherein the metrology system is further configured to determine an alignment position of the substrate based on the generated electronic signal.

18. A method, comprising:
generating, by a radiation source, a multi-wavelength radiation beam having a first wavelength and a second wavelength;
transmitting, by the radiation source, the multi-wavelength radiation beam toward a region of a surface of a substrate;
receiving, by a multimode dispersion waveguide structure in a metrology system, a first diffracted radiation beam indicative of first order diffraction at the first wavelength in response to an irradiation of the region by the multi-wavelength radiation beam;
receiving, by the multimode dispersion waveguide structure in the metrology system, a second diffracted radiation beam indicative of first order diffraction at the second wavelength in response to the irradiation of the region by the multi-wavelength radiation beam;
measuring, by the metrology system, the first diffracted radiation beam;
measuring, by the metrology system, the second diffracted radiation beam; and
generating, by a detector in the metrology system, an electronic signal based on the measured first and second diffracted radiation beams.

19. The method of claim 18, wherein the electronic signal is indicative of a phase difference between the first diffracted radiation beam and the second diffracted radiation beam.

20. The method of claim 18, further comprising determining, by the metrology system, an alignment position of the substrate based on the electronic signal.

* * * * *

UNITED STATES PATENT AND TRADEMARK OFFICE
CERTIFICATE OF CORRECTION

PATENT NO. : 12,216,414 B2
APPLICATION NO. : 18/012799
DATED : February 4, 2025
INVENTOR(S) : Swillam et al.

Page 1 of 1

It is certified that error appears in the above-identified patent and that said Letters Patent is hereby corrected as shown below:

In the Specification

In Column 6, Line 50, delete "111B," and replace with --11B,--.

In Column 7, Line 47, delete "(e.g., 10%, 20%," and replace with --(e.g., ±10%, ±20%,--.

In Column 19, Line 23, delete "111B," and replace with --11B,--.

In Column 35, Line 39, delete "greed" and replace with --green--.

In Column 44, Line 9, delete "FIG." and replace with --FIGS.--;

In Column 44, Line 12, delete "FIG." and replace with --FIGS.--.

In Column 57, Line 28, delete "Disclosure" and replace with --disclosure--.

Signed and Sealed this
Eighteenth Day of March, 2025

Coke Morgan Stewart
*Acting Director of the United States Patent and Trademark Office*